(12) United States Patent
Rathsack

(10) Patent No.: US 8,108,805 B2
(45) Date of Patent: Jan. 31, 2012

(54) SIMPLIFIED MICRO-BRIDGING AND ROUGHNESS ANALYSIS

(75) Inventor: Benjamen M Rathsack, Austin, TX (US)

(73) Assignee: Tokyo Electron Limited (JP)

( * ) Notice: Subject to any disclaimer, the term of this patent is extended or adjusted under 35 U.S.C. 154(b) by 41 days.

(21) Appl. No.: 12/732,333

(22) Filed: Mar. 26, 2010

(65) Prior Publication Data

US 2011/0239167 A1    Sep. 29, 2011

(51) Int. Cl.
| G06F 17/50 | (2006.01) |
| G06F 19/00 | (2006.01) |
| G06F 17/18 | (2006.01) |
| G01R 27/28 | (2006.01) |
| G01R 31/00 | (2006.01) |

(52) U.S. Cl. ............ 716/52; 716/54; 716/56; 716/112; 700/110; 700/121; 703/2; 703/14; 702/179; 702/117

(58) Field of Classification Search ............ 716/52, 716/54, 56, 112; 700/110, 121; 703/2, 14; 702/179, 117

See application file for complete search history.

(56) References Cited

U.S. PATENT DOCUMENTS

| 5,075,253 | A * | 12/1991 | Sliwa, Jr. ............ 438/109 |
| 6,091,845 | A | 7/2000 | Pierrat et al. |
| 6,171,737 | B1 | 1/2001 | Phan et al. |
| 6,242,270 | B1 | 6/2001 | Nagaswami et al. |
| 6,272,236 | B1 | 8/2001 | Pierrat et al. |
| 6,339,955 | B1 | 1/2002 | Phan et al. |
| 6,466,895 | B1 | 10/2002 | Harvey et al. |
| 6,555,828 | B1 | 4/2003 | Bokor et al. |
| 6,621,571 | B1 | 9/2003 | Maeda et al. |
| 6,727,512 | B2 | 4/2004 | Stokowski et al. |
| 6,774,365 | B2 | 8/2004 | Okoroanyanwu et al. |
| 6,823,496 | B2 | 11/2004 | Bergman Reuter et al. |
| 6,841,342 | B2 | 1/2005 | Nishi et al. |
| 6,919,957 | B2 | 7/2005 | Nikoonahad et al. |
| 6,976,240 | B2 | 12/2005 | Chang |
| 7,012,031 | B2 | 3/2006 | Choi et al. |
| 7,012,301 | B2 | 3/2006 | Tabuchi et al. |
| 7,065,239 | B2 | 6/2006 | Maayah et al. |
| 7,075,639 | B2 | 7/2006 | Adel et al. |
| 7,095,507 | B1 | 8/2006 | Hwang et al. |
| 7,106,425 | B1 | 9/2006 | Bultman et al. |
| 7,116,411 | B2 | 10/2006 | Park et al. |
| 7,118,997 | B2 | 10/2006 | Furukawa et al. |
| 7,139,083 | B2 | 11/2006 | Fielden et al. |
| 7,175,940 | B2 | 2/2007 | Laidig et al. |
| 7,180,576 | B2 | 2/2007 | Hansen |
| 7,180,585 | B2 | 2/2007 | Kreh et al. |
| 7,215,808 | B2 | 5/2007 | Miller |
| 7,216,060 | B1 | 5/2007 | Yano et al. |

(Continued)

OTHER PUBLICATIONS

Benjamen Rathsack et al., "Resist fundamentals for resolution, LER and sensitivity (RLS) performance tradeoffs and their relation to micro-bridging defects", Advances in Resist Materials and Processing Technology XXVI. Edited by Henderson, Clifford L.. Proceedings of the SPIE, vol. 7273 (2009)., pp. 727347-727347-11 (2009).

(Continued)

Primary Examiner — Phallaka Kik

(57) ABSTRACT

The invention provides apparatus and methods for processing substrates using pooled statistically based variance data. The statistically based variance data can include Pooled Polymer De-protection Variance (PPDV) data that can be used to determine micro-bridging defect data, LER defect data, and LWR defect data.

20 Claims, 15 Drawing Sheets

U.S. PATENT DOCUMENTS

| | | |
|---|---|---|
| 7,295,739 B2 | 11/2007 | Solarz |
| 7,318,997 B2 | 1/2008 | Kim et al. |
| 7,368,208 B1 | 5/2008 | Adel et al. |
| 7,369,236 B1 | 5/2008 | Sali et al. |
| 7,440,082 B2 | 10/2008 | Shi et al. |
| 7,478,014 B2 | 1/2009 | Dixon et al. |
| 7,518,383 B2 | 4/2009 | Gunji et al. |
| 7,541,137 B2 | 6/2009 | Beach |
| 7,557,023 B2 | 7/2009 | Furukawa et al. |
| 7,570,796 B2 | 8/2009 | Zafar et al. |
| 7,570,797 B1 | 8/2009 | Wang et al. |
| 7,831,863 B2 * | 11/2010 | Kusko et al. ............ 714/33 |
| 2004/0032581 A1 | 2/2004 | Nikoonahad et al. |
| 2004/0212796 A1 | 10/2004 | Adel et al. |
| 2004/0263834 A1 | 12/2004 | Alumot et al. |
| 2005/0018164 A1 | 1/2005 | Hansen |
| 2006/0044542 A1 | 3/2006 | Park et al. |
| 2006/0091334 A1 | 5/2006 | Urbach et al. |
| 2006/0105476 A1 | 5/2006 | Choi et al. |
| 2006/0139606 A1 | 6/2006 | De Kruif et al. |
| 2006/0139607 A1 | 6/2006 | Bruls et al. |
| 2006/0139610 A1 | 6/2006 | Bruls et al. |
| 2006/0146310 A1 | 7/2006 | De Kruif et al. |
| 2006/0170899 A1 | 8/2006 | De Kruif et al. |
| 2006/0177774 A1 | 8/2006 | Abdallah et al. |
| 2006/0192935 A1 | 8/2006 | Hansen et al. |
| 2006/0273266 A1 | 12/2006 | Preil et al. |
| 2007/0002311 A1 | 1/2007 | Park et al. |
| 2007/0019185 A1 | 1/2007 | Hamamatsu et al. |
| 2007/0032896 A1 | 2/2007 | Ye et al. |
| 2007/0035712 A1 | 2/2007 | Gassner et al. |
| 2007/0044049 A1 * | 2/2007 | Adams et al. ............ 716/4 |
| 2007/0121090 A1 | 5/2007 | Chen et al. |
| 2007/0156379 A1 | 7/2007 | Kulkarni et al. |
| 2007/0198964 A1 | 8/2007 | Al-Imam et al. |
| 2007/0230770 A1 | 10/2007 | Kulkarni et al. |
| 2007/0266362 A1 | 11/2007 | Lai et al. |
| 2008/0082283 A1 | 4/2008 | Dixon et al. |
| 2008/0138917 A1 | 6/2008 | Verhaverbeke et al. |
| 2008/0158529 A1 | 7/2008 | Hansen |
| 2008/0163140 A1 | 7/2008 | Fouquet et al. |
| 2008/0183446 A1 | 7/2008 | Hansen |
| 2008/0186468 A1 | 8/2008 | Hansen et al. |
| 2008/0218745 A1 | 9/2008 | Dixon et al. |
| 2008/0286697 A1 | 11/2008 | Verhaverbeke et al. |
| 2008/0317329 A1 | 12/2008 | Shibuya et al. |
| 2009/0096505 A1 | 4/2009 | Wolters et al. |
| 2009/0123059 A1 | 5/2009 | Gunji et al. |
| 2009/0148033 A1 | 6/2009 | Alumot et al. |
| 2009/0220895 A1 | 9/2009 | Gerza et al. |
| 2011/0154272 A1 * | 6/2011 | Hsu et al. ............ 716/50 |

OTHER PUBLICATIONS

Title: The Lithography Expert: Line-edge roughness, Part 2; Author: Chris Mack Austin Texas; Microlithography-World, vol. 16, Issue 2 (http://www.electroiq.com/index/display/semiconductors-article-display/292194/articles/microlithography-world/volume-16/issue-2/featured/the-lithography-expert-line-edge-roughness-part-2.html).

* cited by examiner

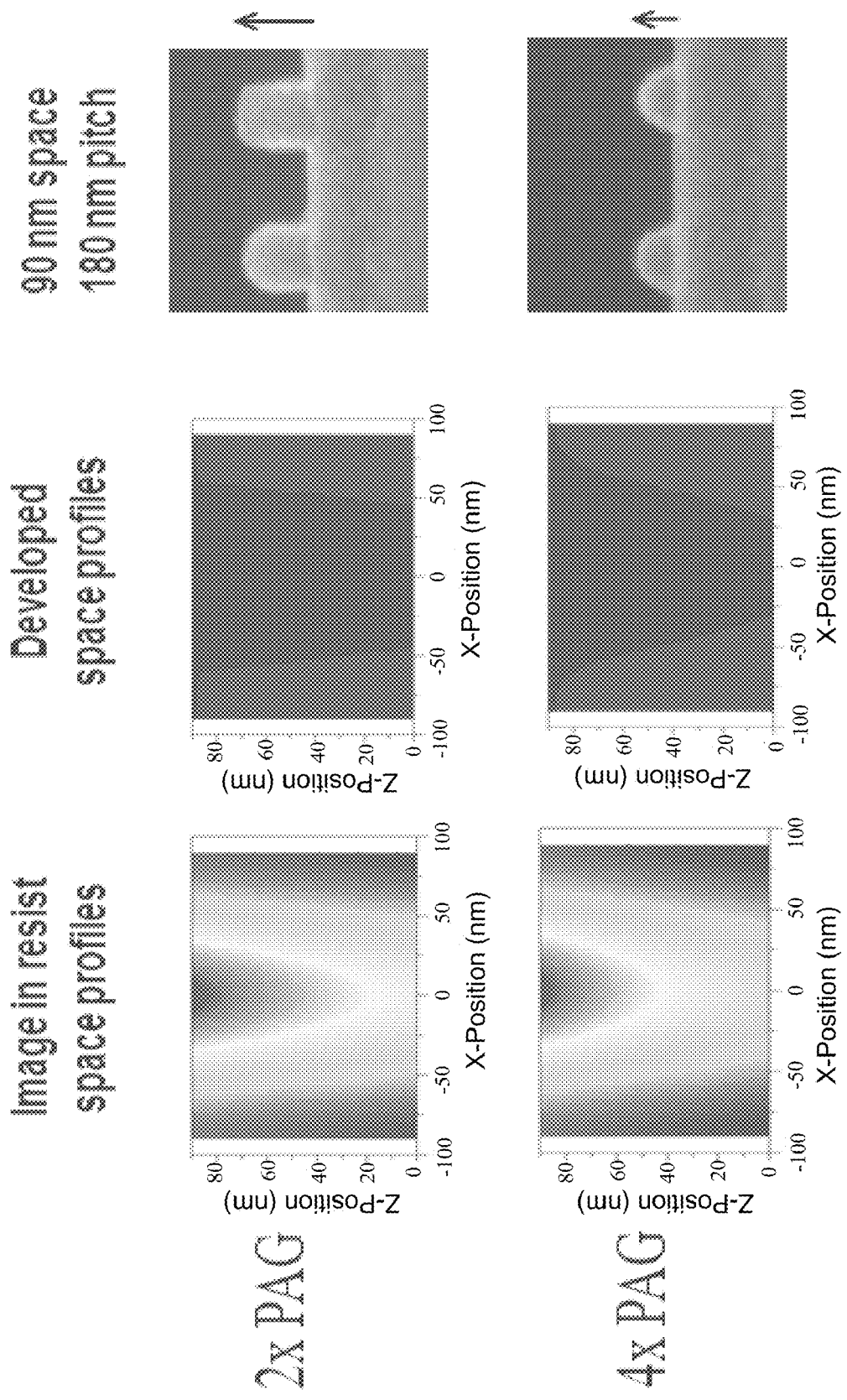

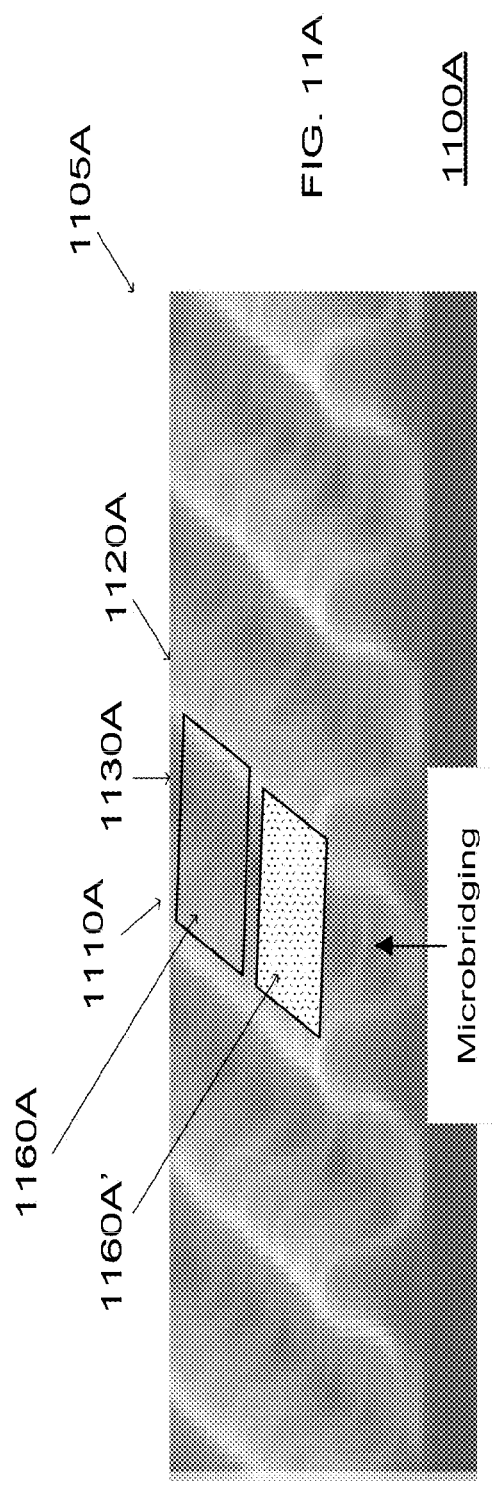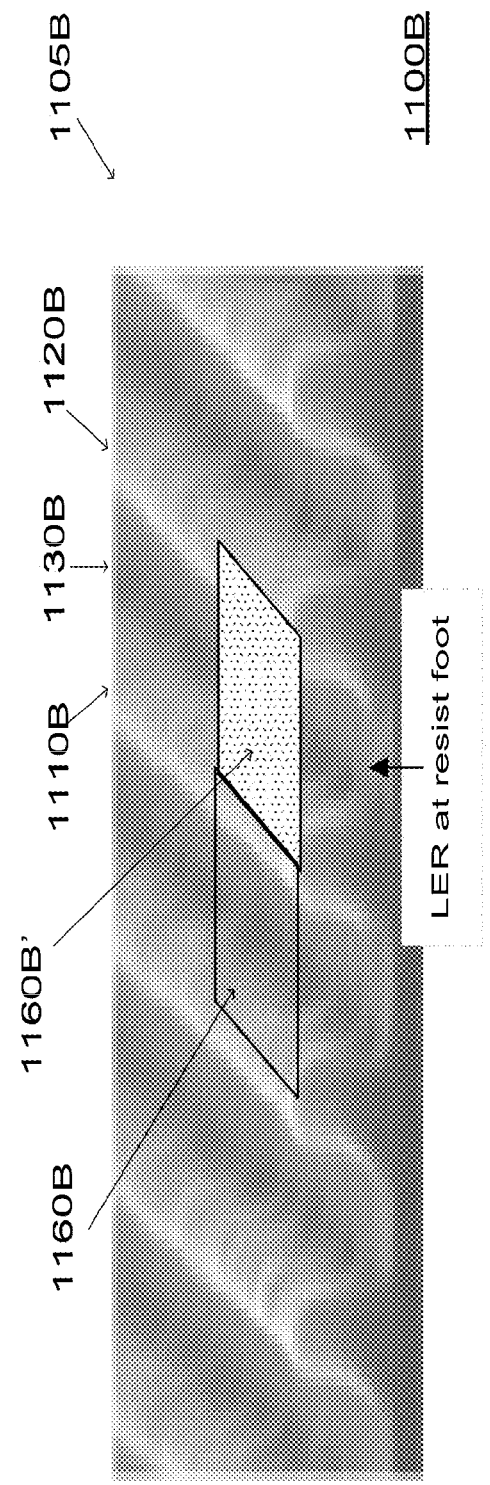

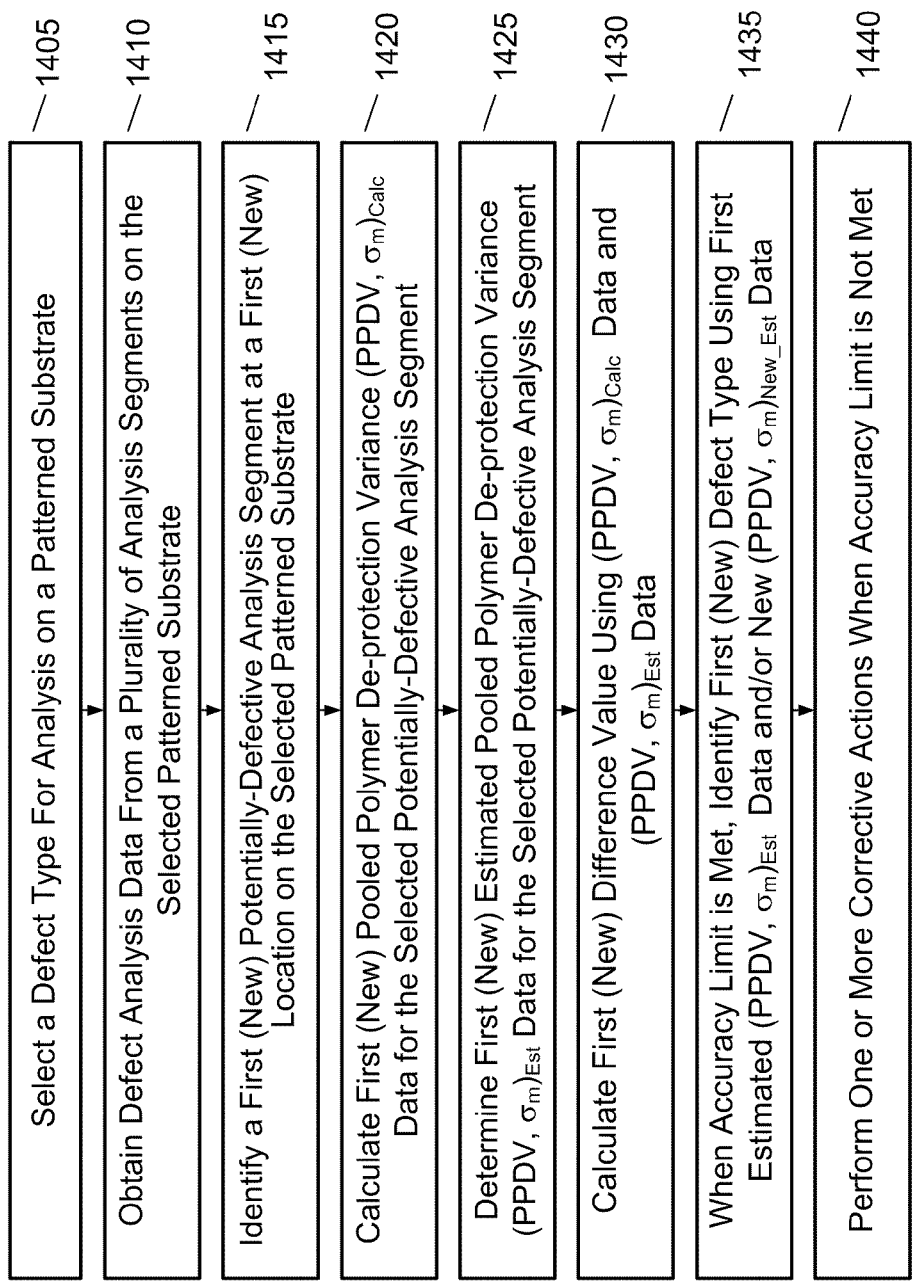

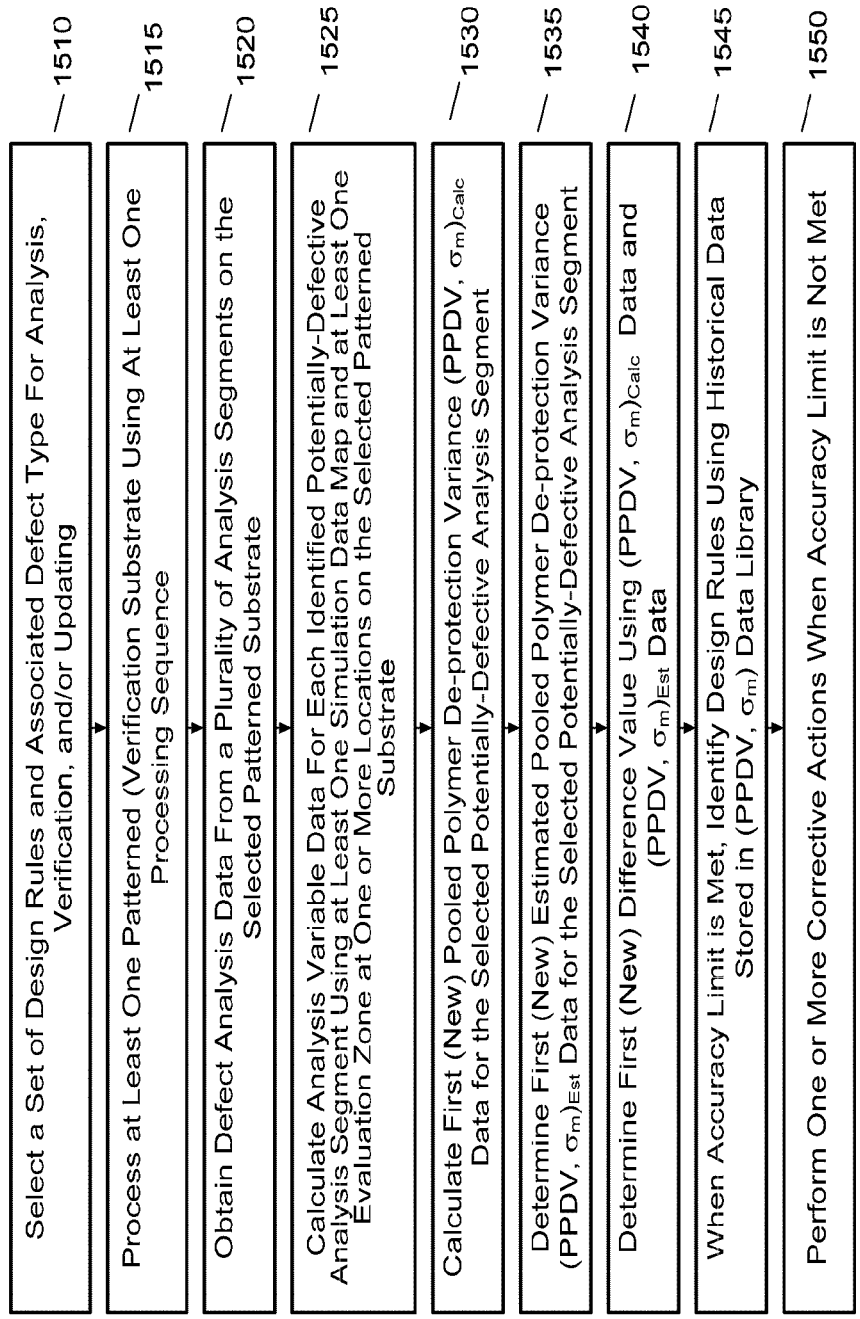

SIMPLIFIED MICRO-BRIDGING AND ROUGHNESS ANALYSIS

CROSS-REFERENCE TO RELATED APPLICATIONS

This application is related to co-pending U.S. patent application Ser. No. 11/947,234, entitled "Enhanced Process Yield Using a Hot-Spot Library", filed on Nov. 29, 2007. The content of this application is herein incorporated by reference in its entirety.

BACKGROUND OF THE INVENTION

1. Field of the Invention

The present invention relates to substrate processing, and more particularly to improving the process yield using statistically dependent defect procedures and data.

2. Description of the Related Art

Currently used lithography processes are challenged to balance the Resolution, LWR and Sensitivity (RLS) performance tradeoffs while scaling resist thickness below 100 nm. Some resist material suppliers have solved the resolution problem and the dose problem, but have not been able to solve the line width roughness (LWR) requirement. This challenges the industry to have a deeper understanding of LWR as well as the RLS performance tradeoffs, so that, new hardware and processes can be designed to meet manufacturing requirements.

Many multiple patterning techniques are currently being used during semiconductor substrate processing to increase the number of features and/or structures within devices on a substrate. Multiple patterning techniques can include double exposure techniques, double patterning techniques, spacer techniques, mask techniques, and brute force techniques. In 2006, the International Technology Roadmap for Semiconductors roadmap was expanded to include double patterning a potential solution for 32 nm lithography. Multiple patterning techniques are viewed as some device manufacturers as bridge solutions that can be used until Extreme Ultra-Violet (EUV) techniques become more fully developed.

Integrated Circuit (IC) design shrinks push the limits of lithography resolution. Chemical processes become more sensitive to defects or patterning errors when pushed to the lithography limits. IC manufacturers have historically used lithography simulations and CD SEM measurements to determine the focus and dose latitude as a means to determine design rules. Optical proximity correction for mask sizing is typically driving by CD SEM measurements for absolute dimensional targeting. In addition, yield enhancement is currently being performed using defect inspection tools that are typically separated from the lithography simulation based techniques that are used for mask at each IC layer.

Furthermore, resist pattern hot spots show up as bridging or line edge roughness defects that can either short a functional part of the device, hurt the process speed/leakage, or hurt the long-term reliability of a chip. Bridging and line edge roughness "hotspots" are typically difficult to simulate due to the large number of process variations like focus, dose, temperature bake uniformity, development uniformity, etc. Accurate simulations typically require complex Monte Carlo techniques that require too much computational time to run full chip Electronic Design Automation (EDA) simulations. The IC industry typically uses image threshold techniques to determine space "hot spots" from fast optics calculations. The accuracy of these threshold techniques have improved with calibrated resist OPC models that provide some description of the resist process. However, there is no statistical description of resist response to a large number of non-ideal process effects that occur in a real manufacturing environment.

SUMMARY OF THE INVENTION

The invention can provide apparatus and methods of processing a substrate in real-time using statistical defect procedures, models, and libraries to improve process yield. The invention provides a simple statistical algorithm that quantifies the pattern hot spot fail rate as well as the general line edge roughness for IC designs. The invention solves two problems: 1) uses a statistical method to determine the fail rate for an IC pattern site instead of exclusively using an image threshold; and 2) enables a simplified calculation of the line edge roughness that is not included in current pattern based design layout placement algorithms.

This invention uses calibrated resist simulations as a means to quantify RLS performance tradeoffs while providing a more fundamental understanding of micro-bridging and LWR.

The invention creates a "hybrid" analytical algorithm that uses an experimentally determined "pooled polymer de-protection variation" (PPDV) parameter into a typical statistical distribution solution to calculate a fail rate for a specific IC design space. The invention also uses a simplified relationship to link the design space bridging fail rate to the line edge roughness using the PPDV parameter. The PPDV parameter and simplified algorithm enable an experimentally calibrated statistical optimization of IC design layouts (design rules) to produce the highest yield.

For additional information on the basic experimental library techniques, see "U.S. patent application Ser. No. 11/947,234, entitled "Enhanced Process Yield Using a Hot-Spot Library", filed on Nov. 29, 2007, which is incorporated herein by reference in its entirety. The present patent application provides a mathematical algorithm that uses the PPDV parameter to calculate the statistical hot spot fail rate as well as quantify the line edge roughness. The PPDV parameter seeks to provide simple description of the variation of a real pattern process without running Monte Carlo simulations that are too mathematically intensive for full chip simulation.

High Numerical Aperture (NA) immersion and EUV lithography processes are challenged to meet stringent control requirements for the 22 nm node and beyond. Lithography processes must balance resolution, LWR and sensitivity (RLS) performance tradeoffs while hardware modules including coat, bake, and development seek to enable resist processes to balance RLS limitations. The inventor has studied the fundamentals of the RLS performance tradeoffs through a combination of calibrated resist simulations and experiments.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4A-4C illustrate simulation data in accordance with embodiments of the invention;

FIG. 11A and FIG. 11B illustrate exemplary resist cross-sections in accordance with embodiments of the invention;

FIG. 14 illustrates exemplary flow diagram of a procedure for processing a substrate in accordance with embodiments of the invention; and FIG. 15 illustrates another exemplary flow diagram of a procedure for processing a substrate in accordance with embodiments of the invention.

DETAILED DESCRIPTION

Figure 1:
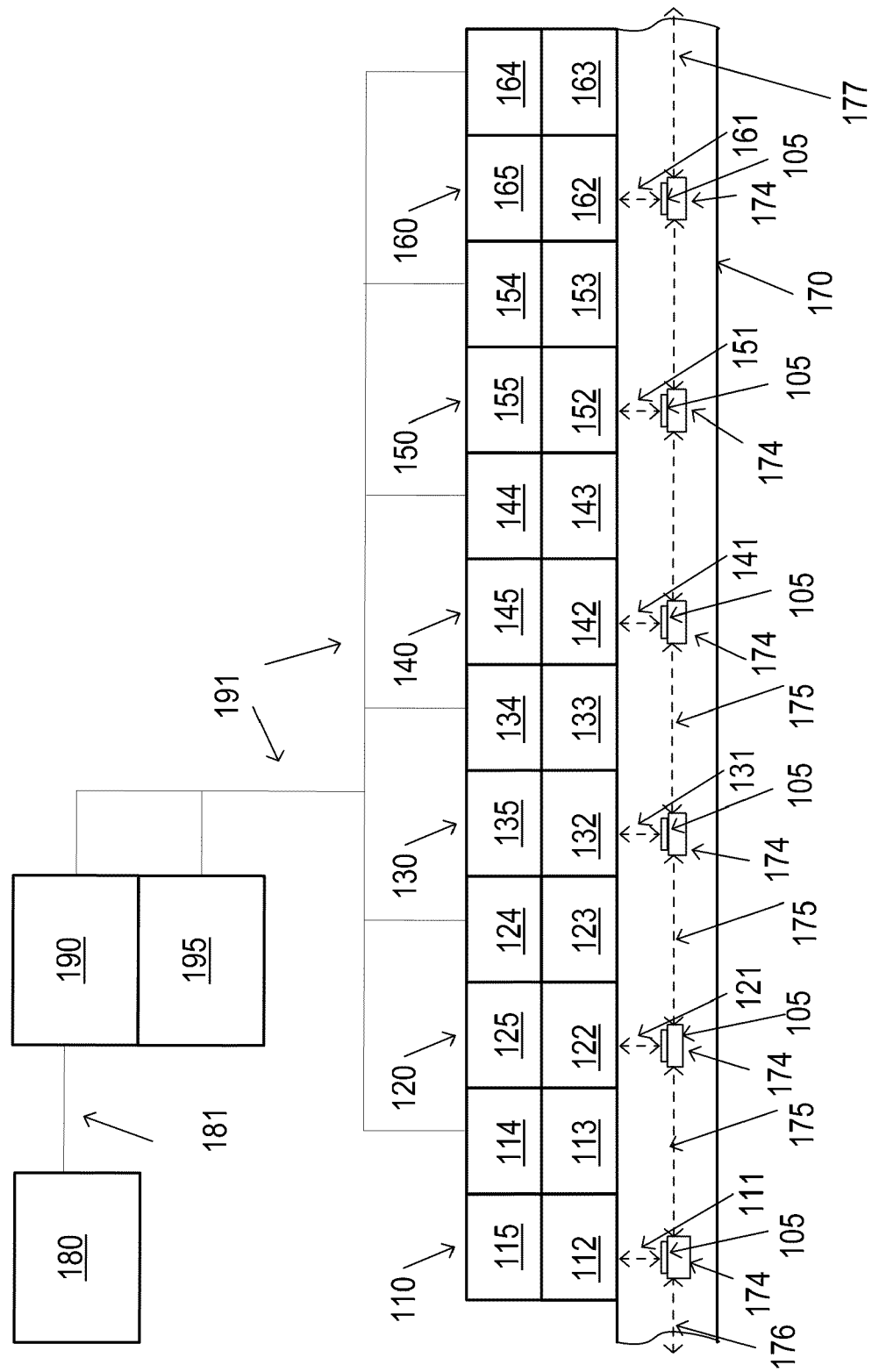
FIG. 1 shows an exemplary block diagram of a processing system in accordance with embodiments of the invention.

This invention provides methods and apparatus for creating calibrated resist models that capture the exposure kinetics, acid diffusion properties, de-protection kinetics, and dissolution response as a function of Photo Acid Generator (PAG) loading in 193 nm and smaller polymer systems. The invention uses calibrated resist models to quantify the resolution and sensitivity performance tradeoffs as well as the degradation of resist contrast relative to image contrast at small dimensions.

The calibrated resist simulations, which are used today, are capable of quantifying resolution and sensitivity tradeoffs, but lack the ability to model LWR. The inventor knows LWR is challenging to simulate (lattice models) and to measure due to the dependence on spectral frequency, and the inventor has developed novel techniques that use statistical data from micro-bridging experiments and historical data as means to better understand the statistical nature of LWR. Micro-bridging analysis produces a statistical distribution of "discrete bridging events" that encompasses practical variations across scanner, track, and resist. Micro-bridging and LWR experiments were performed using a 1.2 NA immersion system on 45 nm space structures (90 nm pitch) as a means to demonstrate the invention, but the methodology can also be used to study EUVL processes as the technology matures. The understanding of the RLS performance tradeoffs enables the users of the invention to develop future hardware and processes that support industry scaling goals.

Lithography processes are challenged to balance the resolution, LWR and sensitivity (RLS) performance tradeoffs while scaling resist thickness below 100 nm. Integrated circuit consortia have created RLS performance goals as a mean to monitor EUVL patterning readiness (resolution=<32 nm HP, LER=<4 nm (3 s), and dose=<15 mJ/cm$^2$). While some resist material suppliers have made good progress on meeting the resolution requirement and the dose requirements, the inventor believes that materials have not been found that simultaneously meet the LWR requirement. This challenges the industry to have a deeper understanding of LWR as well as the RLS performance tradeoffs, so that, new hardware and processes can be designed to meet manufacturing requirements. Embodiments of the invention use calibrated resist simulations as a means to quantify RLS performance tradeoffs while providing a more fundamental understanding of micro-bridging and LWR.

The resist sensitivity is dependent on the rate of acid generation during exposure and the rate of polymer de-protection during the PEB. Acid generation is dependent on the molar absorbance and quantum efficiency of the PAG. At KrF and ArF exposure wavelengths, an increase in the absorbance of the film through PAG loading is typically used to increase sensitivity. At the EUVL exposure wavelengths, sensitivity increases are more complicated due to the relative transparency of materials at 13.5 nm as well as the dependence on secondary electrons for actual energy transfer, and a general strategy has been to incorporate sensitizers in the resist to capture secondary electron energy or use very high PAG loadings to effectively increase the quantum efficiency.

The inventor believes that the photochemical generation of acid and the corresponding catalytic reaction with the acid liable group on the polymer during the PEB are critical factors to the formation of LWR.

In some embodiments, lithography simulation can be used to generate illumination conditions that stress the contrast data and corresponding process latitude, and the imaging illumination conditions can transition from poor contrast (image in resist Normalized Log Slope (NILS)~0.3) to good contrast (image in resist NILS>1). When defect data is required, data-collecting experiments can be run with test layouts to correlate the defect levels for specific track process (resist, rinse, top-coat, develop, bake) to the simulated data. The test layouts can be either dense pitch lines or spaces (metal/STI, contact, via) or two-dimensional layouts like gate memory cell line end spaces. The defect levels can be measured over an appropriate design layout area for each test condition to generate reliable statistical data (i.e. defects/area or defects/space run length). The defect data can be correlated to the simulated contrast data to provide a calibration curve that can be used to relate process yield to specific integrated circuit dimensions. Contrast data can be obtained by using one or more imaging perturbations such as numerical aperture, partial coherence, focus, dose, mask size, or mask phase shift technology like attenuated or alternating. This calibration curve can then be used in EDA software to adjust design rule spaces, lines, or holes (polygon edges) to meet specific yield targets. Specifically, lithography simulation is applied to complex 2D design layouts to determine the contrast data at each polygon edge segment, which can be defined by user of the invention. If the contrast data is below specific threshold point, the polygon segment is adjusted, so that, the new polygon region generates simulated contrast data above a threshold value. The threshold value is determined from the calibrated contrast data vs. hot-spot curve based on process yield goals. This EDA methodology is a valuable Design for Manufacturing (DFM) tool that can be used to calibrate process yield in early process development or further optimize processes already in production.

One of the EDA software techniques supported by the invention and disclosed herein relates a lithography simulation image parameter (IP) obtained from a design layout to measured hot-spots (defects) that are specific to a user's tool set (scanner and track) as well as their chemical process (resist selection, track bake, track rinse, track develop, etc). In addition, an IP vs. hot-spot calibration curve can provide a statistical fingerprint of the process yield behavior. The statistical nature of the hot-spot measurements (per area or per run length) included in the invention provides a much larger scale of process variations (tool/process) than just individual metrology measurements that are traditionally used to set design/mask rules today. In addition, process calibration curves (image parameters vs. hot-spots) can also be generated for new process integration approaches that generate new types of statistical data for pattern hot-spots, and the additional statistical data can include metal base poisoning data from dual damascene, STI field oxide variation data, metal gate substrate variation data, immersion lithography data, and/or double patterning lithography data. Furthermore, one or more IP vs. hot-spot calibration procedures can provide PPDV data that can be used to improve yields/robustness for specific tools/processes. When a process is run at a contrast threshold condition (IP threshold), it becomes very sensitive to small statistical process effects that might not be as easily partitioned when operating at high contrast conditions. In some cases, the inflection point in the IP vs. hot-spot curve can be defined as the IP threshold condition during data collection procedures associated with the invention, and different IP threshold conditions can be used to establish the different selection points between good and bad imaging data for the different sets of statistical data. For example, the sets of statistical data associated with the good imaging data can be used in track, scanner, or integration experiments to improve yield. The tool or process conditions can be optimized using one or more of these sets of statistical data, and these optimized conditions can be transferred as more robust processes to the appropriate tools, thereby providing a higher yield manufacturing process.

The reduction of resist film thickness below 100 nm (EUVL target 50-80 nm) adds additional variables that can affect acid concentration throughout the film. The surface energy affects at the substrate-resist and resist-air interfaces can induce PAG segregation that will be attracted to or away from interfaces. In addition, the intermixing of resist and organic BARC species can also reduce the amount of PAG or acid that is available at the bottom of the resist film. The magnitude of these effects is typically in the range of 10-15 nm at the bottom or top of the resist profile. In the case of a 50 nm film, interfacial effects of the top 10 nm and bottom 10 nm of the resist can have a substantial impact to the overall imaging performance.

In some examples, a relative reduction in the level of acid and reaction de-protection at the bottom edge of the resist can be identified as a major source of LWR. The experimental data has included many EUVL resist profiles at the 36 nm half-pitch in which the profile surface roughness increases from the top of the resist profile to the bottom of the resist profile. These resist profile images are consistent with a "lack of acid" problem and a corresponding "de-protection reaction problem" in the bottom 25% of the resist film that causes the LWR problems.

This invention uses micro-bridging analyses to provide a novel means for understanding the impact of LWR on small structures that are required for EUVL. As space structure dimension are reduced to 22 nm, the inventor believes that micro-bridging appears to be forming as an extension of poor LWR. Historically, the scale of LWR was much smaller than the actual print feature space. For EUVL, the proximity of the line edge and the open resist space is very close, the size of the open resist space can be examined as a potential linkage between LWR and micro-bridging. Micro-bridging defect analysis provides a wafer scale understanding of variation compared to the localized variation of LWR. Micro-bridging is a discrete event that can be included into a statistical model of failure rates that occur over a large area. For example, pattern defect analysis of a large memory area (10 megabit) might show one-hundred bridges (10 ppm) even though the image contrast and LWR level are relatively constant. This process observation provides insight into the stochastic nature of micro-bridging and its relationship to LWR.

Some embodiments of the invention have focused on regulating the LWR through a change in resist contrast. Resist contrast has historically been defined as the change in the dissolution rate over the change in the exposure energy. However, some embodiments of the invention used a contrast ratio defined as the resist contrast divided by the image contrast. The resist contrast is calculated as the exposure latitude, which includes resist kinetics and dissolution response. The image contrast is calculated as the image in resist NILS.

FIG. 1 shows an exemplary block diagram of a processing system in accordance with embodiments of the invention. In the illustrated embodiment, processing system 100 comprises a lithography subsystem 110, an exposure subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more hot-spot-related procedures.

The system controller 190 can be coupled to the lithography subsystem 110, the exposure subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

The lithography subsystem 110 can perform one or more lithography-related process sequences, and micro-bridging defect data can be collected using the lithography subsystem 110. The lithography-related process sequences can include coating procedures, developing procedures, thermal procedures, measurement procedures, inspection procedures, alignment procedures, transfer procedures, and/or storage procedures, and the micro-bridging defect data, the PPDV data, and/or other statistical variance data can be collected, verified, evaluated, tested, updated, and/or stored during the lithography-related process sequences. The micro-bridging defect data, the PPDV data, and/or other statistical variance data can be dependent upon coating procedure variables, developing procedure variables, thermal procedure variables, measurement procedure variables, inspection procedure variables, alignment procedure variables, and/or other lithography-related variables associated with the substrate being processed. In addition, DOE techniques can be used to establish experimental, Design-Rule Checking (DRC), and/or other testing procedures that can be used to create additional lithography-related micro-bridging defect data, PPDV data, and/or other statistical variance data.

The exposure subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the exposure subsystem 120, and one or more substrates 105 can be transferred 121 between the transfer subsystem 170 and the exposure subsystem 120 in real time. Substrate 105 can be, for example, a semiconductor substrate, a work piece, or a liquid crystal display (LCD), and the substrates 105 can include one or more layers that can include semiconductor material, carbon material, dielectric material, glass material, ceramic material, metallic material, oxidized material, mask material, or planarization material, or a combination thereof. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

The exposure subsystem 120 can perform one or more exposure-related process sequences, and micro-bridging defect data can be collected using the exposure subsystem 120. The exposure-related process sequences can include immersion exposure procedures, dry exposure procedures, ultraviolet (UV) exposure procedures, extreme ultraviolet (EUV) exposure procedures, thermal procedures, measurement procedures, inspection procedures, alignment procedures, transfer procedures, and/or storage procedures, and the micro-bridging defect data, the PPDV data, and/or other statistical variance data can be collected, verified, evaluated, tested, updated, and/or stored during the exposure-related process sequences. The micro-bridging defect data, the PPDV data, and/or other statistical variance data can be dependent upon immersion exposure variables, dry exposure variables, ultraviolet (UV) exposure variables, extreme ultraviolet (EUV) exposure variables, thermal procedure variables, measurement procedure variables, inspection procedure variables, alignment procedure variables, and/or other exposure-related variables associated with the substrate being processed. In addition, DOE techniques can be used to establish experimental, DRC, and/or other testing procedures that can be used to create additional exposure-related micro-bridging defect data, PPDV data, and/or other statistical variance data.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135.

The etch subsystem 130 can perform one or more etch-related process sequences, and micro-bridging defect data can be collected using the etch subsystem 130. The etch-related process sequences can include plasma etching procedures, non-plasma etching procedures, ashing procedures, cleaning procedures, trimming procedures, thermal procedures, measurement procedures, inspection procedures, alignment procedures, transfer procedures, and/or storage procedures, and the micro-bridging defect data, the PPDV data, and/or other statistical variance data can be collected, verified, evaluated, tested, updated, and/or stored during the etch-related process sequences. The micro-bridging defect data, the PPDV data, and/or other statistical variance data can be dependent upon plasma etching variables, non-plasma etching variables, ashing variables, cleaning variables, trimming variables, thermal procedure variables, measurement procedure variables, inspection procedure variables, alignment procedure variables, and/or other etch-related variables associated with the substrate being processed. In addition, DOE techniques can be used to establish experimental, DRC, and/or other testing procedures that can be used to create additional etch-related micro-bridging defect data, PPDV data, and/or other statistical variance data.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145.

The deposition subsystem 140 can perform one or more deposition-related process sequences, and micro-bridging defect data can be collected using the deposition subsystem 140. The deposition-related process sequences can include physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, plasma enhanced chemical vapor deposition (PECVD) procedures, thermal procedures, measurement procedures, inspection procedures, alignment procedures, transfer procedures, and/or storage procedures, and the micro-bridging defect data, the PPDV data, and/or other statistical variance data can be collected, verified, evaluated, tested, updated, and/or stored during the deposition-related process sequences. The micro-bridging defect data, the PPDV data, and/or other statistical variance data can be dependent upon PVD variables, CVD variables, variables iPVD variables, ALD variables, PEALD variables, PECVD variables, thermal procedure variables, measurement procedure variables, inspection procedure variables, alignment procedure variables, and/or other deposition-related variables associated with the substrate being processed. In addition, DOE techniques can be used to establish experimental, DRC, and/or other testing procedures that can be used to create additional deposition-related micro-bridging defect data, PPDV data, and/or other statistical variance data.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more substrates 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The inspection subsystem 150 can perform one or more inspection-related process sequences, and micro-bridging defect data can be collected using the inspection subsystem 150. The inspection-related process sequences can include optical inspection procedures, Infrared (IR) inspection procedures, UV inspection procedures, EUV inspection procedures, video inspection procedures, alignment procedures, transfer procedures, and/or storage procedures, and the micro-bridging defect data, the PPDV data, and/or other statistical variance data can be collected, verified, evaluated, tested, updated, and/or stored during the inspection-related process sequences. The micro-bridging defect data, the PPDV data, and/or other statistical variance data can be dependent upon optical inspection variables, IR inspection variables, UV inspection variables, EUV inspection variables, video inspection variables, alignment procedure variables, and/or other inspection-related variables associated with the substrate being processed. In addition, DOE techniques can be used to establish experimental, DRC, and/or other testing procedures that can be used to create additional inspection-related micro-bridging defect data, PPDV data, and/or other statistical variance data.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more substrates 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165.

The metrology subsystem 160 can perform one or more metrology-related process sequences, and micro-bridging defect data can be collected using the metrology subsystem 160. The metrology-related process sequences can include optical metrology procedures, IR metrology procedures, UV metrology procedures, EUV metrology procedures, CD-Scanning Electron Microscopy (CDSEM) procedures, Transmission Electron Microscopy (TEM) procedures, focused ion beam (FIB) procedures, Optical Digital Profilometry (ODP) procedures, Atomic Force Microscope (AFM) procedures, alignment procedures, transfer procedures, and/or storage procedures, and the micro-bridging defect data, the PPDV data, and/or other statistical variance data can be collected, verified, evaluated, tested, updated, and/or stored during the metrology-related process sequences. The micro-bridging defect data, the PPDV data, and/or other statistical variance data can be dependent upon optical metrology variables, IR metrology variables, UV metrology variables, EUV metrology variables, CDSEM variables, TEM variables, FIB variables, ODP variables, AFM variables, alignment procedure variables, and/or other inspection-related variables associated with the substrate being processed. In addition, DOE techniques can be used to establish experimental, DRC, and/or other testing procedures that can be used to create additional inspection-related micro-bridging defect data, PPDV data, and/or other statistical variance data.

The transfer subsystem 170 can comprise transfer elements 174 and transfer means (175, 176, and 177) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof. For example, the sites on substrate can include hot-spot sites, target sites, overlay sites, alignment sites, measurement sites, verification sites, inspection sites, or damage-assessment sites, or any combination thereof.

In some examples, transfer subsystem 170 can use the micro-bridging defect data, the PPDV data, and/or other statistical variance data to determine where and when to transfer a substrate. Alternatively, other data and/or other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

Operational state data can be established for the subsystems (110, 120, 130, 140, 150, 160, and 170) and can be used and/or updated when micro-bridging defect data is created, updated, and/or used. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated when micro-bridging defect data is created, updated, and/or used. For example, the operational state data can include availability data, matching data for the processing elements, expected processing times for some process steps and/or sites, yield data, confidence data and/or risk data for the processing elements, or confidence data and/or risk data for one or more hot-spot-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using an intranet, an internet, and wired, and/or wireless connections. The controllers (114, 124, 134, 144, and 190) can be coupled to external devices as required.

One or more of the controllers (114, 124, 134, 144, 154, 164, and 190) can be used when performing real-time defect-related procedures. A controller can receive real-time data to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the MES 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed, In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a hot-spot and/or process defect is identified. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, 150, 160, and 170) may include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

Output data and/or messages from defect-related procedures can be used in subsequent procedures to optimize the process accuracy and precision. Data can be passed to defect-related procedures in real-time as real-time variable parameters, overriding current model default values and narrowing the search space for resolving accurate results. Real-time data can be used with a library-based system, or regression-based system, or any combination thereof to optimize a hot-spot-related procedure.

Unsuccessful procedures or processing sequences can report a failure when a limit is exceeded, and successful procedures can create warning messages when limits are being approached. Pre-specified failure actions for procedures errors can be stored in a database, and can be retrieved from the database when an error occurs.

Figure 2:
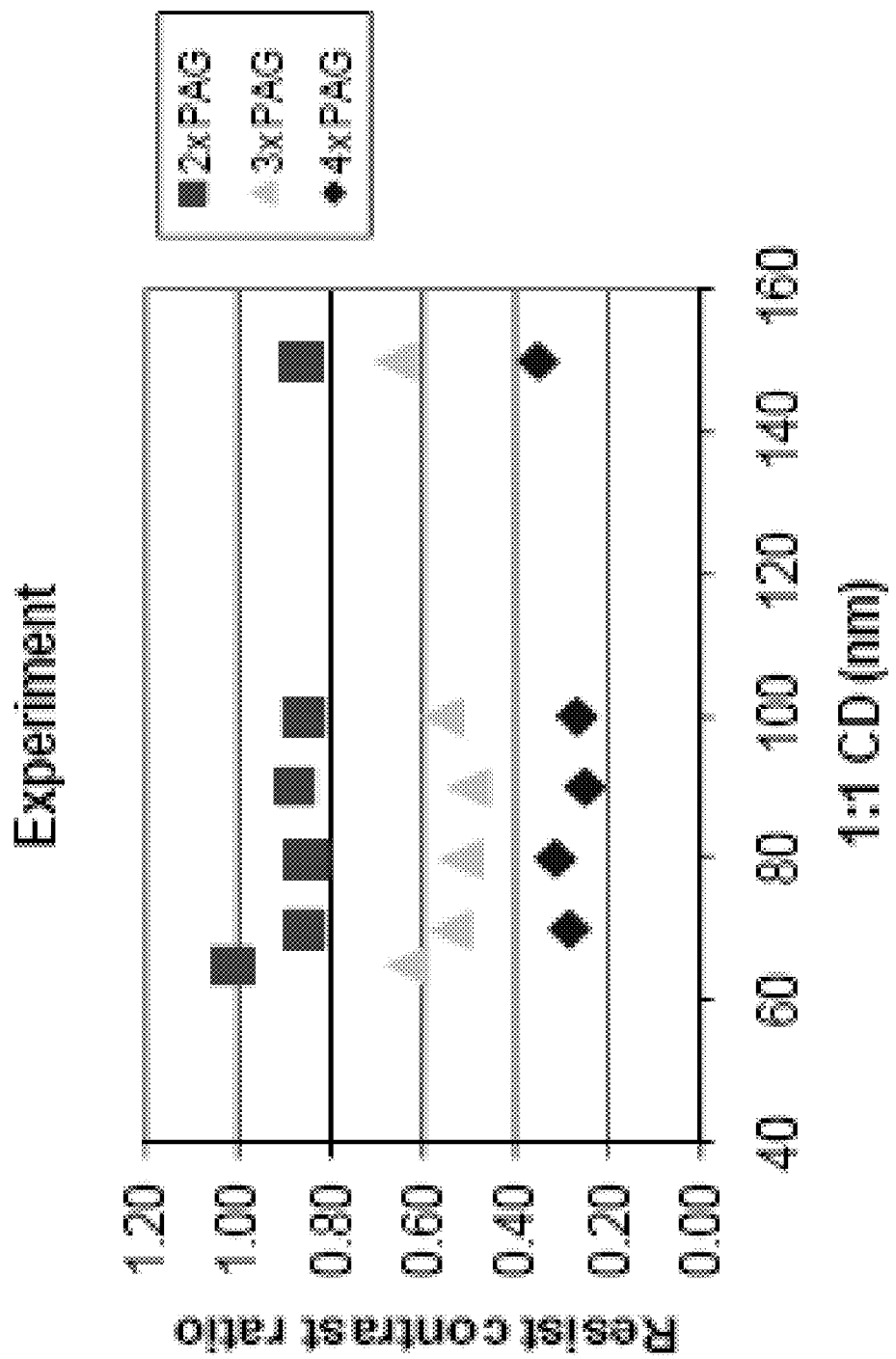
FIG. 2 illustrates model resist platform data and experiment data in accordance with embodiments of the invention.

FIG. 2 illustrates model resist platform data and experiment data in accordance with embodiments of the invention. During testing, a resist platform was found that has a dramatic reduction in the resist contrast ratio as a function of PAG loading. The contrast ratio is useful because it quantifies the change in resist contrast relative to the image. The model resist platform is based on a methacrylate polymer and a Triphenyl Sulfonium (TPS)-nonaflate PAG supplied by TOK.

The contrast ratio was calculated from experimental CD data collected across four PAG loadings (1×-4×) using an ASML XT1250 scanner (annular, 0.85 NA, so=0.93, si=0.69) and TEL CLEAN TRACK LITHIUS system. The resist and BARC were coated at a 90 nm and 85 nm thickness, respectively. For example, the lithography subsystem 110 can include one or more CLEAN TRACK LITHIUS systems, and the exposure subsystem 120 can include one or more ASML XT1250 scanners.

The experimental contrast ratio decreased from around 0.85 to 0.25 as the PAG loading increased from 2× to 4× levels (normalized) as shown in FIG. 2. The experimental data shows that the resist exposure latitude is dramatically falling with PAG loading even though the CD target (NILS) is not changing. The experimental contrast ratio also shows a unique behavior where the resist contrast appears to increase at the smallest CD size. The adjustment of PAG loading in this model resist system provides a mean to test study MB and LWR levels as a function of the resist contrast ratio.

Calibrated resist models were generated for each PAG loading as a way to better understand the chemical and process effects that are reducing the resist contrast. The resist models were validated by comparing resist simulations back to the experimental data shown in FIG. 2. After validation, large scale micro-bridging and LWR experimental data were collected at a 45 nm space/90 nm pitch using ASML XT1700 and TEL CLEAN TRACK LITHIUS i+. For example, the lithography subsystem 110 can include one or more CLEAN TRACK LITHIUS i+ systems, the exposure subsystem 120 can include one or more ASML XT1700 scanners, and CLEAN TRACK LITHIUS i+ systems can include integrated metrology (IM) modules that can provide CD and profile data.

Using various examples, resist simulation can be used to explain the micro-bridging and LWR trends as well as RLS performance tradeoffs. In some examples, high NA immersion experiments were used to demonstrate the inventive concept, but the methodology can also be used to study EUVL processes as the technology matures.

During data-collection procedures, resist kinetic and dissolution model parameters can be experimentally extracted as a function of PAG loading using exposure dose data. Some of the experimental kinetic and dissolution rate data showed that the photo-speed increases as a function of PAG loading, and the inventor used mathematical fitting routines to determine that the de-protection and quencher reaction rate constants did not change with PAG loading (i.e. first order kinetics). The confirmation of first order kinetic reactions increases the confidence that the parameters were accurately extracted. Some of the collected data showed that the photo speed (sensitivity) increases due to an increase in the molar absorbance with higher PAG loading. For example, the photo speed can be calculated as the molar absorbance times the quantum efficiency, and a higher molar absorbance enables more acid to be generated per photon. The inventor observed that the quantum efficiency appeared to be relatively constant as a function of PAG loading, and that higher PAG loadings can increase the quantum efficiency at EUVL exposure wavelengths where the PAG is relatively transparent. In some examples, high NA immersion experiments were used to demonstrate the inventive concept, but other non-immersion methodologies can also be used for EUVL processes and non EUVL procedures.

Acid and base diffusion coefficients are needed to enable physical resist simulations. An assumption is made that the acid diffusion length is 20 nm and the base diffusion lengths is 15 nm to enable initial comparisons between simulation and experiment. Simulations across a range of acid and base diffusion levels show that acid diffusion has a strong impact to the resist contrast ratio. An increase in acid diffusion length from 20 nm to 100 nm results in a drop in contrast ratio from around 0.9 to 0.3. The high acid diffusion length also reduces contrast more on smaller CDs (70 nm vs. 150 nm), and an increase in base diffusion did not appear to have much impact on the resist contrast ratio, except at the smallest CD of 65 nm. Some experimental data showed that resist contrast ratio in some cases (2× PAG) actually increases at the smallest CD, and the inventor did not anticipate that the resist contrast can actually increase at a small CD size. The inventor speculated that it could be possible to increase the resist contrast at the 65 nm CD using a very low base diffusion length. In addition, the inventor speculated that the low base diffusion could create a "wall" of base that has minimal diffusion, which results in a high acid gradient at the 65 nm CD size.

The inventor believes that a relative reduction in the level of acid and reaction de-protection at the bottom edge of the resist is a major source of LWR. For example, some cross-sections of an EUVL resist profile at a 36 nm half-pitch show that the profile surface roughness increases as you move from the top to the bottom of the resist profile. The resist profile images are consistent with the idea that there is a lack of acid and corresponding de-protection reaction needed to clean up the bottom 25% of the resist film the results in LWR.

The inventor believes micro-bridging provides a new avenue for understanding the impact of LWR on small structures targeted for EUVL. As space structure dimension are reduced to 22 nm, micro-bridging appears to be forming as an extension of poor LWR. Historically, the scale of LWR was much smaller than the actual print feature space. For EUVL, the proximity of the line edge and the open resist space is very close. This provides a potential linkage between LWR and micro-bridging.

Micro-bridging analysis provides a wafer scale understanding of variation compared to the localized variation of LWR. Micro-bridging is a discrete event that can be included into a statistical model of fail rates that occur over a large area. For example, pattern defect analysis of a large memory area (10 megabit) might show one-hundred bridges (10 ppm) even though the image contrast and LWR level are relatively constant. This process observation provides insight into the stochastic nature of micro-bridging and its relationship to LWR. The initial hypothesis for this invention is that micro-bridging and LWR should decrease with an increase in resist contrast, and the invention focuses on regulating LWR through a change in resist contrast. Resist contrast is historically defined as the change in the dissolution rate over the change in the exposure energy. However, this invention uses a contrast ratio defined as the resist contrast divided by the image contrast. The resist contrast is calculated as the exposure latitude, which includes resist kinetics and dissolution response. The image contrast is calculated as the image in resist NILS.

Figure 3A:
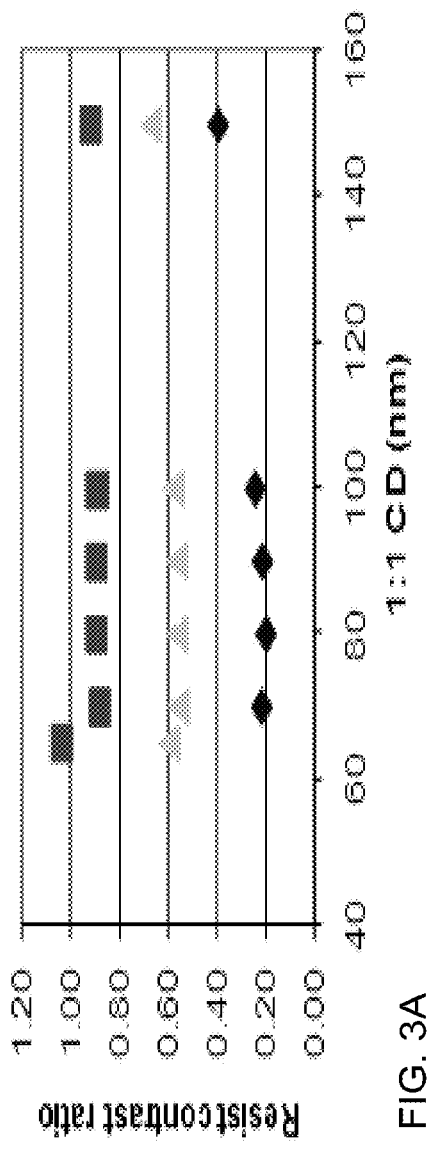
FIG. 3A and FIG. 3B illustrate simulation data and experiment data in accordance with embodiments of the invention.
Figure 3B:
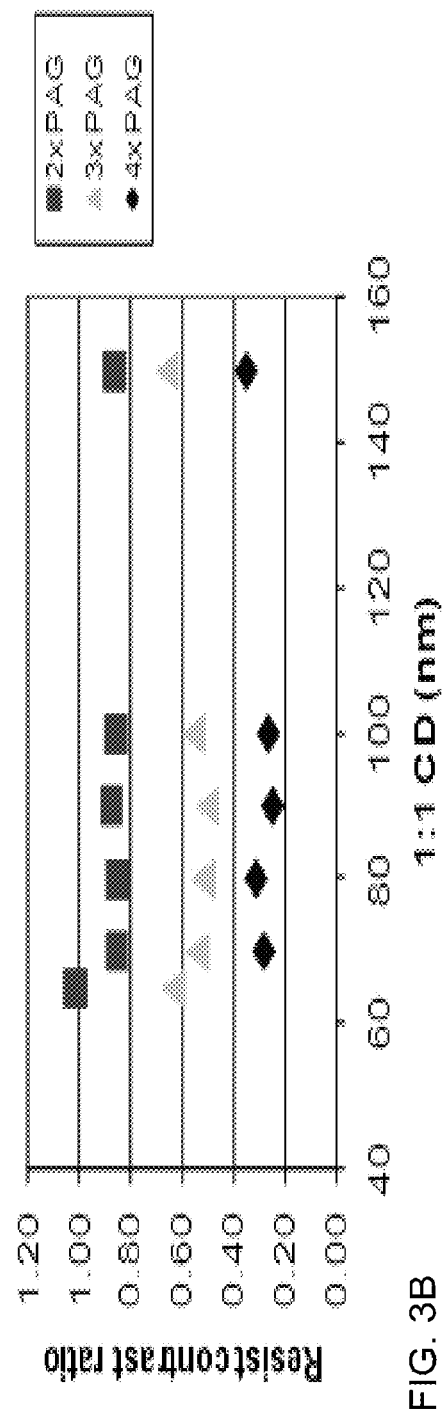

FIG. 3A and FIG. 3B illustrate simulation data and experiment data in accordance with embodiments of the invention. In various examples, one or more of the subsystems (110, 120, 130, 140, and 150) in the processing system 100 can be used to obtain the simulation data and/or the experiment data. Optimization of the acid and base diffusion coefficients for each PAG loading enables a very close fit between the simulation results shown in FIG. 3A and the experiment data shown in FIG. 3B. The simulated resist contrast ratio values show many of the characteristics that occur in the experiment. The contrast ratio for the 2× PAG shows the distinct increase at the smaller CD while both the 3× and 4× PAG cases show a gradual loss in contrast from a large to smaller CD. This comparison of the simulation and experimental data increased the inventor's confidence in the accuracy of the resist model.

FIGS. 4A-4C illustrate simulation data in accordance with embodiments of the invention. For example, one or more of the subsystems (110, 120, 130, 140, and 150) in the processing system 100 can be used to obtain this simulation data. FIG. 4A shows "Image in resist space profiles" data for a (2× PAG) example and for a (4× PAG) example. FIG. 4B shows "Developed space profiles" data for a (2× PAG) example and for a (4× PAG) example.

FIG. 4C shows "90 nm space and 180 nm pitch" data for a (2× PAG) example and for a (4× PAG) example. In various examples, one or more of the controllers (114, 124, 134, 144, 154, 164, and 190) can be used when simulations are performed. The final validation of a resist model is to assess how well the resist model predicts the resist profile. Initial resist simulations of a developed space profile for a 90 nm space on a 180 nm pitch do not seem to capture the line top rounding (2× PAG) as well as the line resist loss (4× PAG) as shown in FIGS. 4A-4C. The inventor is developing a new mechanism that can be the cause this effect.

Figures 5A, 5B, 5C:
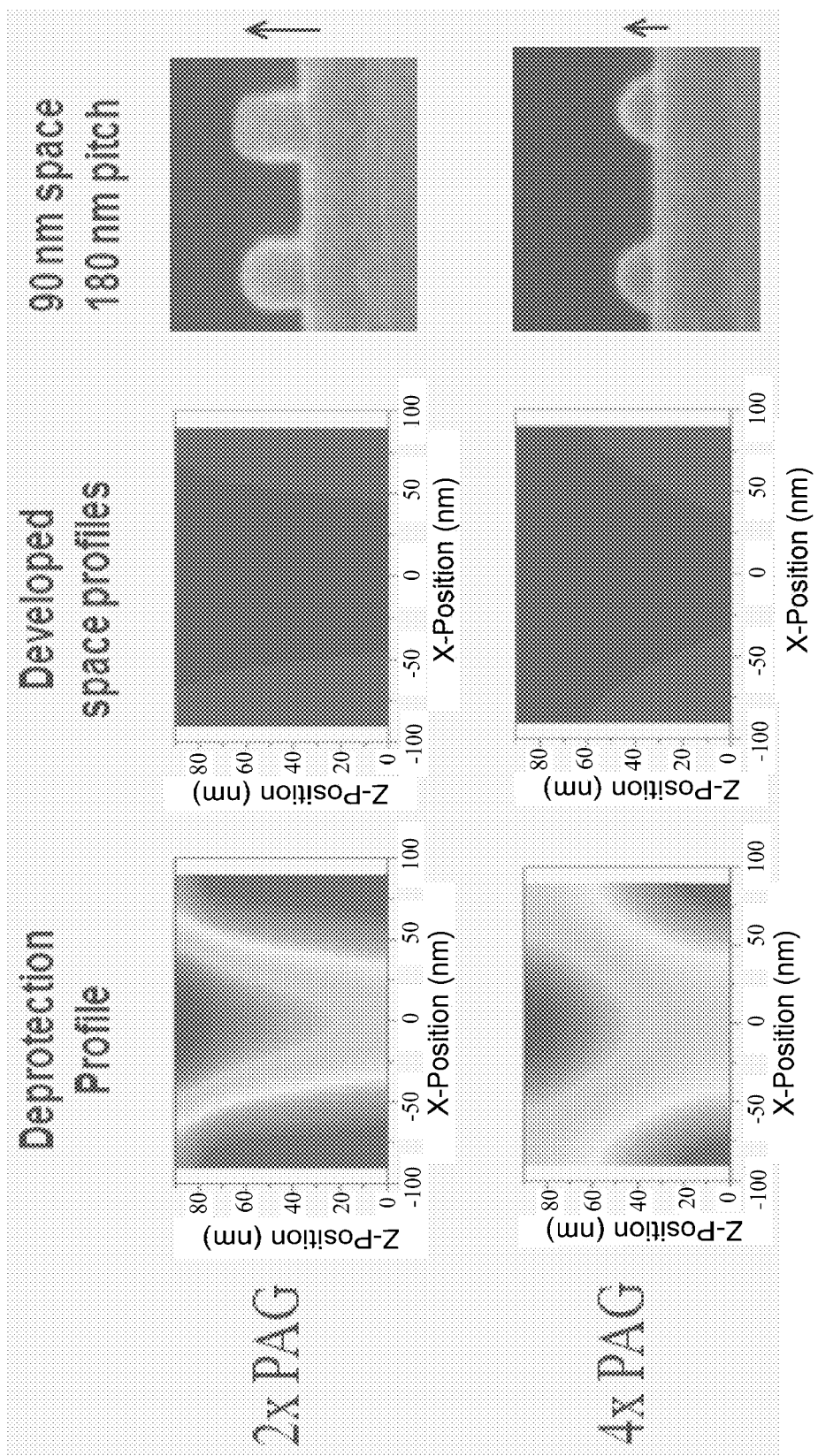
FIGS. 5A-5C illustrate additional simulation data in accordance with embodiments of the invention.

FIGS. 5A-5C illustrate additional simulation data in accordance with embodiments of the invention. For example, one or more of the subsystems (110, 120, 130, 140, and 150) in the processing system 100 can be used to obtain this additional simulation data. FIG. 5A shows "De-protection Profile" data for a (2× PAG) example and for a (4× PAG) example.

FIG. 5B shows additional "Developed space profiles" data for a (2× PAG) example and for a (4× PAG) example. FIG. 5C shows additional "90 nm space and 180 nm pitch" data for a (2×PAG) example and for a (4× PAG) example. The additional resist profile simulations shown in FIGS. 5A-5C indicate that PAG segregation appears to be the cause of additional rounding and top loss in the resists. The TPS-nonaflate PAG has the potential to migrate to the resist surface and increase the concentration of PAG at the air-resist interface. The effect of PAG segregation becomes more pronounced in thin films (<100 nm) where these interfacial effects can affect a higher percentage of the total resist profile. The additional resist profile simulations shown in FIGS. 5A-5C show that the surface PAG concentration increases as a function of PAG loading (2× to 4×), which explains the large amount of top loss in the 4× case. Using the cross section profiles, the PAG distribution in the film was adjusted to complete the full calibration of the resist models as a function of PAG loading.

In other data-collecting procedures, micro-bridging and LWR measurements were made on wafers imaged with a dense array pattern containing 45 nm lines/90 nm pitch structures. Wafers were processed using an ASML XT1700 scanner (C-quad, 1.2NA, so=0.97, si=0.85) and CLEAN TRACK LITHUIS i+ system (resist thickness=90 nm and BARC thickness=85 nm). For example, the lithography subsystem 110 can include the CLEAN TRACK LITHUIS i+ system, the exposure subsystem 120 can include the ASML XT1700 scanner, and CLEAN TRACK LITHUIS i+ systems can include integrated metrology (IM) modules that can provide CD and profile data.

Resist PAG loadings from 1× to 3× were tested without the 4× PAG case, because there was concern that the 4× PAG case could not resolve a 45 nm space. LWR measurements were made using a Hitachi 9300 SEM and analyzed using Demokritos software. For example, the metrology subsystem 160 can include the Hitachi 9300 SEM. Each LWR measurement included analysis of 150 pictures moving across the run length of the structure. Micro-bridging wafers were inspected using a KLA 2800 inspection system (394.923 $cm^2$ inspection area per wafer). For example, the inspection subsystem 150 can include the KLA 2800 inspection system. SEM review was completed to classify the actual number of bridging defects.

Figure 6B:
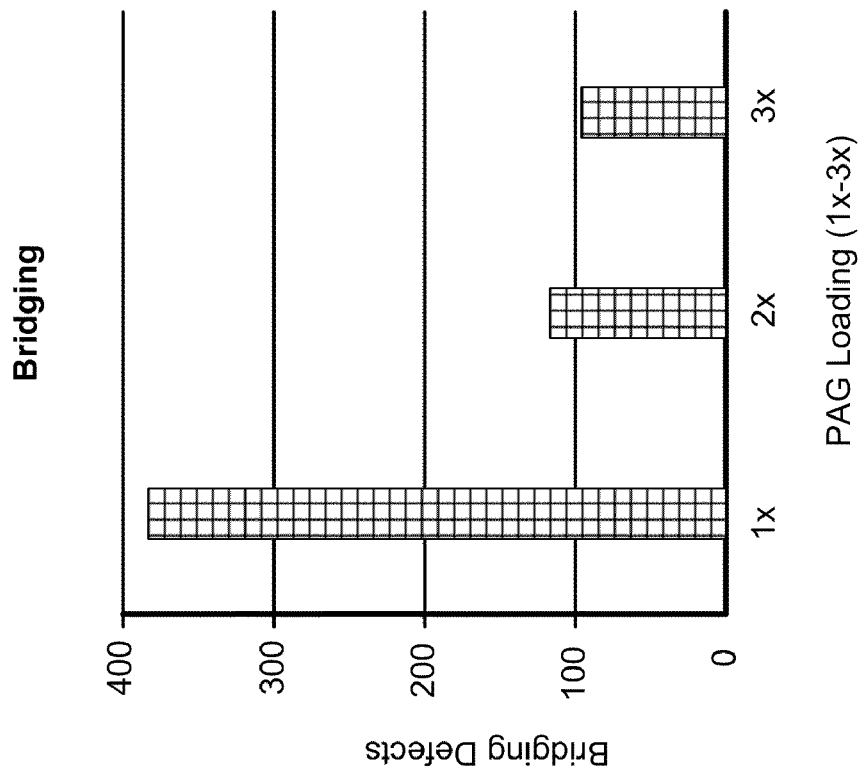
FIG. 6A and FIG. 6B illustrate Photo Acid Generator (PAG) loading data in accordance with embodiments of the invention.
Figure 6A:
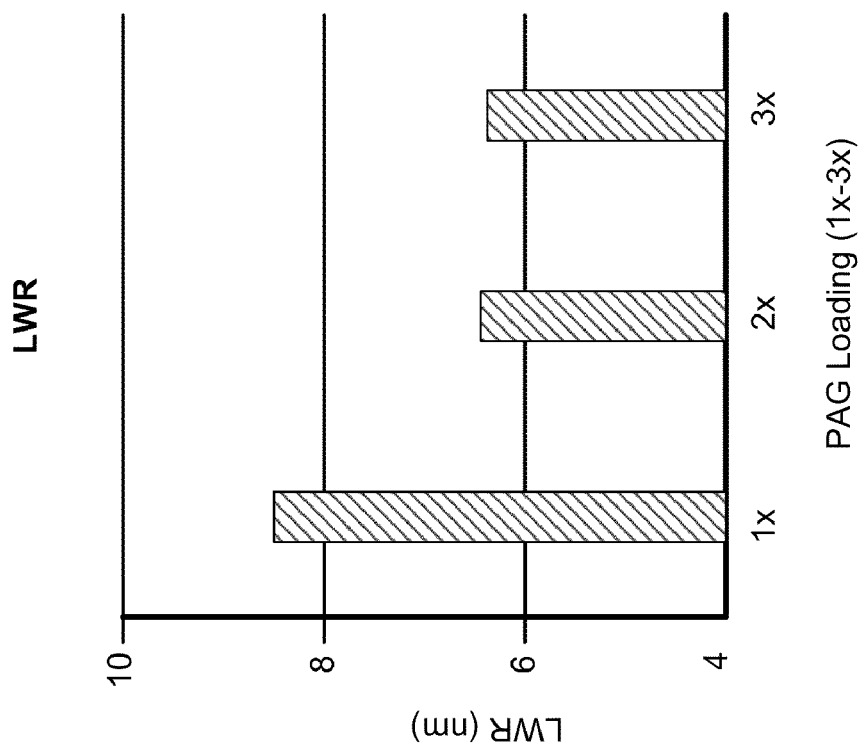

FIG. 6A and FIG. 6B illustrate Photo Acid Generator (PAG) loading data in accordance with embodiments of the invention. FIG. 6A shows LWR (nm) data for different PAG loading values (1×-3×), and FIG. 6B shows bridging data for different PAG loading values (1×-3×). The LWR data in FIG. 6A shows that the LWR levels decrease with an increase in PAG loading. The micro-bridging data in FIG. 6B shows that the micro-bridging levels decrease with an increase in PAG loading. LWR averaged across 4 sites (600 pictures) falls from 8.3 nm (3 s) to around 6.5 nm (3 s) while micro-bridging levels fell from around 375 to 95 with increased PAG loading. Analysis of the spatial change in LWR indicates that the increased PAG loading is reducing the high frequency component of the LWR. Both LWR and micro-bridging appear to follow an asymptotic decrease as a function of PAG loading. While the magnitude of the fall is different, the experimental data suggests that LWR and micro-bridging data have similar process sensitivities at small space dimensions.

The experimental data illustrates that LWR and micro-bridging levels can be impacted by chemical changes in the resist. Additional experiments were performed to determine the fundamental mechanism to explain this LWR trend. The initial experiments were performed to determine the variables that did not affect or correlate with the LWR experimental data.

Figure 7C:
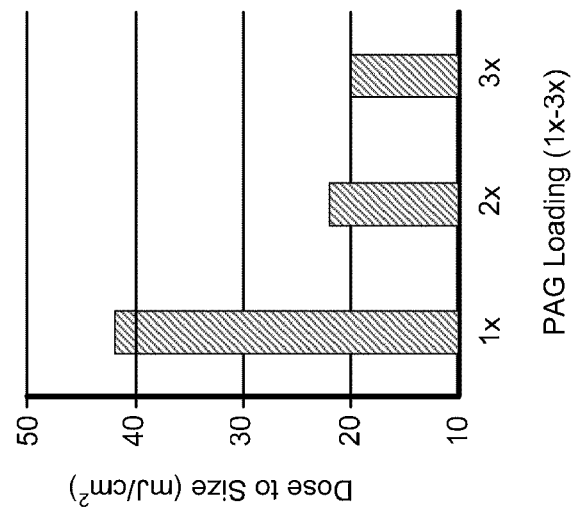
FIGS. 7A-7C illustrate additional Photo Acid Generator (PAG) loading data in accordance with embodiments of the invention.
Figure 7B:
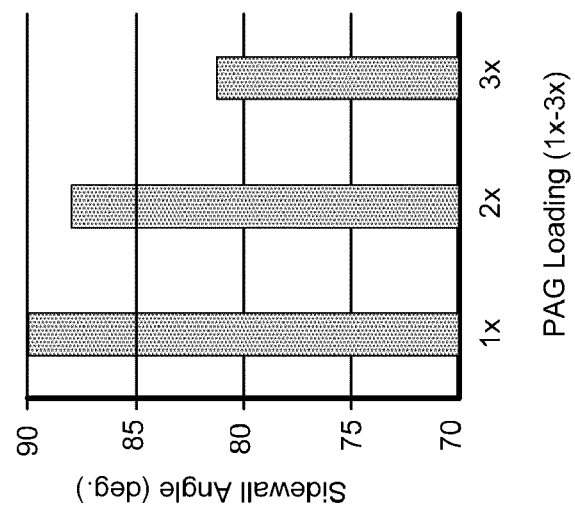
Figure 7A:
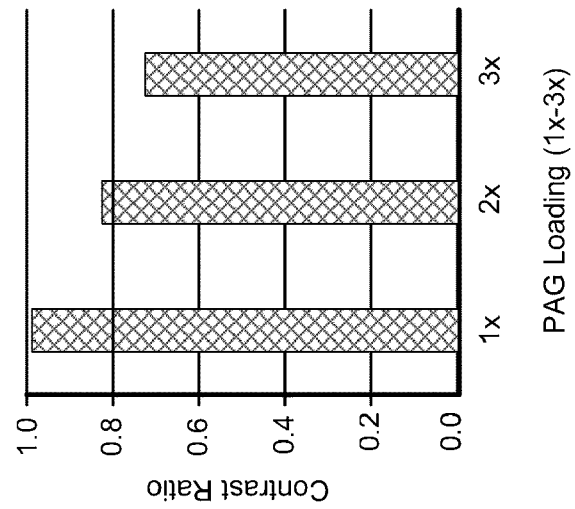

FIGS. 7A-7C illustrate additional PAG loading data in accordance with embodiments of the invention. FIG. 7A shows contrast ratio data for different PAG loading values (1×-3×), and the contrast ratio data in FIG. 7A shows that the contrast ratio values decrease with an increase in PAG loading. FIG. 7B shows sidewall angle (deg) data for different PAG loading values (1×-3×), and the sidewall angle (deg) data in FIG. 7B shows that the sidewall angle (deg) values decrease with an increase in PAG loading. FIG. 7C shows dose to size ($mJ/cm^2$) data for different PAG loading values (1×-3×), and the dose to size ($mJ/cm^2$) data in FIG. 7C shows that the dose to size ($mJ/cm^2$) values decrease with an increase in PAG loading. While examining the experimental data, the inventor learned that the reduction of LWR with PAG loading did not correlate with the experimental resist contrast ratio, dose to size or physical shape of the resist profile as shown in FIGS. 7A-7C. The 1× PAG resist had the highest experimental resist contrast ratio, the highest sidewall angle measured by scatterometry and the highest dose to size, but it had the worst LWR. These experimental results challenged the inventor to determine the real main driver of the LWR improvement with PAG loading. During further analysis, the inventor determined that higher acid concentration generated at the line edge and bottom of the resist profile was reducing the LWR and micro-bridging, respectively.

Figures 8A, 8B, 8C, 8D, 8E:
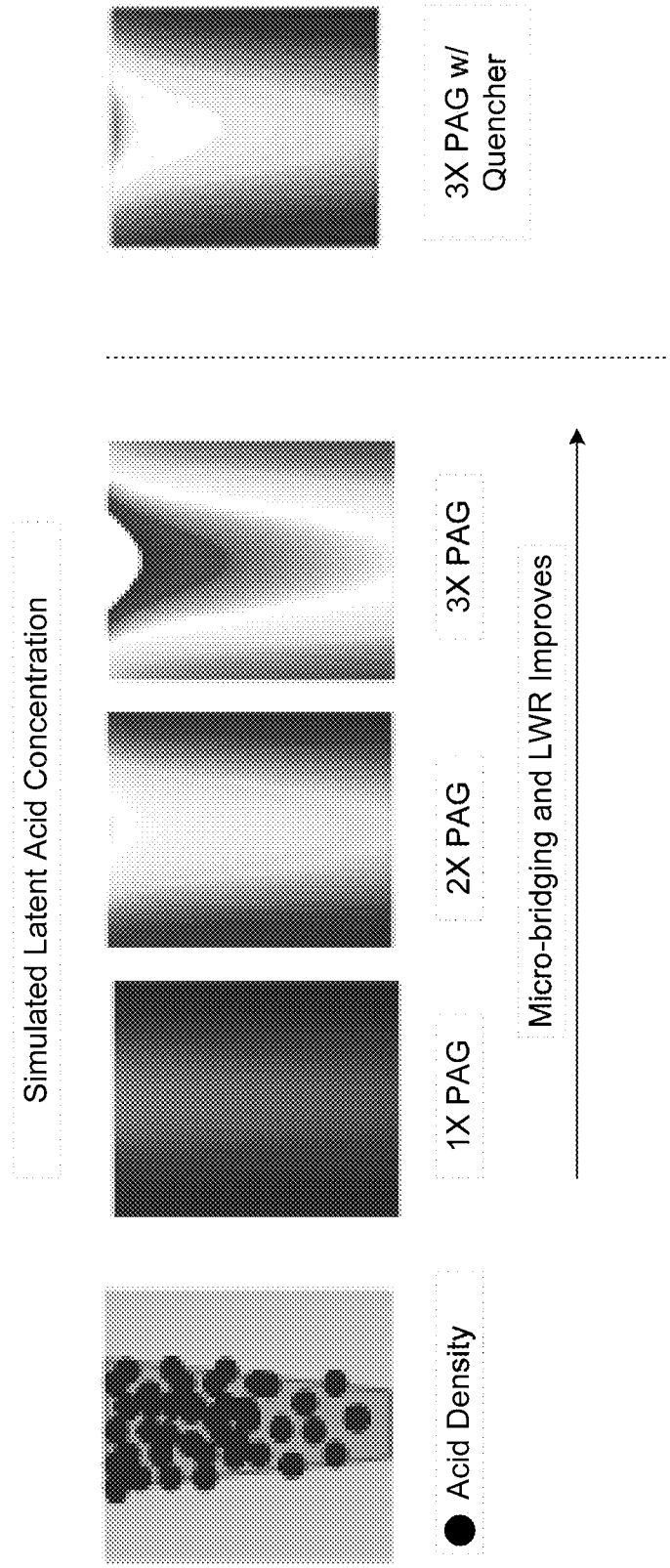
FIGS. 8A-8E illustrate new simulation data in accordance with embodiments of the invention.

FIGS. 8A-8E illustrate new simulation data in accordance with embodiments of the invention. The inventor developed new simulation software that was used to perform new acid generation simulations using the calibrated resist models. FIG. 8A shows an exemplary acid density distribution used during the new acid generation simulations. FIG. 8B shows a first exemplary plot for first simulated latent acid concentration values for a first PAG loading value (1× PAG). FIG. 8C shows a second exemplary plot for second simulated latent acid concentration values for a second PAG loading value (2× PAG). FIG. 8D shows a third exemplary plot for third simulated latent acid concentration values for a third PAG loading value (3× PAG). The simulation data shown in FIGS. 8B, 8C, and 8D show that more acid is generated in the space due to increases in PAG loading. FIG. 8E shows a fourth exemplary plot for fourth simulated latent acid concentration values for a fourth PAG loading value (3× PAG with Quencher). The simulations of acid concentration with quencher illustrated in FIG. 8E show less acid and more "blur" at the bottom (30%) of the resist space profile, which correlates to the location of roughness on typical resist profiles. The second observation from the new acid generation simulations is that more acid is generated at the top portion of the space relative to the bottom of the space (with or without quencher reaction).

Figure 9B:
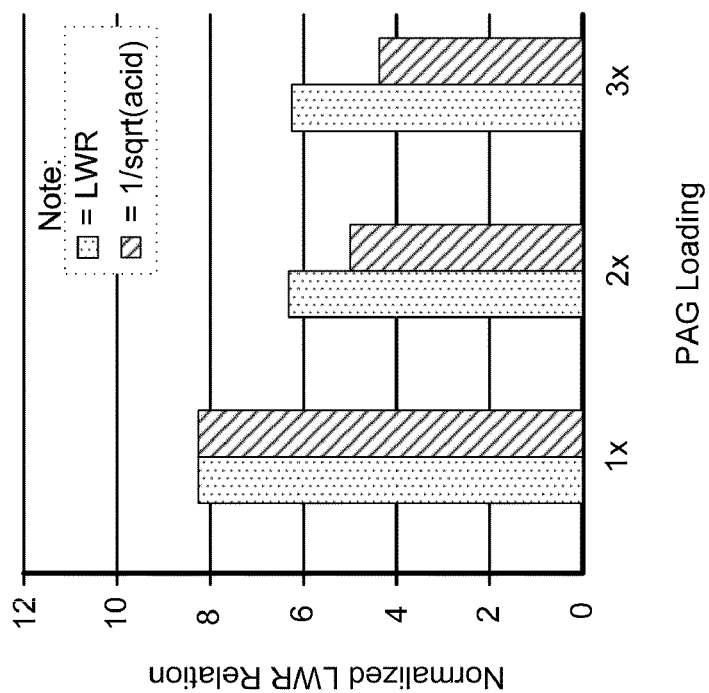
FIG. 9A and FIG. 9B illustrate exemplary correlation data in accordance with embodiments of the invention.
Figure 9A:
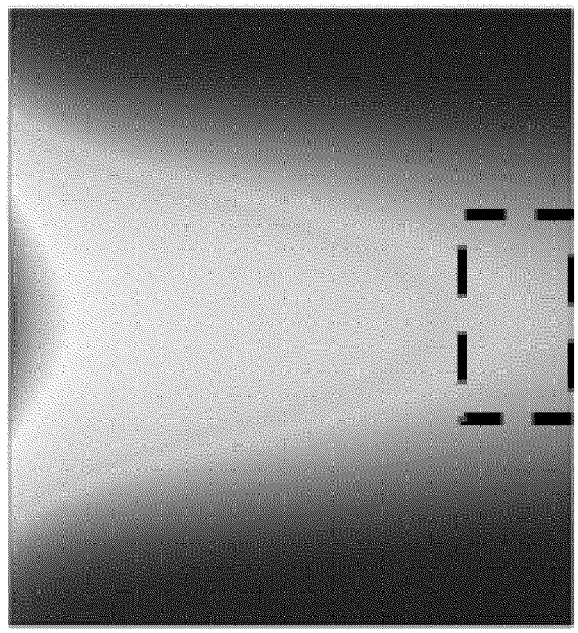

FIG. 9A and FIG. 9B illustrate exemplary correlation data in accordance with embodiments of the invention. FIG. 9A shows an additional exemplary plot for a simulated acid profile when quencher and diffusion values are included in the simulation. FIG. 9B shows normalized LWR relation data for different PAG loading values (1×-3×). Two different sets of data are shown, the first set of data shows the relation for (LWR), and the second set of data shows the relation for [1/sqrt(acid)]. The inventor's calculations support that LWR roughly correlates to [1/sqrt(acid)] as shown in FIG. 9A and FIG. 9B.

In one "proof of concept" demonstration of the invention, the designated area for acid integration was set to a 45 nm wide space by 20 nm height which roughly correlates to blur in the simulations as shown in FIG. 9A. Designated area calculations reveal that acid clearly increases as a function of PAG loading including both quencher reaction and diffusion steps. This supports the hypothesis that higher acid concentration is reducing LWR.

The inventor believes that relationship between LWR and acid concentration is consistent with most experimental demonstrations of LWR improvement. There are many processes that utilize high exposure doses to generate more acid as means to improve LWR. The over-exposure of large reticle structures down to small lines (i.e. gate) generates more acid and typically lower LWR. The addition of quencher drives higher exposure doses, which generates more acid to overcome the background base. The inventor has also determined that quencher also "clips" the edge of the acid latent image to enable higher resolution and potentially better line edge acid gradients. Finally, higher image contrast (NILS) improves the acid line edge gradient while also increasing the total amount of acid at the bottom of the resist space profile. All of the practical demonstrations of LWR improvement are consistent in that they relate to the latent acid profile in the resist film.

In various examples, simulations and experiments have been used to quantify the resolution, LWR, and sensitivity (RLS) tradeoffs that are critical for the development of EUVL patterning process. Calibrated resist simulations provide a means to explain the complex chemical interactions that occur in a resist process. In some embodiments, simulations using methacrylate resist show that an increase in PAG loading improves sensitivity (higher molar absorbance) and improves LWR (higher acid concentration), while it hurts resolution (higher acid diffusion). While these conclusions are limited to this specific PAG and resist platform, the teachings of the invention can be used to establish a methodology to solve EUVL RLS process challenges.

LWR and micro-bridging (MB) levels both appear to relate to the acid concentration and distribution in the resist film. The invention also teaches that LWR and MB are more universally correlated to acid concentration and gradients in comparison to general metrics like exposure dose. As scaling continues, there is a potential that micro-bridging and LWR trends will further align due to the close proximity of the feature space and line edge.

Simulations have been used to provide a more accurate understanding of the interaction between hardware and new EUVL resist materials. These simulations are able to assess the fundamental benefits of new material concepts like polymer bound PAG, low acid diffusion and high sensitizer resist materials that have the potential to improve patterning performance. The integration of these new materials coated as thin films between 50-80 nm requires a deep understanding of the material physical properties that minimize PAG segregation effects while maximizing resist line stability to prevent pattern collapse. Integration of process, hardware, and material understanding is required to meet EUVL RLS requirements.

Figure 10:
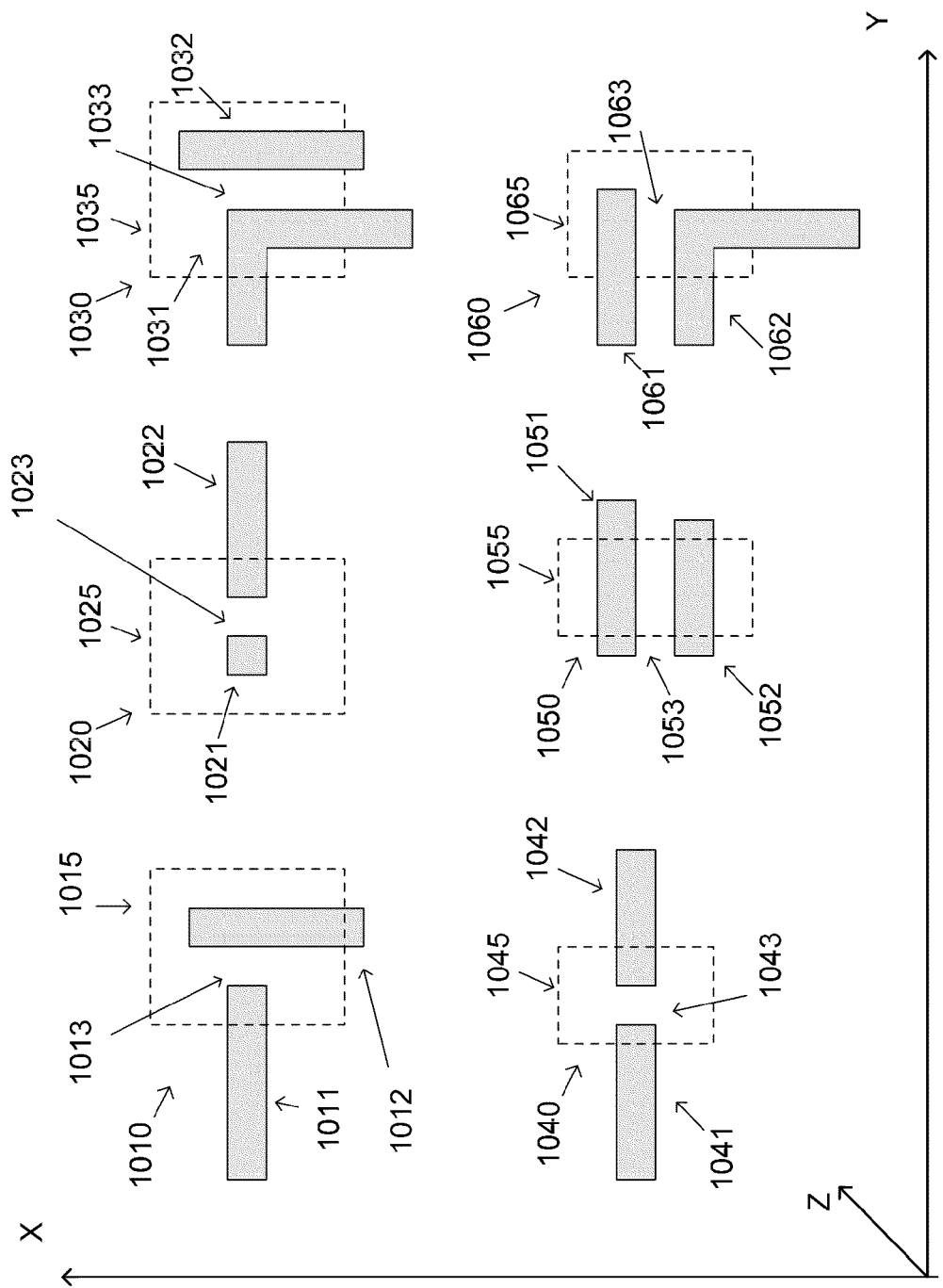
FIG. 10 illustrates exemplary potentially defective Integrated Circuit (IC) patterns in accordance with embodiments of the invention.

FIG. 10 illustrates exemplary potentially defective Integrated Circuit (IC) patterns in accordance with embodiments of the invention. In the illustrated embodiment, six different potentially defective IC patterns (1010-1060) are shown. The first potentially defective IC pattern 1010 can include a first line 1011 and a second line 1012 substantially perpendicular to the first line 1011. In addition, there can be a separation region 1013 between the first line 1011 and the second line 1012, and an exemplary analysis segment 1015 is shown surrounding the separation region 1013. In addition, the exemplary analysis segment 1015 can be used to determine if a defect is present in the first potentially defective IC pattern 1010. For example, the length of the first line 1011 and the second line 1012 can vary from about 10 nm to 1000 nm, and the width of the separation region 1013 can vary from about 10 nm to 500 nm.

The second potentially defective IC pattern 1020 can include a first via 1021 and another line 1022 substantially close to the first via 1021. In addition, there can be a separation region 1023 between the first via 1021 and the other line 1022, and an exemplary analysis segment 1025 is shown surrounding the separation region 1023. In addition, the exemplary analysis segment 1025 can be used to determine if a defect is present in the second potentially defective IC pattern 1020. For example, the length of the first via 1021 and the other line 1022 can vary from about 10 nm to 1000 nm, and the width of the separation region 1023 can vary from about 10 nm to 500 nm.

The third potentially defective IC pattern 1030 can include a first corner feature 1031 and another line 1032 substantially close to the first corner feature 1031. In addition, there can be a separation region 1033 between the first corner feature 1031 and another line 1032, and an exemplary analysis segment 1035 is shown surrounding the separation region 1033. In addition, the exemplary analysis segment 1035 can be used to determine if a defect is present in the third potentially defective IC pattern 1030. For example, the lengths associated with the first corner feature 1031 and the other line 1032 can vary from about 10 nm to 1000 nm, and the width of the separation region 1033 can vary from about 10 nm to 500 nm.

The fourth potentially defective IC pattern 1040 can include a first line 1041 and a second line 1042 substantially in-line with the first line 1041. In addition, there can be a separation region 1043 between the first line 1041 and the second line 1042, and an exemplary analysis segment 1045 is shown surrounding the separation region 1043. In addition, the exemplary analysis segment 1045 can be used to determine if a defect is present in the fourth potentially defective IC pattern 1040. For example, the length of the lines (1041 and 1042) can vary from about 10 nm to 1000 nm, and the width of the separation region 1043 can vary from about 10 nm to 500 nm.

The fifth potentially defective IC pattern 1050 can include a first line 1051 and a second line 1052 substantially parallel to the first line 1051. In addition, there can be a separation region 1053 between the first line 1051 and the second line 1052, and an exemplary analysis segment 1055 is shown surrounding the separation region 1053. In addition, the exemplary analysis segment 1055 can be used to determine if a defect is present in the fifth potentially defective IC pattern 1050. For example, the length of the lines (1051 and 1052) can vary from about 10 nm to 1000 nm, and the width of the separation region 1053 can vary from about 10 nm to 500 nm.

The sixth potentially defective IC pattern 1060 can include a first line 1061 and a second corner feature 1062 substantially close to the first line 1061. In addition, there can be a separation region 1063 between the first line 1061 and the second corner feature 1062, and an exemplary analysis segment 1065 is shown surrounding the separation region 1063. In addition, the exemplary analysis segment 1065 can be used to determine if a defect is present in the sixth potentially defective IC pattern 1060. For example, the lengths associated with the first line 1061 and the second corner feature 1062 can vary from about 10 nm to 1000 nm, and the width of the separation region 1063 can vary from about 10 nm to 500 nm.

In alternate examples, other IC patterns may be used and these other IC patterns may be positioned at different location, may have different shapes, may have corner features, and/or enhancement features.

FIG. 11A and FIG. 11B illustrate exemplary resist cross-sections in accordance with embodiments of the invention. The exemplary resist cross-sections illustrated in FIG. 11A and FIG. 11B show less roughness at the top of the profile (more acid) relative to the bottom of the profile (less acid). The local quantification of acid within the resist profile has the potential to provide a more direct relationship with the experimental LWR and micro-bridging trends. The new simulation software included in the invention is used to integrate the acid concentration including quencher reaction and acid diffusion in designated areas of the resist space and line edge.

FIG. 11A illustrates a second exemplary defect analysis segment in accordance with embodiments of the invention. In the illustrated embodiment, an exemplary defect analysis segment 1100A is shown that includes an exemplary IC pattern 1105A. A parallel line IC pattern 1105A is shown to simplify and clarify the illustration and explanation of the invention. For example, other IC patterns may be used and these other IC patterns may be positioned at different location, may have different shapes, may have corner features, and/or enhancement features. The IC pattern 1105A can include a plurality of first line feature 1110A in a first direction and a plurality of second line features 1120A that can also be oriented in the first direction. The IC pattern 1105A can include by a plurality of first space regions 1130A that can be located between a first line feature 1110A and a second line feature 1120A and that can be oriented in the first direction. In other embodiments, the first line feature 1110A, the second line feature 1120A, and/or the first space region 1130A may be configured differently.

The first line feature 1110A can have a first length and a first width; the second line feature 1120A can have a second length and a second length; and the first space region 1130A can have a third length and a third width. The first length can vary from about 10 nm to 1000 nm and the first width can vary from about 10 nm to 500 nm; the second length can vary from about 10 nm to 1000 nm and the second width can vary from about 10 nm to 500 nm; and the third length can vary from about 10 nm to 1000 nm and the third width can vary from about 10 nm to 500 nm.

In addition, the exemplary defect analysis segment 1100A can include at least one analysis segment 1160A without a potential defect and at least one other analysis segment 1160A' having at least one potential defect (micro-bridging defect) therein. The exemplary defect analysis segments (1160A, 1160A') can have a segment length and a segment width, and the segment length can vary from about 10 nm to 1000 nm and the segment width can vary from about 10 nm to 1000 nm. Alternatively, the exemplary defect analysis segments (1160A, 1160A') may have different shapes and/or different dimensions.

FIG. 11B illustrates another exemplary defect analysis segment in accordance with embodiments of the invention. In the illustrated embodiment, another exemplary defect analysis segment 1100B is shown that includes a second exemplary IC pattern 1105B. Another parallel line IC pattern 1105B is shown to simplify and clarify the illustration and explanation of the invention. For example, other IC patterns may be used and these other IC patterns may be positioned at different location, may have different shapes, may have corner features, and/or enhancement features. The second IC pattern 1105B can include a plurality of first line feature 1110B in a first direction and a plurality of second line features 1120B that can also be oriented in the first direction. The second IC pattern 1105B can include by a plurality of second space regions 1130B that can be located between a first line feature 1110B and a second line feature 1120B and that can be oriented in the first direction. In other embodiments, the first line feature 1110B, the second line feature 1120B, and/or the second space region 1130B may be configured differently.

Still referring to FIG. 11B, the first line feature 1110B can have a first length and a first width; the second line feature 1120B can have a second length and a second length; and the second space region 1130B can have a third length and a third width. The first length can vary from about 10 nm to 1000 nm and the first width can vary from about 10 nm to 500 nm; the second length can vary from about 10 nm to 1000 nm and the second width can vary from about 10 nm to 500 nm; and the third length can vary from about 10 nm to 1000 nm and the third width can vary from about 10 nm to 500 nm.

In addition, the exemplary defect analysis segment 1100B can include at least one analysis segment 1160B without a potential defect therein and at least one other analysis segment 1160B' having at least one potential defect (LER defect) therein. The exemplary defect analysis segments (1160B, 1160B') can have a segment length and a segment width, and the segment length can vary from about 10 nm to 1000 nm and the segment width can vary from about 10 nm to 1000 nm. Alternatively, the exemplary defect analysis segments (1160B, 1160B') may have different shapes and/or different dimensions.

Figure 12:
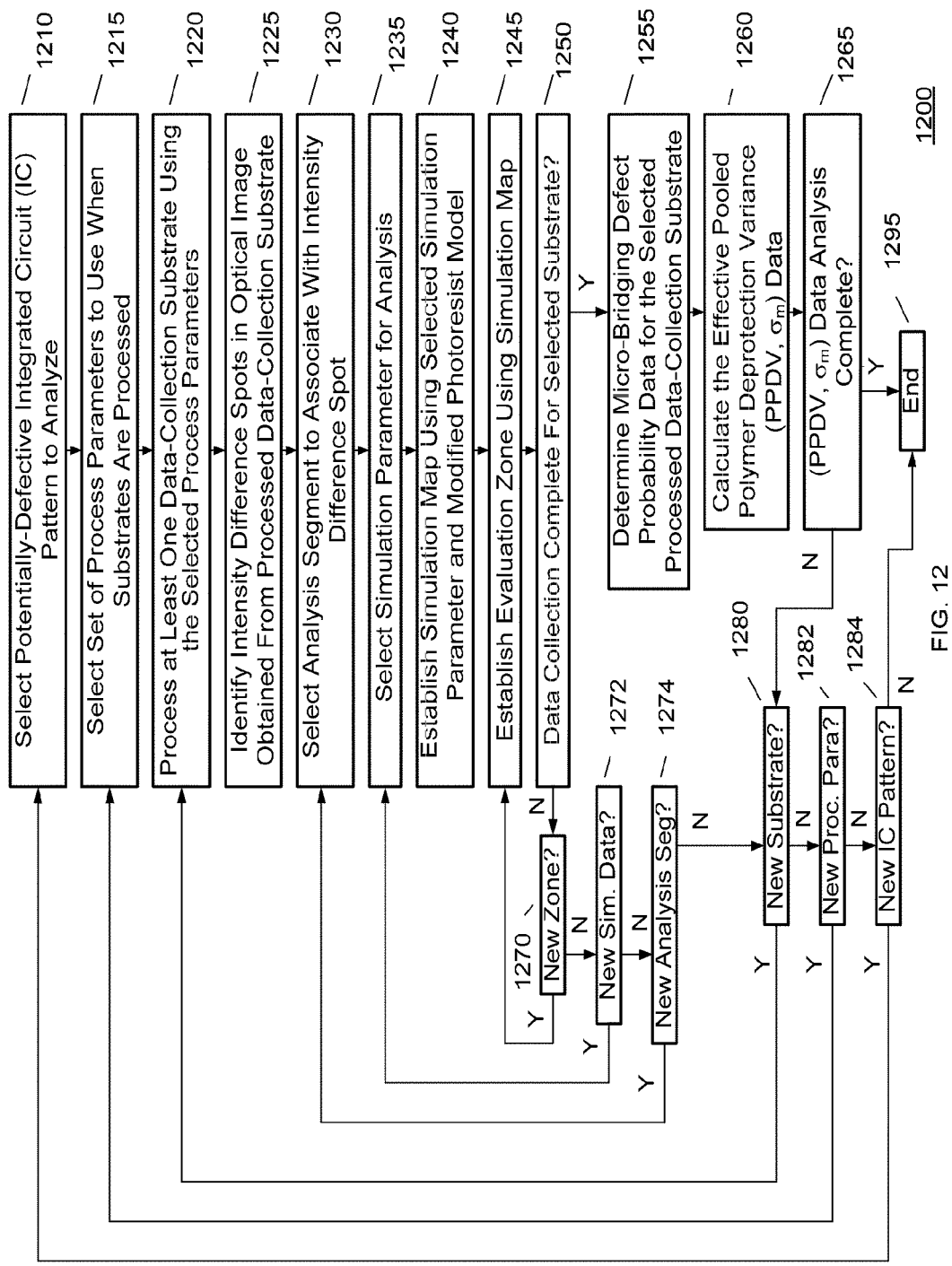
FIG. 12 shows an exemplary flow diagram of a procedure for determining Pooled Variance Data in accordance with embodiments of the invention.

FIG. 12 shows an exemplary flow diagram of a procedure for determining Pooled Variance Data in accordance with embodiments of the invention. In the illustrated embodiment, a procedure 1200 is shown for creating Pooled Polymer De-protection Variance (PPDV) data. Alternatively, other Pooled Variance Data and related models may be created, and other procedures having different steps may be used.

In 1210, the ($i^{th}$) potentially defective Integrated Circuit (IC) pattern can be selected from a group of (I) different potentially defective IC patterns (1010-1060, FIG. 10), and (I) different sets of PPDV data can be collected for the (I)

different potentially defective IC patterns (1010-1060, FIG. 10). For example, i=1, 2, . . . I, and (I) can be a integer that is greater than one. One or more of the controllers (114, 124, 134, 144, 154, 164, and 190) can be configured for selecting the ($i^{th}$) potentially defective IC pattern (1010-1060, FIG. 10), using historical data and/or the real-time data. In some examples, one or more of the potentially defective IC pattern (1010-1060) shown in FIG. 10 can be selected and used; in other examples, the potentially defective IC pattern (1105A and 1105B) shown in FIGS. 11A and 11B can be selected and used; in still other embodiments, the IC pattern (1305) shown in FIG. 13 can be used. Alternatively, other IC patterns may be used. In addition, one or more of the potentially defective IC patterns can be selected and/or analyzed to provide the micro-bridging data, LWR data, and/or LER data.

In 1215, the $[j^{th}]_i$ set of process parameters can be selected from a group of ($J_i$) different sets of process parameters, and ($J_i$) different data-collection process sequences can be established using the ($J_i$) different sets of process parameters. In some embodiments, one or more sets of design rules can be used to create the different sets of process parameters. In other embodiments, Design of Experiments (DOE) data can be used to create the different sets of process parameters. For example, (j=1, 2, . . . $J_i$), and ($J_i$) can be a integer that is greater than one. One or more of the controllers (114, 124, 134, 144, 154, 164, and 190) can be configured for selecting the $[j^{th}]_i$ set of process parameters using historical data and/or the real-time data. In some embodiments, the $[j^{th}]_i$ set of process parameters can be established and/or selected to provide the micro-bridging data, LWR data, and/or LER data for each of the (I) different potentially defective IC patterns. During various defect analysis procedures, the $[j^{th}]_i$ set of process parameters can include exposure-related process parameters, lithography-related process parameters, deposition-related process parameters, thermal-processing process parameters, etch-related process parameters, measurement-related process parameters, inspection-related process parameters, or tool-specific process parameters, or any combination thereof. In addition, the process parameters can include the illumination conditions, the dose data, focus data, time data, and location data.

In 1220, the $[k^{th}]_{ij}$ data-collection substrate ($S_{ijk}$) can be selected from a group of ($K_{ij}$) data-collection substrates, and the $[k^{th}]_{ij}$ data-collection substrate ($S_{ijk}$) can be processed using one or more of the $[j^{th}]_i$ set of process parameters. Before, during, and/or after processing, ($K_{ij}$) sets of defect data can be collected for the $[k^{th}]_{ij}$ data-collection substrates ($S_{ijk}$) that are processed. For example, ($k_{ij}$=1, 2, . . . $K_{ij}$), where i=1, 2, . . . I ; (j=1, 2, . . . $J_i$); and ($K_{ij}$) can be a integer that is greater than one. In other embodiments, the $[j^{th}]_i$ set of process parameters can be used to determine one or more mask creation procedures, one or more deposition procedures, one or more coating procedures, one or more thermal procedures, one or more implanting procedures, one or more doping procedures, one or more exposure procedures, one or more development procedures, one or more lithography-related procedures, one or more exposure-related procedures, one or more measurement procedures, one or more inspection procedures, one or more evaluation procedures, one or more simulation procedures, one or more prediction procedures, one or more rework procedures, one or more storage procedures, one or more transfer procedures, one or more modeling procedures, or one or more cleaning procedures, or any combination thereof.

The processing system 100 can be used to process the $[k^{th}]_{ij}$ data-collection substrates ($S_{ijk}$). In some embodiments, one or more data-collection substrates ($S_{ijk}$) can be received by one or more transfer subsystems 170, and the transfer subsystems 170 can transfer one or more of the substrates ($S_{ijk}$) to one or more of the subsystems (110, 120, 130, 140, and 150) in the processing system 100. One or more of the subsystems (110, 120, 130, 140, 150, 160, and 170) can be used one or more times during a processing sequence, and each subsystem can process one or more substrates ($S_{ijk}$) in series and/or parallel. In addition, the one or more processing elements (113, 123, 133, 143, 153, and 163) can be used one or more times during the processing sequence, and each processing element can process one or more substrates ($S_{ijk}$) in series and/or parallel. In other embodiments, the transfer subsystems 170 can be used to transfer one or more of the substrates ($S_{ijk}$) to one or more external subsystems (not shown).

In 1225, one or more optical images can be obtained from one or more of the processed data-collection substrates ($S_{ijk}$). In some embodiments, one or more of the processed data-collection substrates ($S_{ijk}$) can be received by one or more transfer subsystems 170, and the transfer subsystems 170 can transfer one or more of the one or more of the processed data-collection substrates ($S_{ijk}$) to the inspection subsystem 150, and/or the metrology subsystem 160 in the processing system 100. In other embodiments, optical data can be obtained from one or more external subsystems (not shown).

In some embodiments, a group of ($L_{ijk}$) intensity difference regions/spots can be identified in one or more of the optical images obtained from the processed data-collection substrates ($S_{ijk}$), and a group of ($L_{ijk}$) analysis segments can be established to analyze the group of ($L_{ijk}$) intensity difference regions/spots. In some examples, the intensity difference regions/spots can be classified as "high intensity regions/spots" having a high probability that a defective IC pattern can be associated therewith, or as "low intensity regions/spots" having a low probability that a defective IC pattern can be associated therewith. In other examples, the intensity difference spots can be classified as "high intensity dark fields" having a high probability that a defective IC pattern can be associated therewith, or as "low intensity dark fields" having a low probability that a defective IC pattern can be associated therewith. In addition, "hot-spots", or other optical differences can be used. In addition, the size, the shape, the intensity, and/or the location of the intensity spot used during calculations can be changed. For example, the user may choose to initially use traditional image threshold technique to identify the top hot spot locations in an IC design (e.g. top ten locations). Then, the statistical analysis techniques in this patent can be used to determine the actual fail rate for those spots, and this can provide a balance between traditional threshold and new hybrid analysis approaches.

In 1230, the $[l^{th}]_{ijk}$ analysis segment can be selected from the group of ($L_{ijk}$) analysis segments that have been identified on each of the processed data-collection substrates ($S_{ijk}$), and ($L_{ijk}$) different sets of defect data can be collected for the ($L_{ijk}$) analysis segments on each of the processed data-collection substrates ($S_{ijk}$). For example, ($l_{ijk}$=1, 2, . . . $L_{ijk}$), where (i=1, 2, . . . I); (j=1, 2, . . . $J_i$); (k=1, 2, . . . $K_{ij}$) and ($L_{ijk}$) can be a integer that is greater than or equal to one. In some embodiments, each processed data-collection substrates ($S_{ijk}$) that is being examined can be divided into ($L_{ijk}$) analysis segments, and the intensity difference spots in the optical images can be used to establish a number of analysis segments for each processed data-collection substrate ($S_{jk}$). In various examples, the analysis segments (1015-1065) shown in FIG. 10 can be used; or the analysis segments (1160A, 1160A') shown in FIG. 11A can be used; or the analysis segments (1160B, 1160B') shown in FIG. 11B can be used; or the analysis segments (1360, 1360') shown in FIG. 13 can be used. Alternatively, other analysis segments (not shown) may be used.

When one or more of the optical images include one or more "high intensity spots", the inventor believes that at least one of the ($L_{ijk}$)) analysis segments can be associated with the "high intensity spot" being examined and that the IC pattern (1110-1160) associated with the "high intensity spot" can have a defect therein. In addition, the defect probability ($P_{ijk}$) can be established at a high value for each of the group of ($L_{ijk}$) analysis segments that can be associated with the "high intensity spot" being examined. For example, the high value can vary from approximately 80% to approximately 100%. Alternatively, other high values can be used. Furthermore, the defect probability ($P_{ijk}$) can be established at a low value for each of the group of ($L_{ijk}$) analysis segments that is not associated with the "high intensity spot" being examined. For example, the low values can vary from approximately 0% to approximately 20%. Alternatively, other low values may be used.

In some examples, the ($i^{th}$) potentially defective IC pattern previously selected in step 1205 can be associated with one of more of the intensity differences previously selected in one or more of the optical images. For example, the IC pattern (1305) shown in FIG. 13 can be used to obtain PPDV data, micro-bridging data, LER data, and/or LWR data. In addition, one or more of the other IC patterns (1010-1060) or (1105A, 1105B) may be used.

In 1235, the $[m^{th}]_{ijkl}$ simulation parameter can be selected from a group of ($M_{ijkl}$) simulation parameters for each of the selected $[l^{th}]_{ijk}$ analysis segment on each of the processed data-collection substrates ($S_{ijk}$), and ($M_{ijkl}$) sets of simulation data can be collected for each of the ($L_{ijk}$) analysis segments on each of the processed data-collection substrates ($S_{ijk}$). In various examples, ($m_{ijkl}$=1, 2, ... $M_{ijkl}$); (i=1, 2, ... I); (j=1, 2, ... $J_i$); (k=1, 2, ... $K_{ij}$); ($l_{ijk}$=1, 2, ... $L_{ijk}$) and) can be a integer that is greater than one. The inventor has developed modified photoresist models that can use one or more of the ($M_{ijkl}$) simulation parameters to create one or more simulation data maps (1340) having a plurality of contours (1345) therein. The inventor believes that the group of $M_{ijkl}$) simulation parameters can include blocked polymer concentration data, de-blocked polymer concentration data, polymer de-protection concentration data, protected polymer concentration data, acid diffusion data, base diffusion data, NILS data, blocked chromophore data, or de-blocked chromophore data, or any combination thereof.

In 1240, the selected $[m^{th}]_{ijkl}$ simulation parameter can be used with a modified photoresist model to create the $[m^{th}]_{ijkl}$ simulation data map (1340). In some embodiments, a group of ($M_{ijkl}$) simulation maps can be created for each of the selected $[l^{th}]_{ijk}$ analysis segments on each of the processed data-collection substrates ($S_{ijk}$) using the group of ($M_{ijkl}$) simulation parameters. In addition, ($M_{ijkl}$) sets of simulation data can be collected, verified, and/or stored for each of the ($L_{ijk}$) analysis segments on each of the processed data-collection substrates ($S_{ijk}$).

In other embodiments, other simulation models can be created that quantify one or more of the relationships between lithography contrast data and micro-bridging defect generation. These lithography simulation models can be calibrated from a specific set of processes and can be used to optimize IC design layouts and mask creation rules that can be used to produce the highest yield. For example, multi-input multi-output (MIMO) models can be established and/or used.

In 1245, when the $[n^{th}]_{ijklm}$ evaluation zone is selected, the $[n^{th}]_{ijklm}$ set of Analysis Variable Data ($[AVD_n^{th}]_{ijklm}$) can be determined, where (i=1, 2, ... I) for each different IC pattern examined; (j=1, 2, ... $J_i$) for each different set of process parameters selected during the examination; (k=1, 2, ... $K_{ij}$) for each different substrate that is selected during the examination; ($l_{ijk}$=1, 2, ... $L_{ijk}$) for each different analysis segment on the selected substrate; ($m_{ijkl}$=1, 2, ... $M_{ijkl}$) for each different simulation parameter used for each simulation data map (1340) on the selected substrate; and ($[n^{th}]_{ijklm}$=1, 2, ... $[N]_{ijklm}$) for each different (selected) evaluation zone associated with each simulation map associated with each analysis segment on the selected substrate; and ($[N]_{ijklm}$) can be a integer that is greater than one. For example, each different evaluation zone can have a different shape, a different size, a different length, a different width, a different thickness, a different area, and/or a different volume associated therewith. In some examples, the evaluation zone can be varied to improve the speed and/or accuracy of the calculations. A smaller size and/or a smaller spacing between each evaluation zone can provide more accurate defect data in a longer calculation time, and a larger size and/or a smaller spacing between each evaluation zone may provide less accurate defect data in a shorter calculation time. In some embodiments, the shape, size and the location of each of the evaluation zones can be established based on the 32 nm node. In other embodiments, the shape, size and the location of each of the evaluation zones can be established based on smaller devices.

In some embodiments, one or more sets of Analysis Variable Data ($[AVD]_{ijklmn}$) can be collected for each of the ($[N]_{ijklm}$) evaluation zones on each of the processed data-collection substrates ($S_{ijk}$). For example, the Analysis Variable Data ($[AVD]_{ijklmn}$) can be stored using multi-level tables, where (i=1, 2, ... I) for each different IC pattern examined; (j=1, 2, ... $J_i$) for each different set of process parameters (design rules) selected during the examination; (k=1, 2, ... $K_{ij}$) for each different substrate that is selected during the examination; ($l_{ijk}$=1, 2, ... $L_{ijk}$) for each different analysis segment on the selected substrate; ($m_{ijkl}$=1, 2, ... $M_{ijkl}$) for each different simulation parameter used to create each simulation data map (1340) to associate with each analysis segment on the selected substrate; ($[n^{th}]_{ijklm}$=1, 2, ... $[N]_{ijklm}$) for each different evaluation zone associated with each simulation parameter used for each analysis segment (1360) on the selected substrate; and ($[N]_{ijklm}$) can be a integer that is greater than one. In other embodiments, the Analysis Variable Data can be configured differently when one or more of the subscripts can be equal to zero.

Figure 13:
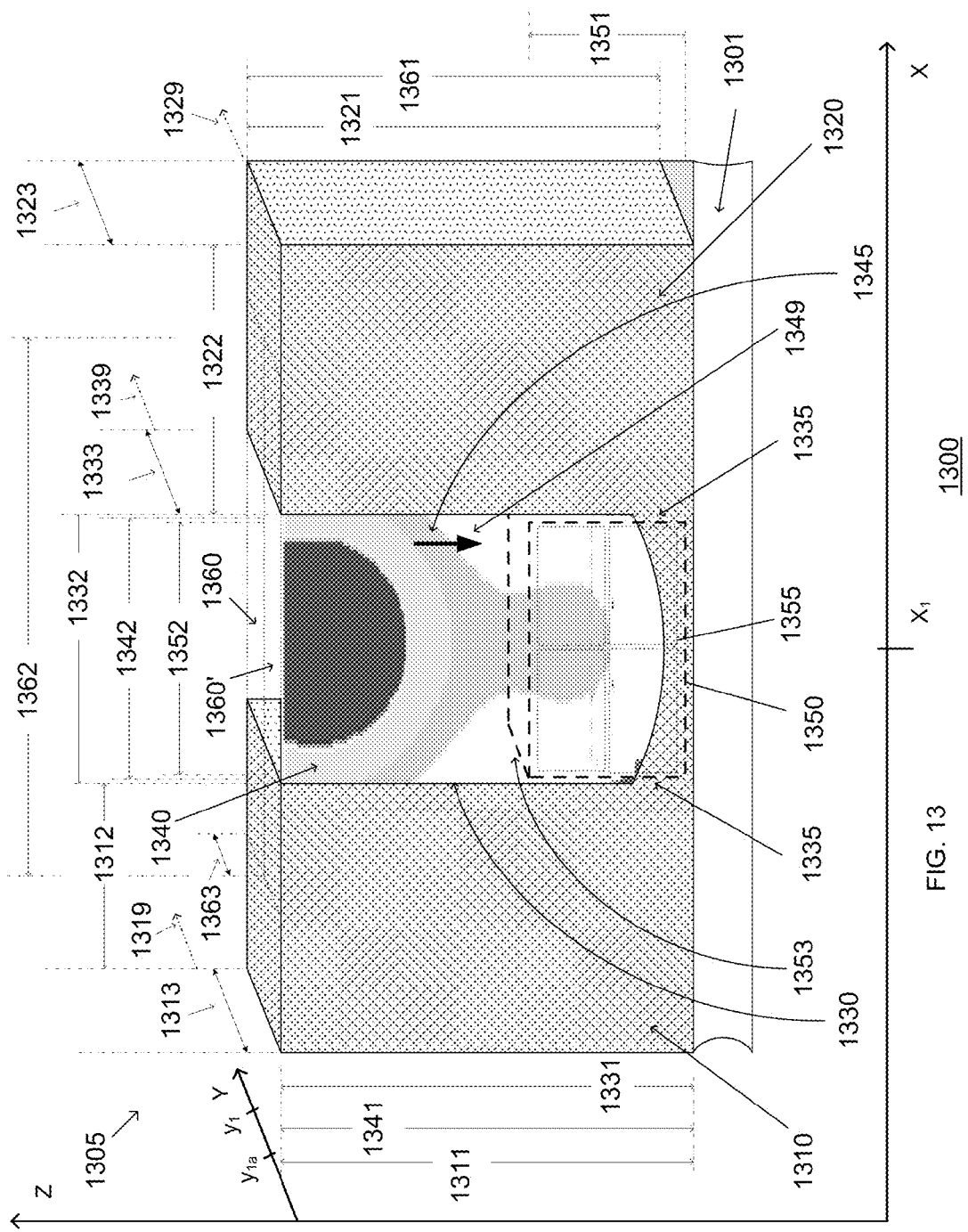
FIG. 13 illustrates a first exemplary segment of an exemplary defect analysis map in accordance with embodiments of the invention.

In some embodiments, the inventor believes the Analysis Variable Data can be determined using an average value $\{<([AVD]_{ijklmn})>\}$. When the IC pattern (1305) shown in FIG. 13 is being examined, the values associated with the contours (1345) in the evaluation zone 1350 can be averaged when calculating Analysis Variable Data averages. In addition, the values associated with the contours (1345) in each of the pixels 1355 can be averaged and summed when calculating Analysis Variable Data averages. For example, when the ($[m^{th}]_{ijkl}$) simulation parameter and associated simulation data map (1340) include blocked polymer concentration data, the $\{<([AVD]_{ijklmn})>\}$ can be the averaged blocked polymer concentration data in the evaluation zone 1350; $[(\sigma_{ijklmn})^{th}]$ can be the standard deviation of the blocked polymer concentration data; and $(d([m^{th}]_{ijkl})/(dx)$ can be the simulated blocked polymer concentration gradient at one of the line edges. In other examples, when the ($[m^{th}]_{ijkl}$) simulation parameter and associated simulation data map (1340) include de-blocked polymer concentration data, the $\{<([AVD]_{ijklmn})>\}$ can be the averaged de-blocked polymer concentration data in the evaluation zone 1350; $[(\sigma_{ijklmn})^{th}]$ can be the standard deviation of the blocked polymer concentration data; and $(d([m^{th}]_{ijkl}))/(dx)$ can be the simulated de-blocked polymer concentration gradient at one of the line edges. In additional examples, when the $([m^{th}]_{ijkl})$ simulation parameter and associated simulation data map (1340) include acid or base diffusion data, the $\{<([AVD]_{ijklmn})>\}$ can be the averaged acid or base diffusion data in the evaluation zone 1350; $[(\sigma_{ijklmn})^{th}]$ can be the standard deviation of the acid or base diffusion data; and $(\sigma([m^{th}]_{ijkl}))/(dx)$ can be the simulated acid or base diffusion gradient at one of the line edges. In some other examples, when the $([m^{th}]_{ijkl})$ simulation parameter and associated simulation data map (1340) include acid or base concentration data, the $\{<([AVD]_{ijklmn})>\}$ can be the averaged acid or base concentration data in the evaluation zone 1350; $[(\sigma_{ijklmn})^{th}]$ can be the standard deviation of the acid or base concentration data; and $(d([m^{th}]_{ijkl})/(dx)$ can be the simulated acid or base concentration gradient at one of the line edges. In still other examples, when the $([m^{th}]_{ijkl})$ simulation parameter and associated simulation data map (1340) include NILS data, the $\{<([AVD]_{ijklmn})>\}$ can be the averaged NILS data in the evaluation zone 1350; $[(\sigma_{ijklmn})^{th}]$ can be the standard deviation of the NILS data; and $(d([m^{th}]_{ijkl}))/(dx)$ can be the simulated NILS gradient at one of the line edges.

In some embodiments, one or more three-dimensional average values $\{<([AVD]_{ijklmn})>_{Vol}\}$ can be calculated using different volumes for each of the $([N]_{ijklm})$ evaluation zones (1350) and/or the three-dimensional analysis segments (1360) on each of the processed data-collection substrates.

During various procedures, one or more values and/or limits can be established for the calculated Analysis Variable Data ($[AVD]_{ijklmn}$), and the calculated ($[AVD]_{ijklmn}$) can be compared to the one or more limits to improve the accuracy of the calculations. In addition, one or more limits can be used to determine when and where to store the calculated ($[AVD]_{ijklmn}$). In addition, one or more of the controllers (114, 124, 134, 144, 154, 164, and 190) can be configured for calculating the ($[AVD]_{ijklmn}$) and for determining when and where to store the calculated ($[AVD]_{ijklmn}$).

In 1250, a query can be performed to determine if substantially all of the required data has been obtained for the $([k^{th}]_{ij})$ processed data-collection substrate $(S_{ijk})$ that was selected during the defective IC pattern analysis procedures. When substantially all of the required data has been obtained for the $([k^{th}]_{ij})$ processed data-collection substrate $(S_{ijk})$, procedure 1200 can branch to step 1255 and continue as shown in FIG. 12. When some of the required data has not been obtained for the $([k^{th}]_{ij})$ (selected) processed data-collection substrate $(S_{ijk})$, procedure 1200 can branch to step 1270 and continue as shown in FIG. 12.

In 1255, probability data can be calculated for the $([k^{th}]_{ij})$ processed data-collection substrate $(S_{ijk})$ when substantially all of the required data has been obtained for the $([k^{th}]_{ij})$ processed data-collection substrate $(S_{ijk})$ that was selected during the micro-bridging defect data-collection procedures.

In some embodiments, a binomial distribution can be used when there are only two possible results for the probability values. For example, the two possible results can be that a defective IC pattern has occurred in the $[l^{th}]_{ijk}$ analysis segment (1360') being analyzed, or a defective IC pattern has not occurred in the $[l^{th}]_{ijk}$ analysis segment (1360) being analyzed. The probably of (y) defective IC patterns in the group of $(L_{ijk})$ analysis segments selected for examination can be determined as shown in equation (1) where p is the probability that the $[l^{th}]_{ijk}$ analysis segment includes a defective IC pattern, and q is the probability that the $[l^{th}]_{ijk}$ analysis segment does not include a defective IC pattern.

$$P_{ijk}(y) = \frac{(L_{ijk})!}{y!(L_{ijk}-y)!} p^y q^{(L_{ijk}-y)}, \quad y = 0, 1, 2, \ldots, L_{ijk} \quad (1)$$

where (i=1, 2, ... I); (j=1, 2, ... $J_i$); (k=1, 2, ... $K_{ij}$) and $(L_{ijk})$ can be a integer that is greater than one. In general, the mean value $\eta_y$ of y can be calculated using $\eta_y = (L_{ijk})\bar{p}$ and the variance of y can be calculated using $\sigma_y^2 = (L_{ijk})/\overline{pq} + (L_{ijk})(L_{ijk}-1)\sigma_p^2$.

When the probability is small and the number of examined segments $(L_{ijk})$ is large, a Poisson distribution as shown in equation (2) can be used.

$$P_{ijk}(y) = \frac{e^{-(L_{ijk})p}((L_{ijk})p)^y}{y!} = \frac{e^{-\eta}(\eta)^y}{y!}, \quad y = 0, 1, 2, \ldots, n \quad (2)$$

In addition, the inventor has established a new set of statistically-based relationships that can be use to equate experimental contrast "hot-spot" data from one or more lithography-related process sequences to micro-bridging problems and/or LER problems. In some embodiments, the inventor believes that the following generalized relationship can be used to simplify a defect determining procedure:

$$[\{(\text{Defective\_IC\_Pattern\_Data})_m\}^{th}]_{ijkl} = [\{P_m(y)\}^{th}]_{ijkl} = \frac{[(\sigma_m)^{th}]_{ijkl}}{\left(\sqrt{\{<([m^{th}]_{ijkl})>\}}\right)}$$

where:
the $[\{(\text{Defective\_IC\_Pattern\_Data})_m\}^{th}]_{ijkl}$ is experimentally determined using the $([k^{th}]_{ij})$ processed data-collection substrate $(S_{ijk})$ that was selected and the $([m^{th}]_{ijkl})$ simulation parameter that was used during the simulation procedures;

$([m^{th}]_{ijkl})$ can be one of the different simulation parameters that can be established for each of the different evaluation zones established when the $([k^{th}]_{ij})$ (selected) processed data-collection substrate $(S_{ijk})$ was processed using the $(J_i)$ set of process parameters and when the $[i^{th}]$ potentially defective IC pattern is being examined;

$\{<([m^{th}]_{ijkl})>\}$ can be the average value for the $([m^{th}]_{ijkl})$ analysis variable that was established for each of the different evaluation zones established when the $([k^{th}]_{ij})$ (selected) processed data-collection substrate $(S_{ijk})$ was processed using the $(J_i)$ set of process parameters and when the $[i^{th}]$ potentially defective IC pattern is being examined; and $[(\sigma_m)^{th}]_{ijkl}$ can be the standard deviation value for the $([m^{th}]_{ijkl})$ analysis variable that was established for each of the different evaluation zones established when the $([k^{th}]_{ij})$ processed data-collection substrate $(S_{ijk})$ was processed using the $(J_i)$ set of process parameters and when the $[i^{th}]$ potentially defective IC pattern is being examined.

Rearranging the terms in equation (1) can yield equation (3) shown as the following generalized relationship:

$$[(\sigma_m)^{th}]_{ijkl} = [\sqrt{\{<([m^{th}]_{ijkl})>\}}] * [\{P_m(y)\}^{th}]_{ijkl} \quad (3)$$

The inventor believes that one or more three-dimensional average values can be calculated, and the inventor believes that the generalized equation (4) can be used:

$$[(\sigma_m)^{th}]_{ijkl} = [\sqrt{\{<([m^{th}]_{ijkl})>\}_{Volume}}] * [\{P_m(y)\}^{th}]_{ijkl} \quad (4)$$

In some examples, when (i=1), the first potentially-defective IC pattern (1305) as shown in FIG. 13 can be examined; when (j=1), the first set of process parameters (design rules) can be used; when (k=1), the first data-collection substrate is being examined; when (l=1), the first analysis segment (1360) as shown in FIG. 13 can be used; when (m=1), the first simulation data map (1340) and the associated first contours (1345) can be used; and when (n=1), the first evaluation zone (1350) as shown in FIG. 13 can be used. In other examples, when (i>1), additional potentially-defective IC patterns (1010-1060) as shown in FIG. 10 can be examined.

When the probability data has been calculated for the $([k^{th}]_{ij})$ processed data-collection substrate $(S_{ijk})$, procedure 1200 can proceed to step 1260.

During various procedures, one or more values and/or limits can be established for the calculated standard deviation values $[(\sigma_m)^{th}]_{ijkl}$, and the calculated standard deviation values $[(\sigma_m)^{th}]_{ijkl}$ can be compared to the one or more limits to improve the accuracy of the calculations. In addition, one or more limits can be used to determine when and where to store the calculated standard deviation values $[(\sigma_m)^{th}]_{ijkl}$. In addition, one or more of the controllers (114, 124, 134, 144, 154, 164, and 190) can be configured for calculating the standard deviation values $[(\sigma_m)^{th}]_{ijkl}$ and for determining when and where to store the calculated standard deviation values $[(\sigma_m)^{th}]_{ijkl}$.

In 1260, Pooled Polymer De-protection Variance data and/or limits can be calculated and/or updated. In some embodiments, the Pooled Polymer De-protection Variance (PPDV, $\sigma_m$) data can be defined as a function of $(\sigma_m)$, and $(\sigma_m)$ can be defined as the standard deviation of the simulation parameter (m) being used.

The inventor has established a new set of statistically-based relationships that can be use to equate experimental contrast "hot-spot" data from one or more lithography-related process sequences to micro-bridging problems, LWR problems, and/or LER problems. In some embodiments, the inventor believes that the following generalized relationship can be used to simplify a defect determining procedure:

$$\{PPDV, [(\sigma_m)^{th}]_{ijkl}\} = \sum_{m=1}^{M_{ijkl}} [(\sigma_m)^{th}]_{ijkl}$$
$$= \sum_{m=1}^{M_{ijkl}} \left[\sqrt{\{\langle ([m^{th}]_{ijkl})\rangle\}}\right] * [\{P_m(y)\}^{th}]_{ijkl}$$

where $\{PPDV, [(\sigma_m)^{th}]_{ijkl}\}$ can be defined as the effective Pooled Polymer De-protection Variance data when (i=1, 2, . . . I); (j=1, 2, . . . $J_i$); (k=1, 2, . . . $K_{ij}$); and (l=1, 2, . . . $L_{ijk}$);

(m) can be defined as the simulation parameter used during the data-collection;

$\{<([m^{th}]_{ijkl})>\}$ can be defined as the average value for the $([m^{th}]_{ijkl})$ simulation parameter and associated simulation data map (1340) that were established for each of the different evaluation zones established when the $([k^{th}]_{ij})$, (selected) processed data-collection substrate $(S_{ijk})$ was processed using the $(J_i)$ set of process parameters and when the $[i^{th}]$ potentially defective IC pattern is being examined;

$[(\sigma_m)^{th}]_{ijkl}$ can be defined as the standard deviation value for the $([m^{th}]_{ijkl})$ simulation parameter and associated simulation data map 1340 that was established for each of the different evaluation zones established when the $([k^{th}]_{ij})$ processed data-collection substrate $(S_{ijk})$ was processed using the $(J_i)$ set of process parameters and when the $[i^{th}]$ potentially defective IC pattern is being examined; and $[\{P_m(y)\}^{th}]_{ijkl} = [\{(Defective\_IC\_Pattern\_Data)_m\}^{th}]_{ijkl}$ can be defined as the experimentally determined defect data determined for each of the $([M]_{ijkl})$ simulation parameters.

When one or more three-dimensional average values $\{<([m^{th}]_{ijkl})>_{Volume}\}$ are used, the different volume values can be calculated using different areas for each of the $([N]_{ijklm})$ evaluation zones on each of the processed data-collection substrates and one or more thicknesses for one or more different layers. In addition, the pooled variance data can be calculated using:

$$(PPDV, \sigma_m) = \sum_{m=1}^{M_{ijkl}} [(\sigma_m)^{th}]_{ijkl}$$
$$= \sum_{m=1}^{M_{ijkl}} \left[\sqrt{\{\langle([m^{th}]_{ijkl})\rangle\}}_{Volume}\right] * [\{P_m(y)\}^{th}]_{ijkl}$$

In addition, the inventor believes that LER data can be determined using:

$$LER \propto \frac{[(\sigma_m)^{th}]_{ijkl}}{d([m^{th}]_{ijkl})/dx}$$

(m) can be defined as the simulation parameter used during the data-collection;

$\{<([m^{th}]_{ijkl})>\}$ can be defined as the average value for the $([^{th}]_{ijkl})$ simulation parameter that was established for each of the different evaluation zones established when the $([k^{th}]_{ij})$ (selected) processed data-collection substrate $(S_{ijk})$ was processed using the $(J_i)$ set of process parameters and when the $[i^{th}]$ potentially defective IC pattern is being examined;

$([\sigma_m)^{th}]_{ijkl}$ can be defined as the standard deviation value for the $([m^{th}]_{ijkl})$ simulation parameter that was established for each of the different evaluation zones established when the $([k^{th}]_{ij})$ processed data-collection substrate $(S_{ijk})$ was processed using the $(J_i)$ set of process parameters and when the $[i^{th}]$ potentially defective IC pattern is being examined; and $d([m^{th}]_{ijkl})/dx$ can be defined as a gradient value (in the x-direction) for each of the $([M]_{ijkl})$ simulation parameters at the line edge.

In 1265, a query can be performed to determine if the $\{PPDV, [(\sigma_m)^{th}]_{ijkl}\}$ data analysis procedure has been completed or if additional $\{PPDV, [(\sigma_m)^{th}]_{ijkl}\}$ data can be obtained. When the $\{PPDV, [(\sigma_m)^{th}]_{ijkl}\}$ data analysis procedure has been completed, procedure 1200 can branch to step 1295 and end as shown in FIG. 12. When the $\{PPDV, [(\sigma_m)^{th}]_{ijkl}\}$ data analysis procedure has not been completed, procedure 1200 can branch to step 1280, and procedure 1200 can continue as shown in FIG. 12.

In 1270, a query can be performed to determine if a new evaluation zone is required. Procedure 1200 can branch to 1272 when a new evaluation zone is not required or when the number of evaluation zones that have been used exceeds $([N]_{ijklm})$. When a new evaluation zone is not required, the Analysis Variable Data $([AVD]_{ijklm})$ and/or the Defect Data $([DD]_{ijklmn})$ associated with the $[n^{th}]_{ijklm}$ evaluation zone can be stored as real-time and/or historical data. For example, the Defect Data $([DD]_{ijklmn})$ can include micro-bridging defect data, LER defect data, and/or LWR defect data. When a new evaluation zone is required, the $[(n+1)^{th}]_{ijklm}$ evaluation zone can be established and procedure 1200 can branch to 1245, and procedure 1200 can continue as shown in FIG. 12, if the total number of evaluation zones does not exceed ($[N]_{ijklm}$). For example, the $[(n+1)^{th}]_{ijklm}$ evaluation zone can be used when procedure 1200 continues as shown in FIG. 12. When the $[(n+1)^{th}]_{ijklm}$ evaluation zone (1350) is established, the calculation techniques can be changed, and the size, shape, number, and/or location of the evaluation zone can be changed. In addition, the size, shape, number, and/or location of the pixels (1355) used during calculations can be changed.

In 1272, a query can be performed to determine if new simulation data is required. Procedure 1200 can branch to 1274 when new simulation data is not required or when the number of simulation parameter that have been used exceeds ($[M]_{ijkl}$). When new simulation data is required, the $[(m+1)^{th}]_{ijkl}$ simulation parameter can be established, and procedure 1200 can branch to 1235, and procedure 1200 can continue as shown in FIG. 12, if the total number of simulation parameters does not exceed ($[M]_{ijkl}$). For example, the $[(m+1)^{th}]_{ijkl}$ simulation parameter can be used when procedure 1200 continues as shown in FIG. 12, and a new simulation data map (1340) can be created. When the $[(m+1)^{th}]_{ijkl}$ simulation parameter is established, the size, shape, number, and/or location of the simulation data map (1340) can change, and/or the photoresist model can be changed. In addition, the size, shape, number, and/or location of the contours (1345) used during calculations can be changed. When a new photoresist model is established, one or more the resist parameters, one or more the developer parameters, one or more the acid parameters number, and/or one or more the polymer parameters can change. In addition, the size, shape, and/or location of the developed photoresist profile used during calculations can be changed. When a new simulation parameter is established, one or more the resist parameters, one or more the developer parameters, one or more the acid parameters number, and/or one or more the polymer parameters can change. In addition, the size, shape, and/or location of the simulation data map used during calculations can be changed.

In 1274, a query can be performed to determine if a new analysis segment is required. Procedure 1200 can branch to 1280 when a new analysis segment is not required or when the number of analysis segments exceeds ($[L]_{ijk}$). When a new analysis segment is required, the $[(l+1)^{th}]_{ijk}$ analysis segment can be established and procedure 1200 can branch to 1230 and can continue as shown in FIG. 12, if the total number of analysis segments does not exceed ($[L]_{ijk}$). For example, the $[(l+1)^{th}]_{ijk}$ analysis segment can be used when procedure 1200 continues as shown in FIG. 12. When the $[(l+1)^{th}]_{ijk}$ analysis segment is established, the size, shape, number, and/or location of the simulation data map can change.

In 1280, a query can be performed to determine if a new data-collection substrate is required. Procedure 1200 can branch to 1282 when a new data-collection substrate is not required or when the number of data-collection substrate that have been examined exceeds ($[K]_{ij}$). When a new data-collection substrate is required, the $[(k+1)^{th}]_{ij}$ data-collection substrate can be selected, procedure 1200 can branch to 1230, and procedure 1200 can continue as shown in FIG. 12 using the newly selected substrate, if the total number of data-collection substrates does not exceed ($[K]_{ij}$). For example, the $[(k+1)^{th}]_{ij}$ data-collection substrate can be used when procedure 1200 continues as shown in FIG. 12. When the $[(k+1)^{th}]_{ij}$ data-collection substrate is selected, one or more of the test substrates, one or more of the inspection substrates, one or more of the production substrates, one or more of the experimental substrates, one or more of the send-ahead substrates, and/or one or more of the pre-production substrates can be selected. In addition, the number of substrates used during calculations can be changed.

In 1282, a query can be performed to determine if new process parameters or new design rules are required. Procedure 1200 can branch to 1284 when new process parameters and/or new design rules are not required, or when the number of new process parameters exceeds ($[J]_i$). When new process parameters and/or new design rules are required, the $[(j+1)^{th}]_i$ set of process parameters can be selected, procedure 1200 can branch to 1215, and procedure 1200 can continue as shown in FIG. 12, if the total number of sets of process parameters does not exceed ($[J]_i$). For example, the $[(j+1)^{th}]_i$ set of process parameters can be used when procedure 1200 continues as shown in FIG. 12. When the $[(j+1)^{th}]_i$ set of process parameters are selected, the new process parameters can include one or more lithography-related parameters, one or more exposure-related parameters, one or more thermal parameters, and/or one or more developing parameters. In addition, the number of process parameters used during calculations can be changed.

In 1284, a query can be performed to determine if a new potentially-defective IC pattern is required. Procedure 1200 can branch to 1295 when a new potentially-defective IC pattern is not required or when the number of new potentially-defective IC patterns exceeds ($[J]_i$). When a new potentially-defective IC pattern is required, the $[(j+1)^{th}]_i$ potentially-defective IC pattern can be selected and procedure 1200 can branch to 1210 and can continue as shown in FIG. 12, if the total number of potentially-defective IC patterns does not exceed ($[J]_i$). For example, the $[(j+1)^{th}]_i$ potentially-defective IC pattern is can be used when procedure 1200 continues as shown in FIG. 12. When the $[(j+1)^{th}]_i$ potentially-defective IC pattern is selected, the new potentially-defective IC pattern can include one of the potentially-defective IC pattern (1110-1160) shown in FIG. 11. In addition, other potentially-defective IC patterns (not shown) can be used.

In some embodiments, profile data, sidewall angle (SWA) data can be collected for the one or more of the potentially defective IC patterns (1305) using different sets of process parameters. For example, Design of Experiments (DOE) techniques can be used to obtain the LER data. In other embodiments, additional defect data and/or LER data can be collected for the another potentially defective IC pattern (not shown).

In various embodiments, experimental micro-bridging data can be collected for one or more design features on a large IC array that includes many different potential defects. For example, shape and size can be used select the design feature to examine. When micro-bridging data is used the micro-bridging data can be represented as the defect density, and the defect density can be characterized the number of defects in a given area, the number of defects in a segment run length, or other criteria. Micro-bridging data can be collected as a function of illumination condition, dose, focus, developing data, thermal data, or photoresist data, or any combination thereof. The collected micro-bridging data can be plotted using one or more graphs, and the graphs can include defects versus NILS, defects versus de-protection gradient, defects versus acid density, or defects versus PPDV, or any combination thereof.

In 1195, procedure 1100 can end.

In some embodiments, a binomial distribution can be used when there are only two results (e.g., a micro-bridging defect occurs in the examined segment, or a micro-bridging defect does not occur in the examined segment) to examine.

The inventor believes that when the collected defect data can be described using a normal distribution, the additive property of the normal distribution can allow defect data from various sources to be combined (added) to obtain one or more statistically related sets of micro-bridging data. For example, when two independent normal distribution with zero means and variances ($\sigma_1^2$, $\sigma_2^2$) are summed, the sum is also a normal distribution with zero mean and variance ($\sigma_1^2$, $\sigma_2^2$). In addition, the normal distributions can be partitioned into subsets. These properties can also be used to compare normal distributions that are generated using different defect models that use different lithography-related parameters.

The inventor also believes that when the pooled (collected) defect data can be described using a binomial distribution, the additive property of the binomial distribution can allow defect data from various sources to be pooled (combined and/or added) to obtain one or more statistically related sets of micro-bridging data. For example, when two independent binomial distributions with mean values $\eta_1 = n_1 p_1$) and ($\eta_2 = n_2 p_2$) variances ($\sigma_2^2 = n_1 p_1 q_1$) and ($\sigma_2^2 = n_2 p_2 q_2$) are summed, the sum is also a binomial distribution with mean ($\eta_1 + \eta_2$) and variance ($\sigma_1^2 + \sigma_2^2$). In addition, the binomial distributions can be partitioned into subsets. These properties can also be used to compare normal distributions that are generated using different defect models that use different lithography-related parameters.

The inventor also believes that when the pooled (collected) defect data can be described using a Poisson distribution, the additive property of the Poisson distribution can allow defect data from various sources to be pooled (combined and/or added) to obtain one or more statistically related sets of micro-bridging data. For example, when two independent Poisson distributions with mean values ($\eta_1$) and ($\eta_2$) and variances ($\sigma_1^2 = \eta_1$) and ($\sigma_2^2 = \eta_2$) are summed, the sum is also a Poisson distribution with mean ($\eta_1 + \eta_2$) and variance ($\sigma_2 + \eta_2^2) = (\eta_1 + \eta_2$). In addition, the Poisson distributions can be partitioned into subsets. These properties can also be used to compare Poisson distributions that are generated using different defect models that use different lithography-related parameters.

When the Poisson function is used to analyze the bridging defects, the defects being examined should be randomly distributed within the examined segments of the substrate. When p is small and n is large, the binomial distribution can be approximated using the Poisson distribution.

Recall that the deviation $[(y-\eta)]_k$ is a measure of how far an observation $[y]_k$ is from the mean value $[\eta]_k$, and the variance $[\sigma^2]_k$ is the mean value of the square of these deviations taken over the entire population $[N]_k$, and (k) different sets of data from the (k) different processing sequences can be used.

$$[\sigma^2]_k = [E(y-\eta)^2]_k = \left[\frac{\sum (y-\eta)^2}{N}\right]_k$$

where k=(1, 2 . . . ).

In addition, the standard deviation $[\sigma]_k$ is a measure of the spread of the population $[N]_k$:

$$[\sigma]_k = \left[\sqrt{E(y-\eta)^2}\right]_k = \left[\sqrt{\frac{\sum (y-\eta)^2}{N}}\right]_k$$

where k=(1, 2 . . . ).

Further, note that the Poisson distribution depends only on the mean value $[\eta]_k$, and the mean value $[\eta]_k$ can be a positive real number equal to the expected number of micro-bridging defects on a substrate, or on a portion of a substrate that can be associated with the ($k^{th}$) set of data from the ($k^{th}$) processing sequences and/or the ($k^{th}$) set of processing parameters. In addition, when a Poisson distribution is used the variance $[\sigma^2]_k$ is equal to the mean value $[\eta]_k$. When a Poisson distribution is used, the probability of a substrate, or a portion of a substrate $[(i)]_k$ having $[y_i]_k$ micro-bridging defects can be as follows:

$$\left[P(y_i) = \frac{\eta_i^{y_i} e^{-\eta_i}}{y_i!}\right]_k$$

where $y_i$=0, 1, 2 . . . ; where k=(1, 2 . . . ); and where $y_i$=a random variable representing the number of defects or the defect rate.

In other embodiments, the pooled variance can be calculated as shown below:

$$(\sigma_p^2) = \frac{(n_1-1)*\sigma_1^2 + (n_2-1)*\sigma_2^2 + \ldots + (n_k-1)*\sigma_k^2}{((n_1-1) + (n_2-1) + \ldots + (n_k-1))}$$

where ($n_1, n_2, \ldots n_k$) are the sizes for the defect data subsets at each level.

One or more of the subsystems (110, 120, 130, 140, 150, and 160) and/or one or more of the controllers (114, 124, 134, 144, 154, 164, and 190) can provide (k) sets of defect data, (k) sets of processing data, and/or (k) sets of evaluation data for one or more substrates during one or more of the (k) processing sequences. One or more of the subsystems (110, 120, 130, 140, 150, and 160) and/or one or more of the controllers (114, 124, 134, 144, 154, 164, and 190) can be used to determine resist data, thermal data, resist and/or substrate thickness data, resist and/or substrate uniformity data, curvature data, developing data, pattern data, or error data, any combination thereof. One or more of the controllers (114, 124, 134, 144, 154, 164, and 190) can perform evaluation procedures to determine if the circuit design is correct or if a design rule change is required. For example, one or more of the evaluation procedures can provide defect data that can include micro-bridging data for photoresist patterns, features, and/or structures for different sites, substrates, and/or lots.

When a calibrated photoresist model is required, a resist model can be generated from either standard resist/etch OPC pattern data or other experimental techniques (literature reference) to obtain the highest level of accuracy. The resist model can be used to generate the average de-protection profile (or acid/NILS profile) within a defined 2D x-section slice, 3D volume, or 2D top down view defined by the user. A good resist model is sensitive to changes in dose, focus, bake conditions (i.e. acid diffusion), etc. In other embodiment, the resist "response" can be approximated with either standard resist/etch OPC data (substrates exposed with different focus, dose, bake conditions, etc) or a lump parameter model to obtain less accurate results at a faster speed. In addition, when resist information is not available, a pure optical parameter, such as NILS, may be used to relate to the experimental fail rate data. This procedure may not be as accurate as the previously described procedures, but this procedure may produce the fastest simulations for full chip applications.

In some examples, one or more Poisson distribution solutions can be used to relate the experimental bridging rates to either targeted simulation parameters or physical space CD sizes. In other examples, one or more Gaussian distributions can be used. In addition, the analysis variable used in the PPDV procedures can be defined by the user to balance accuracy vs. speed, and after a failure rate is calculated for each analysis segment, the design layout and/or the design ruled can be changed to meet the targeted failure rate or yield.

In some embodiments, when a patterned photoresist layer is created, the patterned photoresist layer can include one or more test circuits that can include one or more test patterns. The test patterns can be established using design rules and used to obtain micro-bridging data and/or PPDV data, can be established and used to calibrate a photoresist model, and/or can be established and used to verify a PPDV model associated with one or more lithography procedures. In other embodiments, the test patterns can be established and used to verify a production mask; can be established and used to verify a circuit design and layout; can be established and used to calibrate and/or verify a photoresist model; and/or can be established and used to calibrate and/or verify a lithography tool or an exposure tool.

When the differences between the measured defect maps and the simulated defect maps are determined, entire and/or partial maps can be used. The differences can be identified using the number of killer defects, the number of non-killer defects, the number of line end defects, the number of corner defects, the number of micro-bridging defects, the number of LWR defects, and/or the number of LER defects. In addition, the PPDV data thresholds can be identified using the maximum number of killer defects, the maximum number of non-killer defects, the maximum number of line end defects, the maximum number of corner defects, the maximum number of micro-bridging defects, the maximum number of LWR defects, and/or the maximum number of LER defects. In addition, the differences can be based on contour lines in a polymer de-protection map, contour lines in a blocked polymer map, contour lines in a de-blocked polymer map, contour lines in an acid-diffusion map, or contour lines in a thermal map for a hot plate, or any combination thereof.

When the differences are less than or equal to a threshold value, one or more of the simulation parameters can be changed to lessen the differences. When the differences are greater than the threshold, one or more corrective actions can be performed. The corrective actions can include obtaining new or additional measured data, calculating a new PPDV model. In addition, the corrective actions can include changing the algorithms that are used, changing the substrate being examined, changing weighting factors, changing threshold values, re-measuring the substrate, or re-inspecting the substrate.

FIG. 13 illustrates a first exemplary segment of an exemplary defect analysis map in accordance with embodiments of the invention. In the illustrated embodiment, a first IC pattern 1305 is shown on a patterned substrate 1301 in a first exemplary defect analysis map 1300, and the first IC pattern 1305 can include a first feature 1310, a second feature 1320, and a first space region 1330 located between the first feature 1310 and the second feature 1320. Alternatively, a different number of features (1310, 1320) and/or space regions 1330 may be used and they may be configured differently. In various embodiments, the features (1310 and 1320) can include photoresist material, ARC material, BARC material, TARC material, dual-tone resist material, photo-acid material, photo-base material, dielectric material, ceramic material, or metallic material, or any combination thereof. Alternatively, a different number of features may be used and/or the features may have different shapes.

The patterned substrate 1301 can include a plurality of first IC patterns 1305, and can include a plurality of other IC patterns (not shown). Each of the IC patterns can have different defect probabilities associated therewith. In some embodiments, the first feature 1310 can have a first feature length 1313 in a first direction 1319; the second feature 1320 can have a second feature length 1323 in a second direction 1329 that can be substantially parallel to the first direction 1319; and the first space region 1330 can have a first space region length 1333 in a third direction 1339 that can be substantially parallel to the first direction 1319.

The first feature 1310 can have a first feature height 1311 (z-direction), a first feature width 1312 (x-direction), and a first feature length 1313 (y-direction). The first feature height 1311 can vary from approximately 10 nm to approximately 1000 nm and can be dependent upon the masking material that is being used. The first feature width 1312 can vary from approximately 10 nm to approximately 200 nm and can be dependent upon the size of the gate (transistor) that is being created. The first feature length 1313 can vary from approximately 10 nm to approximately 1000 nm and can be determined using one or more design rules. The second feature 1320 can have a second feature height 1321 (z-direction), a second feature width 1322 (x-direction), and a second feature length 1323 (y-direction). The second feature height 1321 can vary from approximately 10 nm to approximately 1000 nm and can be dependent upon the masking material that is being used. The second feature width 1322 can vary from approximately 10 nm to approximately 200 nm and can be dependent upon the size of the gate (transistor) that is being created. The second feature length 1323 can vary from approximately 10 nm to approximately 1000 nm and can be determined using one or more design rules. The first space region 1330 can have a first space region height 1331 (z-direction), a first space region width 1332 (x-direction), and a first space region length 1333 (y-direction). The first space region height 1331 can vary from approximately 10 nm to approximately 1000 nm and can be dependent upon the masking material that is being used. The first space region width 1332 can vary from approximately 10 nm to approximately 200 nm and can be dependent upon the size of the gate (transistor) that is being created. The first space region length 1333 can vary from approximately 0 nm (substantially touching) to approximately 1000 nm and can be determined using one or more design rules.

In some embodiments, the first space regions 1330 can be examined to determine the probability values for a first set of micro-bridging defects 1335 that can be associated with the first IC patterns 1305 having "parallel-line" configurations. In other embodiments, the first space regions 1330 can be examined to determine the probability values for different sets of defects that can be associated other IC patterns (1010-1060, FIG. 10).

The first exemplary defect analysis map 1300 can include at least one first analysis segment 1360, and at least one second analysis segment 1360'. In the illustrated embodiment, a first analysis segment 1360 and a second analysis segment 1360' are shown having three-dimensional volumes that both overlap the first space region 1330. In other embodiments, the first analysis segment 1360 and the second analysis segment 1360' can be configured differently. The first analysis segment 1360 can have a first height 1361, a first width 1362, and a first depth 1363, and the second analysis segment 1360' can be configured substantially the same as the first analysis segment 1360. In addition, the first analysis segment 1360 is shown without a defect present, and the second analysis segment 1360' is shown having a micro-bridging defect 1335 therein. The first analysis segment 1360 can be located at a first position ($x_1$, $y_1$) in the first exemplary defect analysis map 1300 associated with the patterned substrate 1301, and the second analysis segment 1360' can be located at a second position ($x_1$, $y_{1a}$) in the first exemplary defect analysis map 1300 associated with the patterned substrate 1301.

The first exemplary defect analysis map 1300 can include a first number $N_1$ of additional first analysis segments (not shown) and a second number $N_2$ of additional second analysis segments (not shown), and the numbers ($N_1$, $N_2$) can have integer values that can range from about one million to over one billion. Each of the analysis segments can have different defect probabilities associated therewith. For example, each of the first analysis segments can be free of defects and each of the second analysis segments can include a single defect. The statistical procedures used in the invention allow these large number of analysis segments to be analyzed in a shorter amount of time.

The first analysis segment 1360 and the second analysis segment 1360' can be used to illustrate a first method to analyze the first exemplary defect analysis map 1300 and to determine the probability of a micro-bridging defect 1335 in the first exemplary defect analysis map 1300.

During the first statistically-based (PPDV) defect analysis procedures, a first simulation data map 1340 having a plurality of first contours 1345 can be created using a first calibrated or un-calibrated photoresist model. The first simulation data map 1340 can be aligned in the first direction 1349 (z-direction), and one or more of the first contours 1345 in the first simulation data map 1340 can be located in the first space region 1330. The first simulation data map 1340 can have a first simulation data map length 1341 and a first simulation data map width 1342 that can be input parameters for one or more of the first micro-bridging analysis procedures. The first simulation data map length 1341 can vary from approximately 20 nm to approximately 1000 nm, and the first simulation data map width 1342 can vary from approximately 20 nm to approximately 1000 nm. Alternatively, first simulation data map 1340 may be aligned in a different direction.

In some statistically-based (PPDV) defect analysis procedures, one or more first evaluation zones 1350 can be established, configured, and positioned to obtain micro-bridging defect data, LER defect data, and/or LWR defect data. For example, when the [$n^{th}$]$_{ijklm}$ evaluation zone is selected, the [$n^{th}$]$_{ijklm}$ set of Analysis Variable Data ([$AVD_n^{th}$]$_{ijklm}$) can be determined as shown in (step 1265, FIG. 12) using one or more of the first contours 1345 in the first simulation data map 1340 that are present in the first evaluation zone 1350. As shown in FIG. 13, the inventor believes the best data can be obtained when the first evaluation zone 1350 is positioned in the lower (bottom) portion of the first space region 1330. The first evaluation zone 1350 can have a first evaluation zone height 1351, a first evaluation zone width 1352, and a first evaluation zone depth 1353 that can be input parameters for one or more of the first micro-bridging analysis procedures. The first evaluation zone height 1351 can vary from approximately 20 nm to approximately 500 nm; the first evaluation zone width 1352 can vary from approximately 20 nm to approximately 1000 nm; and the first evaluation zone depth 1353 can vary from approximately 20 nm to approximately 1000 nm. In addition, the first evaluation zone depth 1353 can be substantially the same as the first depth 1363 associated with the analysis segments (1360, 1360') being examined and can be used as an input parameter for one or more of the first statistically-based (PPDV) defect analysis procedures when three-dimensional ($AVD_{vol}$) data is calculated, estimated, and/or simulated.

Some of the experimental data showed that at least one of the group of ($M_{ijkl}$) simulation parameters can include blocked polymer concentration values, and the first simulation data map 1340 can include blocked polymer concentration data, and that one or more of the contours 1345 can represent different blocked polymer concentration values. In addition, modified photoresist models are being developed that can be used to simulate blocked polymer concentration data using a plurality of lithography-related variables.

In addition, modified photoresist models have been developed that can use one or more of the ($M_{ijkl}$) simulation parameters to create one or more simulation data maps 1340 having a plurality of contours 1345 therein. The modified photoresist models can be used to simulate polymer de-protection data maps for defect-containing analysis segments, (such as 1360') that can be compared to established thresholds and/or limits to determine when an actual defect occurs. When a defect-containing analysis segment 1360' is examined, CDSEM data can be obtained for the defect-containing analysis segment 1360' to further characterize the defect. In addition, the modified photoresist models can use different sets of exposure variables, different sets of dose variables, different sets of time variables, different sets of material variables, different sets of temperature variables, and/or different sets of thickness variables to calculate different sets of simulated data to associate with the defect-containing analysis segments 1360'. For example, the different sets of simulated data that can be associated with the different contours 1345 in the different simulation data maps 1340 can include blocked polymer concentration data, blocked polymer de-protection data, polymer protection data, reacted species data, un-reacted species data, de-blocked polymer data, de-activated polymer data, leaving group data, acid concentration data, base concentration data, ARC data, BARC data, or TARC data, or any combination thereof. In addition, the different sets of simulated data can be "pooled" into different sets of statistical data that can be used to identify one or more different micro-bridging defects 1335 that can be associated with the defect-containing analysis segments 1360'.

Each of the simulation data maps 1340 can include a plurality of contours 1345 that can represent different values for the simulated data. In some examples, when the simulation data maps 1340 are aligned in the first direction 1349 (z-direction), created using a photoresist model that provides simulated polymer de-protection data the contours 1345 can represent different polymer de-protection values; when the simulation data maps 1340 are created using a photoresist model that provides simulated acid concentration data the contours 1345 can represent different acid concentration values. In addition, the evaluation zone 1350 can be used to provide a known (pre-determined) calculation region in each of the simulation data maps 1340 that can be used to calculate the analysis variable data ($AVD_{vol}$). The size of the evaluation zone 1350 can be determined by the dimensions associated with the technology node being examined, and the inventor has used 40 nm wide evaluation zones during some defect analysis procedures. For example, the data values represented by the contours 1345 within the evaluation zone 1350 can be summed, averaged, and/or integrated to establish the analysis variable data ($AVD_{vol}$) that can represent different polymer de-protection values.

When the simulation data map 1340 includes simulated blocked polymer concentration data, the blocked polymer concentration values represented by the contours 1345 within the evaluation zone 1350 can be summed, averaged, and/or integrated to establish the analysis variable data (AVD$_{vol}$) that can represent different acid concentration values.

When a simulation data map 1340 includes simulated chromophore concentration data, the chromophore concentration values represented by the contours 1345 within the evaluation zone 1350 can be summed, averaged, and/or integrated to establish the analysis variable data (AVD$_{vol}$) that can represent different chromophore concentration values.

In some exemplary procedures, the first set of analysis variable data (ADV$_{vol}$)$_1$ can be used to determine a first set of Pooled Polymer Deprotection Variance Data [(PPDV, $\sigma_m$)]$_1$ to associate/pool with the micro-bridging defect 1335; the second set of analysis variable data (AVD$_{vol}$)$_2$ can be used to determine a second set of PPDV Data [(PPDV, $\sigma_m$)]$_2$ to associate/pool with the micro-bridging defect 1335; the third set of analysis variable data (AVD$_{vol}$)$_3$ can be used to determine a third set of PPDV Data [(PPDV, $\sigma_m$)]$_3$ to associate/pool with the micro-bridging defect 1335; and the n$^{th}$ set of analysis variable data (AVD$_{vol}$)$_n$ can be used to determine an n$^{th}$ set of PPDV Data [(PPDV, $\sigma_m$)]$_n$ to associate/pool with the micro-bridging defect 1335.

When the 3-D space (volume) in the evaluation zone 1350 includes a potential defect, such as the micro-bridging defect 1335, the probability value associated with that evaluation zone can be established as a 'one", and when the 3-D space (volume) in the evaluation zone 1350 does not contain a potential defect, the probability value associated with that evaluation zone can be established as a 'zero".

In some embodiments, one or more two-dimensional simulation data maps 1340 can be positioned within the three-dimensional space (volume) established by the 3-D evaluation zone 1350 and/or the 3-D analysis segment 1360. In addition, different analysis variable data values can be obtained using different sizes for the first evaluation zone 1350.

In some examples, the analysis variable data (AVD$_{vol}$ values) can be calculated by using one or more of the pixels 1355 shown in the evaluation zone 1350 and integrating, summing, and/or averaging the values of the contours 1345 in the one or more pixels 1355 in the evaluation zone 1350. When the simulation data map 1340 includes multiple gray-scales, each gray-scale can be assigned a different simulated value during calculations, and when the simulation data map 1340 includes multiple colors, each color can be assigned a different simulated value during calculations. In addition, one or more accuracy limits can be established for the averaged AVD values, and the calculated AVD values can be compared to the one or more AVD accuracy limits to determine when inaccurate AVD values have been obtained that should not be used.

For example, the AVD values that are associated with the analysis segments (1360, 1360') being examined can include blocked polymer concentration data, blocked polymer deprotection data, polymer protection data, de-coupled polymer concentration data, reacted species data, un-reacted species data, de-blocked polymer data, de-activated polymer data, leaving group data, acid concentration data, base concentration data, ARC data, BARC data, or TARC data, or any combination thereof. In addition, the different sets of AVD values can be stored in a plurality of different tables that can be associated with the defect-containing analysis segment 1360', the evaluation zone data, and/or the pixel data. For example, "defective" AVD can be stored to identify the type of defect in the defect-containing analysis segment 1360', and "non-defective" AVD can be stored to identify the non-defective conditions in the analysis segments 1360 that do not contain a potential defect.

In still other defect analysis procedures, the contours 1345 in the simulation data maps 1340 can represent simulated polymer activation profiles, simulated acid diffusion profiles, simulated base diffusion profiles, simulated NILS profiles, simulated blocked chromophore profiles, or simulated de-blocked chromophore profiles, or any combination thereof. In addition, contours 1345 in the simulation data maps 1340 can represent real-time and/or historical data.

In some embodiments, when a new substrate and/or a new IC pattern is being analyzed or additional library data is required, real-time or off-line data collection procedures can be performed. During some data collection procedures, a first portion of a substrate or the entire substrate can be segmented and examined using a number of analysis segments (1360, 1360'). When the number of potential analysis segments (1360, 1360') is extremely large (e.g., exceeds one million), the total analysis time can be long, and the inventor has developed statistical techniques to lessen the analysis time. As described earlier, each first analysis segment 1360 can include a single "potentially defective" IC pattern 1305 that can be either defective or non-defective. When a first substrate is being analyzed, one or more optical images can be obtained for the first substrate before and/or during one or more of the data collection procedures. For example, optical images can be obtained from inspection tool, metrology tools, and/or other optical measurement tools. The intensity of the optical images can be analyzed to identify "hot-spots", "bright spots", and/or "dark spots" that can potentially be caused by a micro-bridging defect, a LWR defect, or a LER defect in one or more of the "potentially defective" IC patterns 1305 on the first substrate. In addition, the intensity of the optical images can be analyzed to identify other intensity differences that can also potentially be caused by additional defects in one or more of the "potentially defective" IC patterns 1305 on the first substrate. For example, the segments of the first substrate associated with the identified "hot-spots", "bright spots", and/or "dark spots" can be examined using the analysis segments (1360, 1360') or other segments, and these novel methods provide faster, statistically-based procedures for identifying a micro-bridging defect, a LWR defect, and/or a LER defect. In addition, the segments of the first substrate associated with the other identified "intensity differences" (borderline areas) can be examined using the analysis segments (1360, 1360') to provide a more comprehensive defect analysis, and these new and novel methods provide faster, statistically-based procedures for identifying micro-bridging defects and LWR problems.

In some embodiments, when an analysis segment (1360') is associated with a "hot-spot", a "bright spot", or a "dark spot" in an optical image of the substrate surface, the probability (P$_{mb1}$) that the analysis segment (1360') includes a micro-bridging defect, a LWR defect, or a LER defect can be established at a high value. For example, the high probability (P$_{mb1}$) values can vary from approximately 80% to approximately 100%. Alternatively, other high values can be used. In addition, when an analysis segment (1360) is associated with one of the other identified "intensity differences" in the optical image of the substrate surface, the probability (P$_{ub}$) that the potentially-defective analysis segment (1360) includes a analysis segment (1360) can be established at a lower value. For example, the lower probability (P$_{mb1}$) values can vary from approximately 20% to approximately 80%. Alternatively, other lower values can be used. Furthermore, when the analysis segment (1360) cannot be associated with a "hot-spot", a "bright spot", a "dark spot", or with one of the other identified "intensity differences" in the optical image of the substrate surface, the probability (P$_{mb1}$) that the analysis segments (1360) includes a micro-bridging defect can be established at a low value. For example, the low probability ($P_{mb1}$) values can vary from approximately 0% to approximately 20%. Alternatively, other low values can be used.

In some embodiments, when a potentially defective analysis segment can be associated with a "hot-spot", a "bright spot", a "dark spot", or other high intensity spot in an optical image of the substrate surface, at least one "high probability" analysis segments (1360') can be associated with the "spot", and one or more "high probability" simulation data maps can be used to determine one or more "high probability" AVD values. For example, the "high probability" analysis variable data associated with these "high probability" analysis segments (1360') can be calculated using average values for the simulated data, and the calculated "high probability" analysis variable data associated with these "high probability" analysis segments (1360') can be associated with the high probability value for a micro-bridging defect, a LWR defect, or a LER defect. Alternatively, other analysis variables and/or other calculation techniques can be used.

In other embodiments, when the potentially defective analysis segment cannot be associated with a "hot-spot", a "bright spot", a "dark spot", or another high intensity spot in an optical image of the substrate surface, one or more "low probability" values can be associated with these "low probability" analysis segments (1360). For example, the "low probability" analysis variable data associated with these "low probability" analysis segments (1360) can be calculated using average values for the simulated data, and the calculated "low probability" analysis variable data associated with these "low probability" analysis segments (1360) can be associated with a low probability value for a micro-bridging defect, a LWR defect, or a LER defect. Alternatively, other analysis variables and/or other calculation techniques can be used.

In various examples, the different sets of process parameters can include illuminations parameters, exposure parameters, photoresist parameters, development parameters, thermal parameters, polymer parameters, blocking group parameters, leaving group parameters, chromophore parameters, base parameters, or acid parameters, or any combination thereof. The defect data for each of the potentially defective IC patterns (1305) can be plotted versus one or more of the process parameters to create a number probability curves. In addition, the total defect data for all of the potentially defective IC patterns (1305) can be plotted versus one or more of the process parameters to create additional probability curves. For example, the exposure parameters can include dose data, focus data, intensity data, wavelength data, and other optical data. The development parameters can include photoresist data, developer data, spin data, concentration data, time data, and other tool data. The thermal processing parameters can include PAB data, PEB data, cool plate data, delay time data, uniformity data, and other tool data.

When yield modeling is performed, a modified Poisson model can be used or a modified Negative Binomial model can be used. Alternatively, other yield models can be used.

When a modified three-dimensional photoresist model is used, the modified three-dimensional photoresist model can include a dissolution in the resist as a function of Image Intensity (I) component that can be dependent on exposure energy (E) and the dissolution contrast parameters (gamma ($\gamma$), $R_O$ and $R_{min}$). In addition, the dissolution in the resist component can include an acid diffusion term that is based on a soluble species (S).

In other embodiments, stochastic model parameters can be used to determine the micro-bridging probability data using the amount of polymer de-protection that occurs across a physical space (output).

In still other embodiments, the micro-bridging probability data can be modeled using a Monte Carlo approach that uses process error distributions for exposure dose, focus, resist chemistry, resist bake conditions, water contact time, immersion spot size, etc.

Real process variation needs to be incorporated using some level of statistical analysis. Pattern design layouts typically are based on "average" targeting quantities. The only real method for including large scale variations is to measure bridging over large areas and apply the statistical distribution fail rate into the EDA layout/OPC flow.

The EDA methodology of the invention enables a "process calibrated" prediction of process yields for large IC design layouts. The defect calibration enables designers or layout engineers to adjust designs to provide better yield (DFM). This EDA technique can be applied with minimal understanding of the process. This EDA methodology focuses on the "statistical" nature of process error and defect generation as an input into design rules.

This EDA methodology includes a simple method for including LER. The LER is defined from the line edge of a feature, and it is common to evaluate the LER by simulating the polymer de-protection gradient (dm/dx).

In some embodiments, statistical method are used to determine the fail rate for an IC pattern site instead of exclusively using an image threshold, and these new and novel methods enable a simplified calculation of the line edge roughness, which is not included in current pattern based design layout placement algorithms. The statistical analysis uses real fab micro-bridging data that is collected from large mask areas to get good statistical (one million+structures). This is the only way to get accurate data across the substrate (wafer), accurate substrate (wafer) to substrate (wafer) data and accurate lot-to-lot variation data. The use of a bridging defect inspection tool enables the high level of statistical bridging and roughness data that can be applied to design EDA layout, hot spot of basic OPC/targeting methodologies.

The EDA methodology of the invention is novel because it correlates "statistical defect distributions" to a simulation parameter as a means to calculate bridging fail rates. The EDA methodology of the invention also enables a simple method for including LER. This "hybrid" analytical approach using a pooled variance parameter that is experimentally measured captures real manufacturing variation that is typically simulated using computationally intensive Monte Carlo techniques. The techniques of the patent are simpler and provide an anchor to the real process bridging fail rate.

The new EDA methodology of the patent can be incorporated into design rules/software as a means to improve the manufacturability of IC design layouts (DFM). Software companies as well as IC companies have a vested interest in a methodology that can better predict process yield outcomes for specific design layouts. The simulation methodology of the patent can be used to emphasize or de-emphasize the defect contribution of the any process (track) within the total imaging system. The new EDA methodology can be easily leveraged as a platform that IC customers can use to better optimize their track technology (differentiator).

Corrective actions may be used when limits are not met, and the corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

In addition, the real-time and/or historical data can include gate data, drain data, source data, capacitor data, via data, trench data, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

The defect sites can include pattern-dependent sites, resist-dependent sites, alignment-dependent sites, overlay-dependent sites, process-dependent sites, measurement-dependent sites, inspection-dependent sites, gate-dependent sites, substrate-dependent sites, or product-dependent sites, or any combination thereof. The limit data can include confidence limits, risk limits, yield limits, process-dependent limits, resist-dependent limits, hot-spot-dependent limits, error-dependent limits, gate structure limits, accuracy limits, time limits, product requirement limits, measurement limits, inspection limits, simulation limits, prediction limits, or historical limits, or any combination thereof. For example, individual and/or total confidence values for the circuit design can be compared to individual and/or total confidence limits. The circuit design can be used, if one or more of the confidence limits are met, or corrective actions can be applied if one or more of the confidence limits are not met.

FIG. 14 illustrates exemplary flow diagram of a procedure for processing a substrate in accordance with embodiments of the invention. In the illustrated embodiment, a procedure 1400 is shown for creating, using, verifying, and/or updating Pooled Polymer De-protection Variance $\{PPDV, [(\sigma_m)^{th}]\}$ data, where, (m=1, 2, ... M), and (M) is an integer that is equal to or greater than one. Alternatively, other pooled variance data may be used.

In 1405, a defect type can be selected for analysis on a first patterned substrate selected from a group of patterned substrates. For example, the selected defect type can include a micro-bridging defect, or a line edge roughness (LER) defect, or a line width roughness (LWR) defect.

In 1410, defect analysis data can be obtained from a plurality of analysis segments (1015-1065, FIG. 10), or (1160A, 1160B, FIG. 11A) or (1160B, 1160B', FIG. 11B), or (1360, and 1360', FIG. 13) on the first patterned substrate using one or more subsystems. The first patterned substrate can include one or more of the potentially defective IC patterns (1010-1060, FIG. 10), or (1105A, 1105B, FIG. 11A, 11B) or (1305, FIG. 13). In addition, the defect analysis data can include measurement data, inspection data, bright-field data, dark-field data, NLS data, intensity data, intensity difference data, contrast data, or hot-spot data, or any combination thereof.

In 1415, a first and/or new potentially-defective analysis segment can be identified at a first and/or new location on the first patterned substrate using the defect analysis data, and first and/or new Analysis Variable Data ($AVD_{vol}$) can be calculated for the first and/or new potentially-defective analysis segment. The evaluation zones (1350, FIG. 13) associated with the potentially-defective analysis segments can be used to define a three-dimensional calculation volume that can include the first defect type. Alternatively, a two-dimensional space may be defined.

In 1420, first Pooled Variance data, such as the Pooled Polymer De-protection Variance $[(PPDV, \sigma_m)]_{Calc}$ data and/ or the new calculated $[(PPDV, \sigma_m)]_{New\_Calc}$ data can be calculated for the first and/or new potentially-defective analysis segment using the first and/or new ($AVD_{vol}$). For example, (m) can be the [$m^{th}$] simulation parameter associated with the $[(PPDV, \sigma_m)]_{Calc}$ data, and ($\sigma_m$) can be a standard deviation associated with the [$m^{th}$] simulated data. Alternatively, other Pooled Variance data may be calculated. For example, the [$m^{th}$] simulation parameter can be selected from a group of (M) simulation parameters.

In 1425, first estimated $[(PPDV, \sigma_m)]_{Est}$ data and/or new $[(PPDV, \sigma_m)]_{New\_Est}$ data can be obtained in real-time from one or more Pooled Variance data libraries, such as the Pooled Polymer De-protection Variance (PPDV, $\sigma_m$) data library, to compare with the first calculated $[(PPDV, \sigma_m)]_{Calc}$ data and/ or the new calculated $[(PPDV, \sigma_m)]_{New\_Cal}$ data. For example, the (PPDV, $\sigma_m$) data library can include Pooled Polymer De-protection Variance data, average value (<AVD>) data, and/or defect type data therein. Alternatively, other Pooled Variance data libraries may be used.

In 1430, first and/or new difference data can be calculated using the first calculated $[(PPDV, \sigma_m)]_{Calc}$ data and/or the new calculated $[(PPDV, \sigma_m)]_{New\_Calc}$ data and the first estimated $[(PPDV, \sigma_m)]_{Est}$ data and/or new $[(PPDV, \sigma_m)]_{New\_Est}$ data.

In 1435, a first and/or new defect can be identified in the potentially-defective analysis segment being examined on the selected patterned substrate using a first and/or new defect type associated with the first estimated $[(PPDV, \sigma_m)]_{Est}$ data and/or with the new $[(PPDV, \sigma_m)]_{New\_Est}$ data, when the calculated difference value is less than or equal to a first and/or new accuracy limit. For example, when the first estimated $[(PPDV, \sigma_m)]_{Est}$ data is associated with a micro-bridging defect, such as shown in FIG. 11A, the defect type can be identified as a micro-bridging defect, and when the first estimated $[(PPDV, \sigma_m)]_{Est}$ data is associated with a LER defect, such as shown in FIG. 11B, the defect type can be identified as a LER defect. In addition, when the first estimated $[(PPDV, \sigma_m)]_{Est}$ data is associated with a LWR defect (not shown) the defect type can be identified as a LWR defect, and when the first estimated $[(PPDV, \sigma_m)]_{Est}$ data is associated with a particle defect (not shown) the defect type can be identified as a particle defect.

In 1440, one or more corrective actions can be performed when the first difference value is greater than the first accuracy limit. For example, the analysis of the first patterned substrate can continue, when the first difference value is greater than the first accuracy limit.

When corrective actions are performed, one or more of the steps (1405-1440) shown in FIG. 14 can be performed wherein: new defect data types can be selected; new potentially-defective analysis segments can be identified; new Analysis Variable Data $(AVD_{vol})_{New}$ can be calculated for the first and/or the new potentially-defective analysis segment; new calculated $[(PPDV, \sigma_m)]_{New\_Calc}$ data can be calculated for the first and/or new potentially-defective analysis segment using the first $(AVD_{vol})_1$ and/or the new $(AVD_{vol})_{New}$; new $[(PPDV, \sigma_m)]_{New\_Est}$ data can be obtained in real-time from one or more Pooled Variance data libraries, such as the Pooled Polymer De-protection Variance (PPDV, $\sigma_m$) data library; new difference data can be determined using the first calculated $[(PPDV, \sigma_m)]_{Calc}$ data, the new calculated $[(PPDV, \sigma_m)]_{New\_Calc}$ data, the first estimated $[(PPDV, \sigma_m)]_{Est}$ data and/or new $[(PPDV, \sigma_m)]_{New\_Est}$ data. In addition, the defect type can be identified in real-time using the first estimated $[(PPDV, \sigma_m)]_{Est}$ data and/or the new $[(PPDV, \sigma_m)]_{New\_Est}$ data that was obtained in real-time from the first and/or new (PPDV, $\sigma_m$) library.

During some procedures, when the first calculated $[(PPDV, \sigma_m)]_{Calc}$ data is calculated, some procedures can include the following steps: 1) establishing at least calibrated photoresist model to associate with each potentially-defective analysis segment on the patterned substrate, and each calibrated photoresist model can include a simulation parameter [m] that can be selected from a group of (M) simulation parameters, and [m] and (M) can be integers; 2) creating at least one simulation data map (1340, FIG. 13) using the selected calibrated photoresist model and the selected simulation parameter [$m^{th}$] that are associated with the selected potentially-defective analysis segment on the patterned substrate, and the first simulation data map (1340, FIG. 13) includes a plurality of contours (1345, FIG. 13) that can be associated with different simulated data values in the simulation map; 3) determining a evaluation zone (1350, FIG. 13) to associate with the selected simulation data map (1340, FIG. 13), and the first evaluation zone (1350, FIG. 13) can be used to define at least one "calculation region" and can be configured to include a first set of the contours (1345, FIG. 13); 4) calculating first Analysis Variable Data $(ADV_{vol})_1$ using the different values of the different simulated data values in the simulation map associated with the first set of contours (1345, FIG. 13) that are included in the first "calculation region" defined in the first evaluation zone (1350, FIGS. 13); and 5) calculating the first calculated $[(PPDV, \sigma_m)]_{Calc}$ data using the first Analysis Variable Data $(AVD_{vol})_1$.

In various examples, the selected simulation parameter [$m^{th}$] can include blocked polymer concentration data, de-blocked polymer concentration data, polymer de-protection concentration data, protected polymer concentration data, acid diffusion data, base diffusion data, NILS data, blocked chromophore data, or de-blocked chromophore data, or any combination thereof.

During some procedures, the new estimated $[(PPDV, \sigma_m)]_{New\_Est}$ data can have new defect data, new average value data, new accuracy limit data, and/or new potentially defective IC pattern data associated therewith. Additional procedures can include: establishing a new calibrated photoresist model for the first potentially-defective analysis segment on the patterned substrate, wherein the new calibrated photoresist model includes a new simulation parameter $(m)_{New}$, and the new simulation parameter $(m)_{New}$ can include new blocked polymer concentration data, new de-blocked polymer concentration data, new polymer de-protection concentration data, new protected polymer concentration data, new acid diffusion data, new base diffusion data, new NILS data, blocked chromophore data, or new de-blocked chromophore data, or any combination thereof. In some other procedures, new evaluation zones can be created to associate with each new simulation data map, and the new evaluation zone can be configured to include a new set of the new contour lines. In addition, a new defect can be associated with the new potentially-defective analysis segment on the patterned substrate using a new defect type associated with the new estimated $[(PPDV, \sigma_m)]_{New\_Est}$ data, and the new defect type can include a new micro-bridging defect, or a new LER defect, or a new LWR defect.

FIG. 15 illustrates exemplary flow diagram of a procedure for using Pooled Variance data to create, update, and/or verify a set of design rules in accordance with embodiments of the invention. In the illustrated embodiment, a procedure 1500 is shown for using Pooled Polymer De-protection Variance $\{PPDV [(\sigma_m)^{th}]_{ijklmn}\}$ data to create, update, and/or verify the set of design rules. For example, (i=1, 2, ... I) can be a counting variable associated with the different sets of design rules that can be established; (j=1, 2, ... $J_i$) can be a counting variable associated with the different number of potentially-defective IC patterns that can be examined; (k=1, 2, ... $K_{ij}$) can be a counting variable associated with the different number of potentially-defective substrates that can be examined; (l=1, 2, ... $L_{ijk}$) can be a counting variable associated with the different number of analysis segments that can be examined; (m=1, 2, ... $M_{ijkl}$) can be a counting variable associated with the different number of simulation parameters and associated simulation data maps that can be calculated using the modified photoresist models; and (n=1, 2, ... $N_{ijklm}$) can be a counting variable associated with the different number of evaluation zones in which Analysis Variable Data (AVD) can be calculated. In addition, (I), ($J_i$), ($K_{ij}$), ($L_{ijk}$), ($M_{ijkl}$), and ($N_{ijklm}$) are integers that are equal to or greater than one. Alternatively, other pooled variance data may be used.

In 1510, a first set of design rules and associated defect type can be selected for analysis, verification, and/or updating. In addition, the first set of design rules can be used to establish at least one set of processing sequences, and each of the processing sequences can include: one or more mask creation procedures, one or more deposition procedures, one or more coating procedures, one or more thermal procedures, one or more implanting procedures, one or more doping procedures, one or more exposure procedures, one or more development procedures, one or more lithography-related procedures, one or more exposure-related procedures, one or more measurement procedures, one or more inspection procedures, one or more evaluation procedures, one or more simulation procedures, one or more prediction procedures, one or more rework procedures, one or more storage procedures, one or more transfer procedures, one or more modeling procedures, or one or more cleaning procedures, or any combination thereof.

In 1515, one or more patterned (verification) substrates can be processed using at least one of the set of processing sequences and one or more of the subsystems (110, 120, 130, 140, 150, 160, and 170) in the processing system 100. During processing, one or more of the potentially defective IC patterns (1010-1060, FIG. 10), or (1105A, 1105B, FIG. 11A, 11B) or (1305, FIG. 13) can be created at least one of the patterned (verification) substrates. In addition, the potentially defective IC pattern can include a micro-bridging defect, a LER defect, or a LWR defect, or a combination thereof.

In 1520, defect analysis data can be obtained from at least one of the patterned (verification) substrates using one or more of the subsystems (110, 120, 130, 140, 150, 160, and 170) in the processing system 100. A plurality of analysis segments (1015-1065, FIG. 10), or (1160A, 1160B, FIG. 11A) or (1160B, 1160B', FIG. 11B), or (1360, and 1360', FIG. 13) on the first patterned substrate using the defect analysis data. In addition, the defect analysis data can include measurement data, inspection data, bright-field data, dark-field data, NLS data, intensity data, intensity difference data, contrast data, particle data, or hot-spot data, or any combination thereof.

In 1525, one or more simulation maps can be calculated for each potentially-defective analysis segment that have been identified on the first patterned substrate, and Analysis Variable Data ($AVD_{vol}$) can be calculated using at least one simulation map and at least one evaluation zone (1350, FIG. 13). For example, the evaluation zone associated with the first potentially-defective analysis segment can be used to define a three-dimensional calculation volume that includes the first defect type. Alternatively, a two-dimensional calculation space may be used.

In 1530, Pooled Variance data, such as the Pooled Polymer De-protection Variance $[(PPDV, \sigma_m)]_{Calc}$ data and/or the new calculated $[(PPDV, \sigma_m)]_{New\_Calc}$ data can be calculated for each potentially-defective analysis segment using the first and/or new ($AVD_{vol}$). For example, (m) can be the [$m^{th}$] simulation parameter associated with the $[(PPDV, \sigma_m)]_{Calc}$ data, and ($\sigma_m$) can be a standard deviation associated with the [$m^{th}$] set of simulated data. Alternatively, other Pooled Variance data may be calculated. For example, the [$m^{th}$] simulation parameter can be selected from a group of (M) simulation parameters.

In 1535, first estimated [(PPDV, $\sigma_m$)]$_{Est}$ data and/or new [(PPDV, $\sigma_m$)]$_{New\_Est}$ data can be obtained in real-time from one or more Pooled Variance data libraries, such as the Pooled Polymer De-protection Variance (PPDV, $\sigma_m$) data library, to compare with the first calculated [(PPDV, $\sigma_m$)]$_{Calc}$ data and/or the new calculated [(PPDV, $\sigma_m$)]$_{New\_Calc}$ data. For example, the (PPDV, $\sigma_m$) library can include Pooled Polymer De-protection Variance data, average value (<AVD>) data, and/or defect type data therein. Alternatively, other Pooled Variance data libraries may be used.

In 1540, a first and/or new difference data can be determined using the first calculated [(PPDV, $\sigma_m$)]$_{Calc}$ data and/or the new calculated [(PPDV, $\sigma_m$)]$_{New\_Calc}$ data and the first estimated [(PPDV, $\sigma_m$)]$_{Est}$ data and/or new [(PPDV, $\sigma_m$)]$_{New\_Est}$ data.

In 1545, the set of design rules can be identified as a historical set of design rules that have been previously stored in the (PPDV, $\sigma_m$) data library, when the first and/or new difference value is less than or equal to a first and/or new accuracy limit. In various examples, the first estimated [(PPDV, $\sigma_m$)]$_{Est}$ data and/or the new [(PPDV, $\sigma_m$)]$_{New\_Est}$ data can have historical design rule data associated therewith, and the historical sets of design rules can include sets of good design rules and sets bad design rules. In addition, the first estimated [(PPDV, $\sigma_m$)]$_{Est}$ data can include the IC patterns and the defect types associated with the historical sets of design rules.

When the first estimated [(PPDV, $\sigma_m$)]$_{Est}$ data is associated with a micro-bridging defect, such as shown in (FIG. 11A or FIG. 13), the defect type can be identified as a micro-bridging defect, and when the first estimated [(PPDV, $\sigma_m$)]$_{Est}$ data is associated with a LER defect, such as shown in FIG. 11B, the defect type can be identified as a LER defect. In addition, when the first estimated [(PPDV, $\sigma_m$)]$_{Est}$ data is associated with a LWR defect (not shown) the defect type can be identified as a LWR defect, and when the first estimated [(PPDV, $\sigma_m$)]$_{Est}$ data is associated with a particle defect (not shown) the defect type can be identified as a particle defect.

In 1550, one or more corrective actions when the first difference value is greater than the first accuracy limit. When corrective actions are performed, one or more of the steps 1510-1550 can be performed wherein new sets of design rules are determined; new process sequences are used; new defect data types can be selected; new potentially-defective analysis segments can be identified; new simulation maps can be calculated, new evaluation zones can be established, new Analysis Variable Data (AVD$_{vol}$)$_{New}$ can be calculated for the first and/or the new potentially-defective analysis segment; new calculated [(PPDV, $\sigma_m$)]$_{New\_Calc}$ data can be calculated for the first and/or new potentially-defective analysis segment using the first (AVD$_{vol}$)$_1$ and/or the new (AVD$_{vol}$)$_{New}$; new [(PPDV, $\sigma_m$)]$_{New\_Est}$ data can be obtained in real-time from one or more Pooled Variance data libraries, such as the Pooled Polymer De-protection Variance (PPDV, $\sigma_m$) data library; new difference data can be determined using the first calculated [(PPDV, $\sigma_m$)]$_{Calc}$ data, the new calculated [(PPDV, $\sigma_m$)]$_{New\_Calc}$ data, the first estimated [(PPDV, $\sigma_m$)]$_{Est}$ data and/or new [(PPDV, $\sigma_m$)]$_{New\_Est}$ data. In addition, the sets of design rules can be examined in real-time using the first estimated [(PPDV, $\sigma_m$)]$_{Est}$ data and/or the new [(PPDV, $\sigma_m$)]$_{New\_Est}$ data that was obtained in real-time from the first and/or new (PPDV, $\sigma_m$) library.

During some data collection examples, one or more IC patterns can be created in a test mask, and one or more areas of a photoresist layer can be exposed on a substrate using the test mask and a radiation source. For example, one or more areas of the exposed photoresist layer can include one or more analysis segments that can have a latent image of a potentially-defective IC pattern therein. Subsequently, the test mask can be used to establish additional potentially-defective IC patterns on additional portions of the substrate, and additional analysis segments can be used to analyze the additional potentially-defective IC patterns.

In other data collection examples, one or more potentially-defective IC patterns and/or structures can be created in one or more areas of a photoresist layer on a substrate using over-exposure and/or under-exposure procedures. For example, one or more areas of the exposed photoresist layer can include one or more analysis segments that can have a latent image of an over-exposed or under-exposed potentially-defective IC pattern therein. In addition, modified photoresist models, simulation maps, evaluation zones, and their associated exposure limits (thresholds) can be calculated for the analysis segments being examined.

In additional data collection examples, one or more potentially-defective IC patterns can be created in one or more areas of a photoresist layer on a substrate using different focusing procedures. For example, one or more areas of the exposed photoresist layer can include one or more analysis segments that can have a latent image of a potentially-defective IC pattern therein that was created using an incorrect focusing procedure. The exposed photoresist layer can also include out-of-focus latent images for other potentially-defective IC structures on the substrate. In addition, modified photoresist models, simulation maps, evaluation zones, and their associated focus limits (thresholds) can be calculated for the analysis segments being examined.

In some other data collection examples, one or more potentially-defective IC patterns and/or structures can be created in one or more areas of a photoresist layer on a substrate using different developing procedures. For example, one or more areas of the exposed photoresist layer can include one or more analysis segments that can have a latent image of a potentially-defective IC pattern therein that was created using an incorrect developing procedure. The exposed photoresist layer can also include latent images for other potentially-defective IC structures that were created on the substrate using the incorrect developing procedure. In addition, modified photoresist models, simulation maps, evaluation zones, and their associated developing limits (thresholds) can be calculated for the analysis segments being examined.

During the different developing procedures, different photoresists can be used, different developing chemistries can be used, different developing times can be used, different thermal procedures can be used, and different pre-exposure procedures can be used. In addition, when analyzing the different developing procedures, different photoresist models can be used, different developing chemistry models can be used, different developing time models can be used, different thermal procedure models can be used, and different pre-exposure models can be used.

In additional data collection examples, one or more different alignment procedures can be performed to create potentially-defective IC patterns and/or structures. For example, offset errors between two or more masks steps can be used to create potentially-defective IC patterns and/or structures that are overlay-related, and one or more correct alignment procedures can be performed to establish reference data. In addition, modified photoresist models, simulation maps, evaluation zones, and their associated alignment limits (thresholds) can be calculated for the analysis segments being examined.

In still other example, micro-bridging probability data can be chamber dependent and chamber-matching data and/or procedures can be used when creating and/or verifying micro-bridging probability data. For example, chamber-matching data can be obtained from one or more of the processing elements (113, 123, 133, 143, 153, and 163) and/or from one or more of the evaluation elements (115, 125, 135, 145, 155, and 165).

When optical data is obtained, one or more beams can be established using one or more optical sources, and the one or more beams can have one or more angles associated with them. The one or more beams can be polarized or non-polarized and can have a single wavelength or multiple wavelengths. One or more of the beams can be used to illuminate a potentially-defective IC pattern in an analysis segment. One or more aerial images can be obtained from one or more of the analysis segments, and one or more image parameters can be determined.

In some embodiments, the optical data can include simulation data, and the method for obtaining simulated optical data to associate with the an analysis segment and/or evaluation zone can include: simulating a first beam using a simulated optical source, the simulated first beam having a first incident angle; illuminating a potentially-defective IC pattern in the analysis segment and/or evaluation zone using the simulated first beam; obtaining a first simulated aerial image for the first potentially-defective IC pattern; determining a simulated probability value for the first potentially-defective IC pattern; determining a simulated variance value for the first potentially-defective IC pattern; determining a first simulated library creation criteria for the first potentially-defective IC pattern; storing the simulated data in the library when the first simulated library creation criteria is met; and performing a corrective action when the first simulated library creation criteria is not met.

Verified and/or reference micro-bridging defect creation sequences can be used to create verified and/or reference defective and/or non-defective IC patterns and/or structures, and the verified micro-bridging defect creation sequences can be stored in a database or a library. When a verified micro-bridging defect creation sequence is performed, one or more reference (verified) defective IC patterns and/or structures can be created at one or more sites on each of the processed substrates. When an unverified micro-bridging defect creation procedure is performed, one or more unverified potentially-defective IC patterns and/or structures can be created at one or more sites on each of the processed substrates.

When a good resist model has been developed, image parameter (IP) relationships can be used that includes the image contrast, resist kinetics and resist dissolution contrast. Low contrast imaging at IP threshold is more sensitive to immersion driven PAG loss. The scanner induces a non-uniform distribution of water contact time to the resist (including residual water droplets). Hot spot patterns and/or structures can include bridging defects, line width resolution (LWR) issues, and local CD variations.

When validation and/or evaluation decisions cannot be made using data from a first substrate one or more additional substrates can be used. When defective substrates are identified, the values for the defective substrate state may include "repairable", "non-repairable, "repair entire lot:", "scrap entire lot", and "stop the processing". When defective circuit layouts are identified, the values for the defective layout state may include "repairable", "non-repairable, "change design rules", "change model", "change processing sequences", "change selected subsystem" and "stop the processing".

In various examples, a defect-related library can include data for single layer defects, multi-layer defects, partially-etched defects, etching defects, trimming defects, doping defects, target defects, capacitor defects, gate defects, transistor defects, defects in FinFET structures, defects in Complementary Metal-Oxide Semiconductor (CMOS) structures, defects in pFET structures, defects in nFET structures, defects in photoresists, defects in alignment targets, defects in trench structures, defects in via structures, defects in array structures, defects in grating structures, or any combination thereof.

In addition, when judgment and/or intervention rules are associated with procedures, they can be executed. Intervention and/or judgment rule evaluation procedures and/or limits can be performed based on historical procedures, on the customer's experience, or process knowledge, or obtained from a host computer. Micro-bridging-based rules can be used in Fault Detection and Classification (FDC) procedures to determine how to respond to defect conditions, alarm conditions, error conditions, fault conditions, and/or warning conditions. The defect-related FDC procedures can prioritize and/or classify defects, predict system performance, predict preventative maintenance schedules, decrease maintenance downtime, and extend the service life of consumable parts in the system.

Before, during, and/or after a procedure is performed, simulation, modeling and/or prediction data can be created and/or modified. The new simulation and/or prediction data can be used in real time to update the calculations, models, and/or procedures. For example, prediction models can include process chemistry models, chamber models, EM models, SPC charts, PLS models, PCA models, FDC models, and Multivariate Analysis (MVA) models.

The historical data can include GOF data, thermal data, thickness data, via-related data, CD data, CD profile data, material related data, trench-related data, sidewall angle data, differential width data, or any combination thereof. The data can also include site result data, site number data, CD measurement flag data, number of measurement sites data, coordinate X data, and coordinate Y data, among others.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for processing a substrate using statistical variance data comprising:
   using a computer to perform the following:
   establishing a first defect type for analysis on a first patterned substrate selected from a group of patterned substrates, wherein the first defect type includes a micro-bridging defect, or a line edge roughness (LER) defect, or a line width roughness (LWR) defect;
   obtaining defect analysis data from a plurality of analysis segments on the first patterned substrate, wherein the defect analysis data includes bright-field data, dark-field data, NLS data, intensity data, intensity difference data, contrast data, or hot-spot data, or any combination thereof;

identifying a first potentially-defective analysis segment at a first location on the first patterned substrate using the defect analysis data, wherein the first potentially-defective analysis segment defines a three-dimensional volume that includes the first defect type;

calculating first Pooled Polymer De-protection Variance $[(PPDV,\sigma_m)]_{Calc}$ data for the first potentially-defective analysis segment, wherein (m) is a simulation parameter and $(\sigma_m)$ is a standard deviation of the simulation parameter (m);

obtaining first estimated $[(PPDV,\sigma_m)]_{Est}$ data in real-time from a first Pooled Polymer De-protection Variance $(PPDV,\sigma_m)$ data library to compare with the first calculated $[(PPDV,\sigma_m)]_{Calc}$ data, wherein the $[(PPDV,\sigma_m)]$ data comprises analysis variable data (AVD), average value (<AVD>) data, simulation data, photoresist model data, integrated circuit (IC) data, design rule data, processing sequence data, substrate data, evaluation zone data, or defect type data, or any combination thereof;

determining a first difference value using the first calculated $[(PPDV,\sigma_m)]_{Calc}$ data and the first estimated $[(PPDV,\sigma_m)]_{Est}$ data;

identifying a first defect in the first potentially-defective analysis segment on the first patterned substrate using at least one defect type associated with the first estimated $[(PPDV,\sigma_m)]_{Est}$ data, when the first difference value is less than or equal to a first accuracy limit; and continuing to analyze the first patterned substrate, when the first difference value is greater than the first accuracy limit.

2. The method of claim 1, wherein calculating the first calculated $[(PPDV,\sigma_m)]_{Calc}$ data comprises:

establishing a first modified photoresist model for the first potentially-defective analysis segment on the first patterned substrate, wherein the first modified photoresist model includes a first simulation parameter $(m_1)$, wherein the first simulation parameter $(m_1)$ includes blocked polymer concentration data, de-blocked polymer concentration data, polymer de-protection concentration data, protected polymer concentration data, acid diffusion data, base diffusion data, NILS data, blocked chromophore data, or de-blocked chromophore data, or any combination thereof;

creating a first simulation data map using the first modified photoresist model and the first simulation parameter $(m_1)$ for the first potentially-defective analysis segment on the first patterned substrate, wherein the first simulation data map includes a plurality of contours associated with different simulated data values;

establishing a first evaluation zone to associate with the first simulation data map, the first evaluation zone being configured to include a first set of the contours;

calculating first three-dimensional analysis variable data $(AVD_{vol})_1$ using the first evaluation zone; and calculating the first calculated $[(PPDV,\sigma_m)]_{Calc}$ data using the first three-dimensional analysis variable data $(AVD_{vol})_1$.

3. The method of claim 1, wherein continuing to analyze the first patterned substrate further comprises:

obtaining new estimated $[(PPDV,\sigma_m)]_{New\_Est}$ data in real-time from the first $(PPDV,\sigma_m)$ data library to compare with the first calculated $[(PPDV,\sigma_m)]_{Calc}$ data, wherein the new estimated $[(PPDV,\sigma_m)]_{NewEst}$ data comprises new analysis variable data $(AVD)_{New}$, new average value $(<AVD>)_{New}$ data, new simulation data, new photoresist model data, new IC data, new design rule data, new processing sequence data, new substrate data, new evaluation zone data, or new defect type data, or any combination thereof;

determining a new difference value using the first calculated $[(PPDV,\sigma_m)]_{Calc}$ data and the new estimated $[(PPDV,\sigma_m)]_{New\_Est}$ data;

identifying a new defect in the first potentially-defective analysis segment on the first patterned substrate using at least one new defect type associated with the new estimated $[(PPDV,\sigma_m)]_{New\_Est}$ data, when the new difference value is less than or equal to a new accuracy limit; and continuing to analyze the first patterned substrate, when the new difference value is greater than the new accuracy limit.

4. The method of claim 1, wherein continuing to analyze the first patterned substrate further comprises:

calculating new Pooled Polymer De-protection Variance $[(PPDV,\sigma_m)]_{New\_Calc}$ data for the first potentially-defective analysis segment;

obtaining new estimated $[(PPDV,\sigma_m)]_{New\_Est}$ data in real time from the first $(PPDV,\sigma_m)$ library to compare with the new calculated $[(PPDV,\sigma_m)]_{New\_Calc}$ data, wherein the new estimated $[(PPDV,\sigma_m)]_{NewEst}$ data comprises new analysis variable data $(AVD)_{New}$, new average value $(<AVD>)_{New}$ data, new simulation data, new photoresist model data, new IC data, new design rule data, new processing sequence data, new substrate data, new evaluation zone data, or new defect type data, or any combination thereof;

determining a new difference value using the new calculated $[(PPDV,\sigma_m)]_{New\_Calc}$ data and the new estimated $[(PPDV,\sigma_m)]_{New\_Est}$ data;

identifying a new defect in the first potentially-defective analysis segment on the first patterned substrate using at least one new defect type associated with the new estimated $[(PPDV,\sigma_m)]_{New\_Est}$ data, when the new difference value is less than or equal to a new accuracy limit; and continuing to analyze the first patterned substrate, when the new difference value is greater than the new accuracy limit.

5. The method of claim 4, wherein calculating the new calculated $[(PPDV,\sigma_m)]_{New\_Calc}$ data comprises:

establishing a new calibrated photoresist model for the first potentially-defective analysis segment on the first patterned substrate, wherein the new calibrated photoresist model includes a new simulation parameter $(m)_{New}$, wherein the new simulation parameter $(m)_{New}$ includes new blocked polymer concentration data, new de-blocked polymer concentration data, new polymer de-protection concentration data, new protected polymer concentration data, new acid diffusion data, new base diffusion data, new NILS data, blocked chromophore data, or new de-blocked chromophore data, or any combination thereof;

establishing at least one new evaluation zone to associate with a new simulation data map, the new evaluation zone being configured to include a new set of new contour lines;

calculating new three-dimensional analysis variable data $(AVD_{vol})_{New}$ using the new set of new contour lines in the new evaluation zone; and calculating the new calculated $[(PPDV,\sigma_m)]_{New\_Calc}$ data using the new three-dimensional analysis variable data $(AVD_{vol})_{New}$.

6. The method of claim 1, wherein continuing to analyze the first patterned substrate further comprises:
identifying a new potentially-defective analysis segment at a new location on the first patterned substrate using the defect analysis data, wherein the new potentially-defective analysis segment defines a new three-dimensional volume that includes a new defect type;
calculating new Pooled Polymer De-protection Variance $[(PPDV,\sigma_m)]_{New\_Calc}$ data for the new potentially-defective analysis segment;
obtaining new estimated $[(PPDV,\sigma_m)]_{New\_Est}$ data in real-time from the first $(PPDV,\sigma_m)$ library to compare with the new calculated $[(PPDV,\sigma_m)]_{New\_Calc}$ data, wherein the new estimated $[(PPDV,\sigma_m)]_{NewEst}$ data comprises new analysis variable data $(AVD)_{New}$, new average value $(<AVD>)_{New}$ data, new simulation data, new photoresist model data, new IC data, new design rule data, new processing sequence data, new substrate data, new evaluation zone data, or new defect type data, or any combination thereof;
determining a new difference value using the new calculated $[(PPDV,\sigma_m)]_{New\_Calc}$ data and the new estimated $[(PPDV,\sigma_m)]_{NewEst}$ data;
identifying a new defect in the new potentially-defective analysis segment on the first patterned substrate using at least one new defect type associated with the new estimated $[(PPDV,\sigma_m)]_{NewEst}$ data, when the new difference value is less than or equal to a new accuracy limit; and
continuing to analyze the first patterned substrate, when the new difference value is greater than the new accuracy limit.

7. The method of claim 1, wherein continuing to analyze the first patterned substrate further comprises:
obtaining new defect analysis data from the first patterned substrate, wherein the new defect analysis data includes new bright-field data, new dark-field data, new NLS data, new intensity data, new intensity difference data, new contrast data, or new hot-spot data, or any combination thereof;
identifying a new potentially-defective analysis segment at a new location on the first patterned substrate using the new defect analysis data, wherein the new potentially-defective analysis segment defines a new three-dimensional volume that includes a new defect type;
calculating new $[(PPDV,\sigma_m)]_{New\_Calc}$ data for the new potentially-defective analysis segment;
obtaining new estimated $[(PPDV,\sigma_m)]_{New\_Est}$ data in real-time from the first $(PPDV,\sigma_m)$ library to compare with the new calculated $[(PPDV,\sigma_m)]_{New\_Calc}$ data, wherein the new estimated $[(PPDV,\sigma_m)]_{NewEst}$ data comprises new analysis variable data $(AVD)_{New}$, new average value $(<AVD>)_{New}$ data, new simulation data, new photoresist model data, new IC data, new design rule data, new processing sequence data, new substrate data, new evaluation zone data, or new defect type data, or any combination thereof;
determining a new difference value using the new calculated $[(PPDV,\sigma_m)]_{Calc}$ data and the new estimated $[(PPDV,\sigma_m)]_{New\_Est}$ data;
identifying a new defect in the new potentially-defective analysis segment on the first patterned substrate using at least one new defect type associated with the new estimated $[(PPDV,\sigma_m)]_{New\_Est}$ data, when the new difference value is less than or equal to a new accuracy limit; and
continuing to analyze the first patterned substrate, when the new difference value is greater than the new accuracy limit.

8. The method of claim 1, wherein continuing to analyze the first patterned substrate further comprises:
establishing a new defect type for analysis on the first patterned substrate, wherein the new defect type includes a new micro-bridging defect, a new LER defect, or a new LWR defect, or any combination thereof;
obtaining new defect analysis data from the first patterned substrate, wherein the new defect analysis data includes new bright-field data, new dark-field data, new NLS data, new intensity data, new intensity difference data, new contrast data, or new hot-spot data, or any combination thereof;
identifying a new potentially-defective analysis segment at a new location on the first patterned substrate using the new defect analysis data, wherein the new potentially-defective analysis segment defines a new three-dimensional volume that includes the new defect type;
calculating new $[(PPDV,\sigma_m)]_{New\_Calc}$ data for the new potentially-defective analysis segment;
obtaining new estimated $[(PPDV,\sigma_m)]_{New\_Est}$ data in real-time from the first $(PPDV,\sigma_m)$ library to compare with the new calculated $[(PPDV,\sigma_m)]_{New\_Calc}$ data, wherein the new estimated $[(PPDV,\sigma_m)]_{NewEst}$ data comprises new analysis variable data $(AVD)_{New}$, new average value $(<AVD>)_{New}$ data, new simulation data, new photoresist model data, new IC data, new design rule data, new processing sequence data, new substrate data, new evaluation zone data, or new defect type data, or any combination thereof;
determining a new difference value using the new calculated $[(PPDV,\sigma_m)]_{Calc}$ data and the new estimated $[(PPDV,\sigma_m)]_{New\_Est}$ data;
identifying a new defect in the new potentially-defective analysis segment on the first patterned substrate using a first new defect type associated with the new estimated $[(PPDV,\sigma_m)]_{New\_Est}$ data, when the new difference value is less than or equal to a new accuracy limit; and
continuing to analyze the first patterned substrate, when the new difference value is greater than the new accuracy limit.

9. The method of claim 1, wherein calculating the first calculated $[(PPDV,\sigma_m)]_{Calc}$ data comprises:
determining at least one probability value to associate with the first potentially-defective analysis segment and the first patterned substrate.

10. The method of claim 1, wherein the patterned substrates are created using a first set of design rules.

11. A method for verifying a set of design rules using pooled variance data comprising:
using a computer to perform the following:
establishing a first defect type for analysis on a patterned substrate created using a first set of design rules, wherein the first defect type is associated with the first set of design rules and includes a micro-bridging defect, or a line edge roughness (LER) defect, or a line width roughness (LWR) defect;
obtaining defect analysis data from the patterned substrate, wherein the defect analysis data includes bright-field data, dark-field data, NLS data, intensity data, intensity difference data, contrast data, or hot-spot data, or any combination thereof;

identifying a first potentially-defective analysis segment at a first location on the patterned substrate using the defect analysis data, wherein the first potentially-defective analysis segment defines a three-dimensional volume that includes the first defect type;

calculating first Pooled Polymer De-protection Variance $[(PPDV,\sigma_m)]_{Calc}$ data for the first potentially-defective analysis segment, wherein (m) is a simulation parameter and $(\sigma_m)$ is a standard deviation of the simulation parameter (m);

obtaining first estimated $[(PPDV,\sigma_m)]_{Est}$ data in real-time from at least one Pooled Polymer De-protection Variance $(PPDV,\sigma_m)$ data library to compare with the first calculated $[(PPDV,\sigma_m)]_{Calc}$ data, wherein the first $[(PPDV,\sigma_m)]_{Est}$ data comprises historical data that includes a first set of defective design rules, at least one first defect type associated with the first set of defective design rules, and a first defective integrated circuit (IC) pattern associated with the first set of defective design rules;

identifying the first set of design rules as defective design rules using the first set of defective design rules, when the first estimated $[(PPDV,\sigma_m)]_{Est}$ data is substantially equal to the first calculated $[(PPDV,\sigma_m)]_{Calc}$ data; and continuing to analyze the patterned substrate, when the first estimated $[(PPDV,\sigma_m)]_{Est}$ data is not equal to the first calculated $[(PPDV,\sigma_m)]_{Calc}$ data.

12. The method of claim 11, wherein calculating the first calculated $[(PPDV,\sigma_m)]_{Calc}$ data comprises:

establishing a first modified photoresist model for the first potentially-defective analysis segment on the patterned substrate, wherein the first modified photoresist model includes a first simulation parameter $(m_1)$, wherein the first simulation parameter $(m_1)$ includes blocked polymer concentration data, de-blocked polymer concentration data, polymer de-protection concentration data, protected polymer concentration data, acid diffusion data, base diffusion data, NILS data, blocked chromophore data, or de-blocked chromophore data, or any combination thereof;

creating a first simulation data map using the first modified photoresist model and the first simulation parameter $(m_1)$ for the first potentially-defective analysis segment on the patterned substrate, wherein the first simulation data map includes a plurality of contour lines associated with different simulated data values;

establishing a first evaluation zone to associate with the first simulation data map, the first evaluation zone being configured to include a first set of the contours;

calculating first three-dimensional analysis variable data $(AVD_{vol})_1$ using the first evaluation zone; and calculating the first calculated $[(PPDV,\sigma_m)]_{Calc}$ data using the first three-dimensional analysis variable data $(AVD_{vol})_1$.

13. The method of claim 11, wherein continuing to analyze the patterned substrate further comprises:

obtaining new estimated $[(PPDV,\sigma_m)]_{New\_Est}$ data in real-time from the Pooled Polymer De-protection Variance $(PPDV,\sigma_m)$ data library to compare with the first calculated $[(PPDV,\sigma_m)]_{Calc}$ data, wherein the new estimated $[(PPDV,\sigma_m)]_{New\_Est}$ data comprises new historical data that includes a new set of defective design rules, a new defect type associated with the new set of defective design rules, and a first defective integrated circuit (IC) pattern associated with the first set of defective design rules;

identifying the first set of design rules as defective design rules using the new set of defective design rules, when the new estimated $[(PPDV,\sigma_m)]_{New\_Est}$ data is substantially equal to the first calculated $[(PPDV,\sigma_m)]_{Calc}$ data; and continuing to analyze the patterned substrate, when the new estimated $[(PPDV,\sigma_m)]_{New\_Est}$ data is not equal to the first calculated $[(PPDV,\sigma_m)]_{Calc}$ data.

14. The method of claim 11, wherein continuing to analyze the patterned substrate further comprises:

calculating new Pooled Polymer De-protection Variance $[(PPDV,\sigma_m)]_{New\_Calc}$ data for the first potentially-defective analysis segment;

identifying the first set of design rules as defective design rules using a new set of defective design rules, when the new estimated $[(PPDV,\sigma_m)]_{New\_Est}$ data is substantially equal to the first calculated $[(PPDV,\sigma_m)]_{Calc}$ data; and continuing to analyze the patterned substrate, when the new estimated $[(PPDV,\sigma_m)]_{New\_Est}$ data is not equal to the first calculated $[(PPDV,\sigma_m)]_{Calc}$ data.

15. The method of claim 11, wherein continuing to analyze the patterned substrate further comprises:

calculating new $[(PPDV,\sigma_m)]_{New\_Calc}$ data for the first potentially-defective analysis segment;

obtaining new estimated $[(PPDV,\sigma_m)]_{New\_Est}$ data in real-time from the Pooled Polymer De-protection Variance $(PPDV,\sigma_m)$ data library to compare with the first calculated $[(PPDV,\sigma_m)]_{Calc}$ data, wherein the new estimated $[(PPDV,\sigma_m)]_{New\_Est}$ data comprises new historical data that includes a new set of defective design rules, a new defect type associated with the new set of defective design rules, and a first defective integrated circuit (IC) pattern associated with the first set of defective design rules;

identifying the first set of design rules as defective design rules using the new set of defective design rules, when the new estimated $[(PPDV,\sigma_m)]_{New\_Est}$ data is substantially equal to the new $[(PPDV,\sigma_m)]_{New\_Calc}$ data; and continuing to analyze the patterned substrate, when the new estimated $[(PPDV,\sigma_m)]_{New\_Est}$ data is not equal to the new $[(PPDV,\sigma_m)]_{New\_Calc}$ data.

16. A method for creating pooled variance data comprising:

using a computer to perform the following:

a) selecting an ($i^{th}$) potentially defective Integrated Circuit (IC) pattern from a group of (I) different potentially defective IC patterns, wherein i=1,2, ... I, and (I) is an integer greater than one;

b) selecting a ($j_i^{th}$) set of process parameters from a group of ($J_i$) different sets of process parameters, wherein i=1, 2, ... I, (j=1,2, ... $J_i$), and ($J_i$) is an integer greater than one;

c) selecting a $k_{ij}^{th}$ data-collection substrate ($S_{ijk}$) from a group of ($K_{ij}$) data-collection substrates, wherein ($k_{ij}$=1, 2, ... $K_{ij}$), (i=1,2, ... I), (j =1,2, ... $J_i$) and ($K_{ij}$) is an integer greater than one;

d) processing the $k_{ij}^{th}$ data-collection substrate ($S_{ijk}$) using the $j_i^{th}$ set of process parameters;

e) obtaining at least one optical image from the $k_{ij}^{th}$ data-collection substrate ($S_{ijk}$);

f) selecting an $[l^{th}]_{i\ jk}$ analysis segment from a group of ($L_{ijk}$) analysis segments on the $k_{ij}^{th}$ data-collection substrate ($S_{ijk}$), wherein ($l_{ijk}$=1,2, ... $L_{ijk}$),(i=1,2, ... I), (j=1,2, ... $J_i$), (k=1,2, ... $K_{ij}$), and ($L_{ijk}$) is an integer greater than one, each processed data-collection substrates ($S_{ijk}$) being divided into ($L_{ijk}$) analysis segments, wherein each intensity difference spot in the at least one optical image is used to establish at least one of the group of ($L_{ijk}$) analysis segments on each processed data-collection substrate ($S_{jk}$);

g) selecting an $[m^{th}]_{ijkl}$ simulation parameter from a group of ($M_{ijkl}$) simulation parameters for each of the selected $[l^{th}]_{i\,jk}$ analysis segment on each of the processed data-collection substrates ($S_{ijk}$), wherein ($m_{ijkl}=1,2,\ldots M_{ijkl}$), ($i=1,2,\ldots I$), ($j=1,2,\ldots J_i$), ($k=1,2,\ldots K_{ij}$), ($l_{ijk}=1,2,\ldots L_{ijk}$), and ($M_{ijkl}$) is an integer greater than one;

h) creating an $[m^{th}]_{ijkl}$ simulation data map using the selected $[m^{th}]_{ijkl}$ simulation parameter and a modified photoresist model;

i) selecting an $[n^{th}]_{ijklm}$ evaluation zone in the $[m^{th}]_{ijkl}$ simulation data map, wherein ($i=1,2,\ldots I$), ($j=1,2,\ldots J_i$), ($k=1,2,\ldots K_{ij}$), ($l_{ijk}=1,2,\ldots L_{ijk}$), ($m_{ijkl}=1,2,\ldots M_{ijk}$), and ($[N]_{ijklm}$) is an integer greater than one;

j) calculating at least one Analysis Variable Data ($[AVD_n^{th}]_{ijklm}$) value, wherein ($i=1,2,\ldots I$), ($j=1,2,\ldots J_i$), ($k=1,2,\ldots K_{ij}$), ($l_{ijk}=1,2,\ldots L_{ijk}$), ($m_{ijkl}=1,2,\ldots M_{ijkl}$), and ($[n^{th}]_{ijklm}=1,2,\ldots [N]_{ijklm}$);

k) determining if a data-collection procedure has been completed for the ($[k^{th}]_{ij}$) processed data-collection substrate ($S_{ijk}$);

l) obtaining additional data for the ($[k^{th}]_{ij}$) processed data-collection substrate ($S_{ijk}$), when the data-collection procedure has not been completed;

m) calculating Pooled Polymer De-protection Variance (PPDV,$\sigma_m$) data for the ($[k^{th}]_{ij}$) processed data-collection substrate ($S_{ijk}$) when the data-collection procedure has been completed; and n) using the calculated Pooled Polymer De-protection data to improve circuit fabrication process yield.

17. The method of claim 16, wherein obtaining the additional data for the ($[k^{th}]_{ij}$) processed data-collection substrate ($S_{ijk}$) further comprises:

determining if a new evaluation zone is required for the ($[k^{th}]_{ij}$) processed data-collection substrate ($S_{ijk}$);

selecting an $[(n+1)^{th}]_{ijklm}$ evaluation zone; and repeating steps i)-m).

18. The method of claim 16, wherein obtaining the additional data for the ($[k^{th}]_{ij}$) processed data-collection substrate ($S_{ijk}$) further comprises:

determining if a new simulation parameter is required for the ($[k^{th}]_{ij}$) processed data-collection substrate ($S_{ijk}$);

selecting an $[(m+1)^{th}]_{ijkl}$ simulation parameter; and repeating steps g)-m).

19. The method of claim 16, wherein obtaining the additional data for the ($[k^{th}]_{ij}$) processed data-collection substrate ($S_{ijk}$) further comprises:

determining if a new analysis segment is required for the ($[k^{th}]_{ij}$) processed data-collection substrate ($S_{ijk}$);

selecting an $[(l+1)^{th}]_{ijk}$ analysis segment; and repeating steps f)-m).

20. The method of claim 16, wherein the modified photoresist model includes at least one methacrylate polymer and at least one Triphenyl Sulfonium (TPS)-nonaflate Photo Acid Generator (PAG).

\* \* \* \* \*